United States Patent
Shigenami et al.

(10) Patent No.: US 10,211,248 B2
(45) Date of Patent: Feb. 19, 2019

(54) CIRCUIT SUBSTRATE, IMAGE SENSOR, AND ELECTRONIC APPARATUS

(71) Applicant: SONY CORPORATION, Tokyo (JP)

(72) Inventors: Kenichi Shigenami, Kanagawa (JP); Takayuki Kai, Kanagawa (JP); Natsuhiro Aota, Fukuoka (JP); Atsushi Muto, Fukuoka (JP); Yoshiyuki Akiyama, Shizuoka (JP); Takashi Miyamoto, Kanagawa (JP); Takayuki Sekihara, Kanagawa (JP); Tomohiro Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 212 days.

(21) Appl. No.: 15/319,947

(22) PCT Filed: Jun. 16, 2015

(86) PCT No.: PCT/JP2015/067262
§ 371 (c)(1),
(2) Date: Dec. 19, 2016

(87) PCT Pub. No.: WO2015/198913
PCT Pub. Date: Dec. 30, 2015

(65) Prior Publication Data
US 2017/0133425 A1 May 11, 2017

(30) Foreign Application Priority Data
Jun. 26, 2014 (JP) .................................. 2014-131749

(51) Int. Cl.
*H04N 5/335* (2011.01)
*H04N 3/14* (2006.01)
(Continued)

(52) U.S. Cl.
CPC ........ *H01L 27/14636* (2013.01); *H01L 25/04* (2013.01); *H01L 25/18* (2013.01);
(Continued)

(58) Field of Classification Search
CPC ........ H04N 5/357; H04N 5/213; H04N 5/217; H04N 7/108; H04N 7/102; H04N 3/237;
(Continued)

(56) References Cited

U.S. PATENT DOCUMENTS

| 4,668,897 A * | 5/1987 | Haferl .................... H04N 3/233 315/371 |
| 6,716,642 B1 * | 4/2004 | Wu ...................... B01J 19/0046 19/46 |

(Continued)

FOREIGN PATENT DOCUMENTS

| JP | 4-239758 A | 8/1992 |
| JP | 2009-105278 A | 5/2009 |
| JP | 2011-151375 A | 8/2011 |

OTHER PUBLICATIONS

Microfilm of the specification and drawings annexed to the request of Japanese Utility Model Application No. 96907/1989(Laid-open No. 36172/1991), Apr. 9, 1991, Seiko Instruments Inc.
(Continued)

*Primary Examiner* — Chia Wei A Chen
(74) *Attorney, Agent, or Firm* — Sheridan Ross P.C.

(57) ABSTRACT

The present technology relates to a circuit substrate, an image sensor, and an electronic apparatus that are capable of suppressing generation of noise in a conductor loop, which is caused due to a change in the conductor loop. A circuit substrate according to the present technology includes a circuit that is formed of a conductor and is capable of forming a conductor loop, at least a part of the dimensions of the conductor loop being variable; and a plurality of
(Continued)

conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors. The present technology is applicable to, for example, an image sensor and an electronic apparatus.

20 Claims, 37 Drawing Sheets

(51) Int. Cl.
- *H01L 27/146* (2006.01)
- *H01L 25/04* (2014.01)
- *H01L 25/18* (2006.01)
- *H04N 5/374* (2011.01)
- *H04N 5/378* (2011.01)

(52) U.S. Cl.
CPC ............ *H04N 5/374* (2013.01); *H04N 5/378* (2013.01); *H01L 2924/0002* (2013.01)

(58) Field of Classification Search
CPC .......... H04N 3/233; H04N 5/21; H04N 5/911; H04N 5/374; H04N 5/378
See application file for complete search history.

(56) References Cited

U.S. PATENT DOCUMENTS

| | | | |
|---|---|---|---|
| 2002/0022276 A1* | 2/2002 | Zhou | B01J 19/0046 436/518 |
| 2004/0140877 A1* | 7/2004 | Nakao | H01F 19/08 336/200 |
| 2006/0208169 A1* | 9/2006 | Breed | B60N 2/002 250/221 |
| 2013/0334989 A1* | 12/2013 | Kataoka | H02N 2/0075 318/116 |
| 2017/0078603 A1* | 3/2017 | Yamasaki | H04N 5/378 |

OTHER PUBLICATIONS

International Search Report prepared by the Japan Patent Office dated Aug. 26, 2015, for International Application No. PCT/JP2015/067262.

* cited by examiner

CIRCUIT SUBSTRATE, IMAGE SENSOR, AND ELECTRONIC APPARATUS

CROSS REFERENCE TO RELATED APPLICATIONS

This application is a national stage application under 35 U.S.C. 371 and claims the benefit of PCT Application No PCT/JP2015/067262 having an international filing date of 16 Jun. 2015, which designated the United States, which PCT application claimed the benefit of Japanese Patent Application No. 2014-131749 filed 26 Jun. 2014, the disclosures of which are incorporated herein by reference in their entirety.

TECHNICAL FIELD

The present technology relates to a circuit substrate, an image sensor, and an electronic apparatus, and particularly to a circuit substrate, an image sensor, and an electronic apparatus that are capable of suppressing generation of noise in a conductor loop, which is caused due to a change in the conductor loop.

BACKGROUND ART

In the case where there is a circuit in which a conductor loop is formed in the vicinity of a power supply wiring in a semiconductor integrated circuit, for example, an induced electromotive force is generated in the conductor loop orthogonal to a line of magnetic force generated from the power supply wiring, which may cause noise in the conductor loop.

Incidentally, a power supply wiring structure that cancels out the magnetic flux generated by current flowing through a conductor has been conceived (see, for example, Patent Document 1 and Patent Document 2).

Patent Document 1: Japanese Patent Application Laid-open No. 1993-120928

Patent Document 2: Japanese Unexamined Patent Application Publication No. 1997-502304

SUMMARY

Problem to be Solved

However, in the wiring structure, the change in dimensions of the conductor loop has not been taken into account. In the actual wiring layout, there is a limitation due to various factors. Therefore, it is difficult to apply the wiring structure to all wirings. For that reason, another wiring structure has been desired.

The present technology has been proposed in view of the above circumstances. It is an object of the present technology to be capable of suppressing generation of noise in a conductor loop, which is caused due to a change in the conductor loop.

Means for Solving the Problem

According to an aspect of the present technology, there is provided a circuit substrate, including: a circuit that is formed of a conductor and is capable of forming a conductor loop with the conductor, at least a part of dimensions of the conductor loop being variable; and a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the circuit.

The plurality of conductors may include one or more conductors formed between a plurality of other conductors, and orientations of current flowing through at least a part of the one or more conductors may be different from orientations of current flowing through the other conductors.

A direction of a line of magnetic force that is generated by the one or more conductors and passes through a loop surface of the conductor loop may be opposite to a direction of a line of magnetic force that is generated by the other conductors and passes through the loop surface of the conductor loop.

A direction of a magnetic flux generated by the one or more conductors in a loop surface of the conductor loop may be opposite to a direction of a magnetic flux generated by the other conductors in the loop surface of the conductor loop.

The plurality of conductors may be formed in a plurality of layers.

The plurality of conductors may include a conductor pair including two conductors adjacent in a layered direction, orientations of current flowing through the two conductors being the same.

The plurality of conductors may include a conductor pair including two conductors adjacent in a layered direction, orientations of current flowing through the two conductors being at least partially different from each other.

An orientation of current flowing through each conductor of the conductor pair and an orientation of current flowing through another conductor adjacent to each conductor of the conductor pair in the layered direction may be at least partially different from each other.

An orientation of current flowing through a part of each conductor of the conductor pair may be different from an orientation of current flowing through the other part of the conductor.

The conductor pair may have a periodic structure in which the shape of the conductor pair is periodically changed in a longitudinal direction, and a direction of a line of magnetic force generated by the conductor pair may be changed for every half period of the periodic structure.

The plurality of conductors may include a plurality of conductor pairs, and an origin position of the periodic structure of one conductor pair may differ from an origin position of the periodic structure of the adjacent conductor pair.

A shift amount between the origin position of the periodic structure of the one conductor pair and the origin position of the periodic structure of the adjacent conductor pair may be equal to or less than one-second of a period of the periodic structure of the conductor pair.

A shift amount between the origin position of the periodic structure of the one conductor pair and the origin position of the periodic structure of the adjacent conductor pair may be the same as a conductor width of at least one conductor constituting the conductor pair.

A period length of the periodic structure of at least one conductor pair may be different from a period length of the periodic structure of another conductor pair.

A part of the periodic structure of the conductor pair may have a period length different from that of another part of the periodic structure of the conductor pair.

The periodic structure may have a meander shape or a twisted shape formed by the two conductors, or a shape of a combination of the meander shape and the twisted shape.

The conductor pair may further include a light blocking wiring that suppresses light transmission in addition to the two conductors.

The plurality of conductors may be each formed at a position where the conductor is superimposed on the circuit in a layer different from that of the circuit.

According to another aspect of the present technology, there is provided an image sensor, including: a pixel unit that includes a plurality of pixels, the plurality of pixels each performing photoelectric conversion on light from an object, a conductor loop being substantially formed in the pixel unit in selecting a pixel, the conductor loop being formed of a conductor, the conductor loop having a size and a shape depending on the selected pixel; and a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the pixel unit.

According to still another aspect of the present technology, there is provided an electronic apparatus, including: an imaging unit that picks up an image of an object; and an image processing unit that performs image processing on image data acquired by imaging performed by the imaging unit, the imaging unit including a pixel unit that includes a plurality of pixels, the plurality of pixels each performing photoelectric conversion on light from an object, a conductor loop being substantially formed in the pixel unit in selecting a pixel, the conductor loop including a conductor, the conductor loop having a size and a shape depending on the selected pixel, and a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the pixel unit.

In one aspect of the present technology, provided are a circuit that is formed of a conductor and is capable of forming a conductor loop with the conductor, at least a part of dimensions of the conductor loop being variable and a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the circuit.

In another aspect of the present technology, an image sensor includes a pixel unit that includes a plurality of pixels, the plurality of pixels each performing photoelectric conversion on light from an object, a conductor loop being substantially formed in the pixel unit in selecting a pixel, the conductor loop being formed of a conductor, the conductor loop having a size and a shape depending on the selected pixel; and a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the pixel unit.

In still another aspect of the present technology, an electronic apparatus includes: an imaging unit that picks up an image of an object; and an image processing unit that performs image processing on image data acquired by imaging performed by the imaging unit, the imaging unit including a pixel unit that includes a plurality of pixels, the plurality of pixels each performing photoelectric conversion on light from an object, a conductor loop being substantially formed in the pixel unit in selecting a pixel, the conductor loop including a conductor, the conductor loop having a size and a shape depending on the selected pixel, and a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the pixel unit.

Effects

According to the present technology, it is possible to acquire a picked-up image. Further, according to the present technology, it is possible to suppress generation of noise in a conductor loop, which is caused due to a change in the conductor loop.

DESCRIPTION OF PREFERRED EMBODIMENTS

Hereinafter, embodiments for carrying out the present disclosure (hereinafter, referred to as embodiments) will be described. Note that description will be made in the following order.

1. First Embodiment (Image Sensor)
2. Second Embodiment (Imaging Apparatus)

First Embodiment

<Conductor Loop and Magnetic Flux>

In the case where there is a circuit in which a conductor loop is formed in the vicinity of a power supply wiring in a semiconductor integrated circuit, for example, an induced electromotive force is generated in the conductor loop orthogonal to a line of magnetic force generated from the power supply wiring, which may cause noise in the conductor loop.

Figure 1:
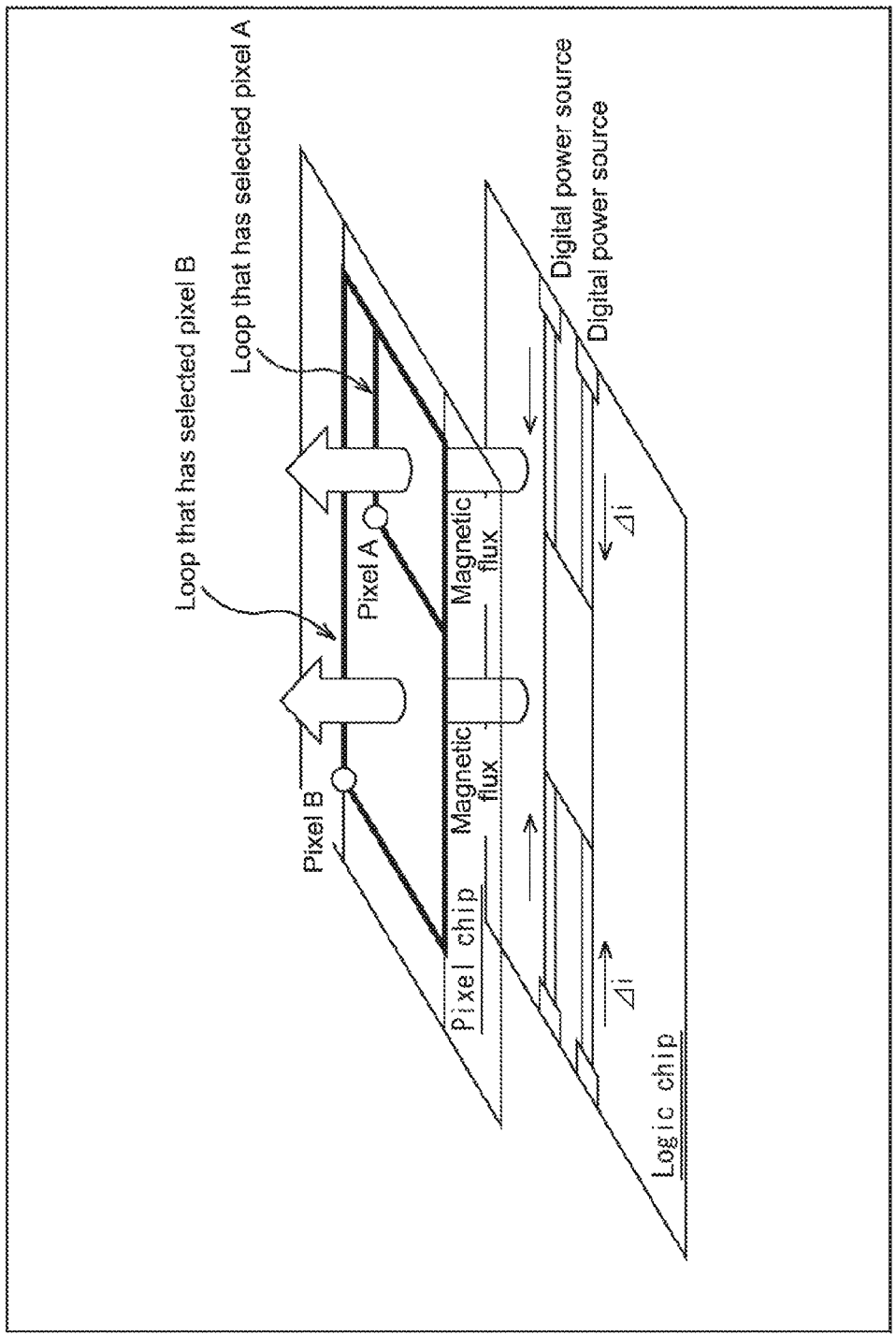
FIG. 1 A diagram describing a change in an induced electromotive force due to a change in a conductor loop.

For example, in an a semiconductor apparatus for imaging such as a so-called image sensor as shown in FIG. 1, a conductor loop is formed in a pixel area of a pixel chip, and a power supply wiring for supplying a digital power source is formed on a logic chip that is laminated on the pixel chip in the vicinity of the conductor loop. Then, in the loop surface of the conductor loop, a magnetic flux generated by the power supply wiring passes, thereby generating an induced electromotive force in the conductor loop.

Dimensions of the conductor loop formed in the pixel area are changed depending on the selection position of a pixel. In the case of the example shown in FIG. 1, the size or shape of the conductor loop formed when a pixel A is selected is different from the size or shape of the conductor loop formed when a pixel B is selected. The position of the pixel B is different from that of the pixel A.

When dimensions of the conductor loop are changed as described above, a magnetic flux that passes through the loop surface of the conductor loop is changed, and thus, an induced electromotive force generated in the conductor loop may be significantly changed. Further, due to the change in the induced electromotive force, noise may be generated in a pixel signal read from a pixel. Then, due to this noise, striped image noise may be generated in a picked-up image. That is, the image quality of the picked-up image may be reduced.

Incidentally, in Patent Document 1 or Patent Document 2, a power supply wiring structure that cancels out the magnetic flux on the loop surface of the conductor loop has been considered.

For example, in Patent Document 1, a flat cable including a pair of flat conductors arranged via an insulation film is disclosed. The pair of flat conductors snakes in a wave form along the surface of the flat cable, and forms an area surrounded by the flat conductors between two points at which they intersect with each other when viewed from the direction orthogonal to the surface direction of this flat cable. Because the orientations of the flat conductors surrounding this area are sequentially replaced with each other, the magnetic flux in this area is canceled out.

Further, for example, in Patent Document 2, it is disclosed that in a pair of adjacent conductors having a twisted structure, intersections of one conductor are arranged on substantially center portions of parallel sections of the other conductor to cancel out the induced current.

However, in these documents, the influence on the conductor loop has not been taken into account. For that reason, although it has to simply apply the above-mentioned structure to wirings when the technology described in these documents is applied, it is difficult to apply the wiring structure described in the above-mentioned documents to all wirings because in most cases, there are various limitations on the wiring layout in the actual circuit. Therefore, a wiring structure other than these has been desired.

In view of the above, in a circuit substrate including: a circuit that is formed of a conductor and is capable of forming a conductor loop with the conductor, at least a part of dimensions of the conductor loop being variable; and a plurality of conductors that are each formed at a position where an induced electromotive force is generated in the conductor loop by a magnetic field, the magnetic field being generated by the plurality of conductors, the conductor loop being formed by the circuit, the plurality of conductors each have a structure that suppresses a change in the induced electromotive force generated by a change in dimensions of the conductor loop.

For example, the plurality of conductors may include one or more conductors formed between a plurality of other conductors, and orientations of current flowing through at least a part of the one or more conductors may be different from orientations of current flowing through the other conductors.

In other words, a direction of a line of magnetic force that is generated by the one or more conductors and passes through a loop surface of the conductor loop may be opposite to a direction of a line of magnetic force that is generated by the other conductors and passes through the loop surface of the conductor loop.

Further, in other words, a direction of a magnetic flux generated by the one or more conductors in a loop surface of the conductor loop may be opposite to a direction of a magnetic flux generated by the other conductors in the loop surface of the conductor loop.

As described above, by arranging conductors through which current flows in a different direction so as to be adjacent to each other, it is possible to cause the magnetic fluxes generated by the conductors to be mutually cancelled out. Accordingly, it is possible to reduce the magnetic flux, and the induced electromotive force generated in the conductor loop. Specifically, it is possible to suppress the change in the induced electromotive force due to the change in the dimensions of the conductor loop.

Note that this circuit substrate may be a circuit substrate of an arbitrary device, and may be an image sensor, for example. That is, an image sensor may include a pixel unit that includes a plurality of pixels, the plurality of pixels each performing photoelectric conversion on light from an object, a conductor loop being substantially formed in the pixel unit in selecting a pixel, the conductor loop being formed of a conductor, the conductor loop having a size and a shape depending on the selected pixel; and a plurality of conductors that are each formed at a position where an induced electromotive force is generated in the conductor loop by a magnetic field and each have a structure that suppresses a change in the induced electromotive force generated by a change in dimensions or the conductor loop, the magnetic field being generated by the plurality of conductors, the conductor loop being formed by the pixel unit.

Accordingly, it is possible to reduce noise generated in a pixel signal by the induced electromotive force generated in the conductor loop of a pixel unit, and suppress the reduction in image quality of a picked-up image.

Note that the plurality of conductors may be formed in a single layer or a plurality of layers of the circuit substrate. In the following, description will be made with an example in which the plurality of conductors are formed in a plurality of layers of the circuit substrate.

(Image Sensor)

Figure 2:
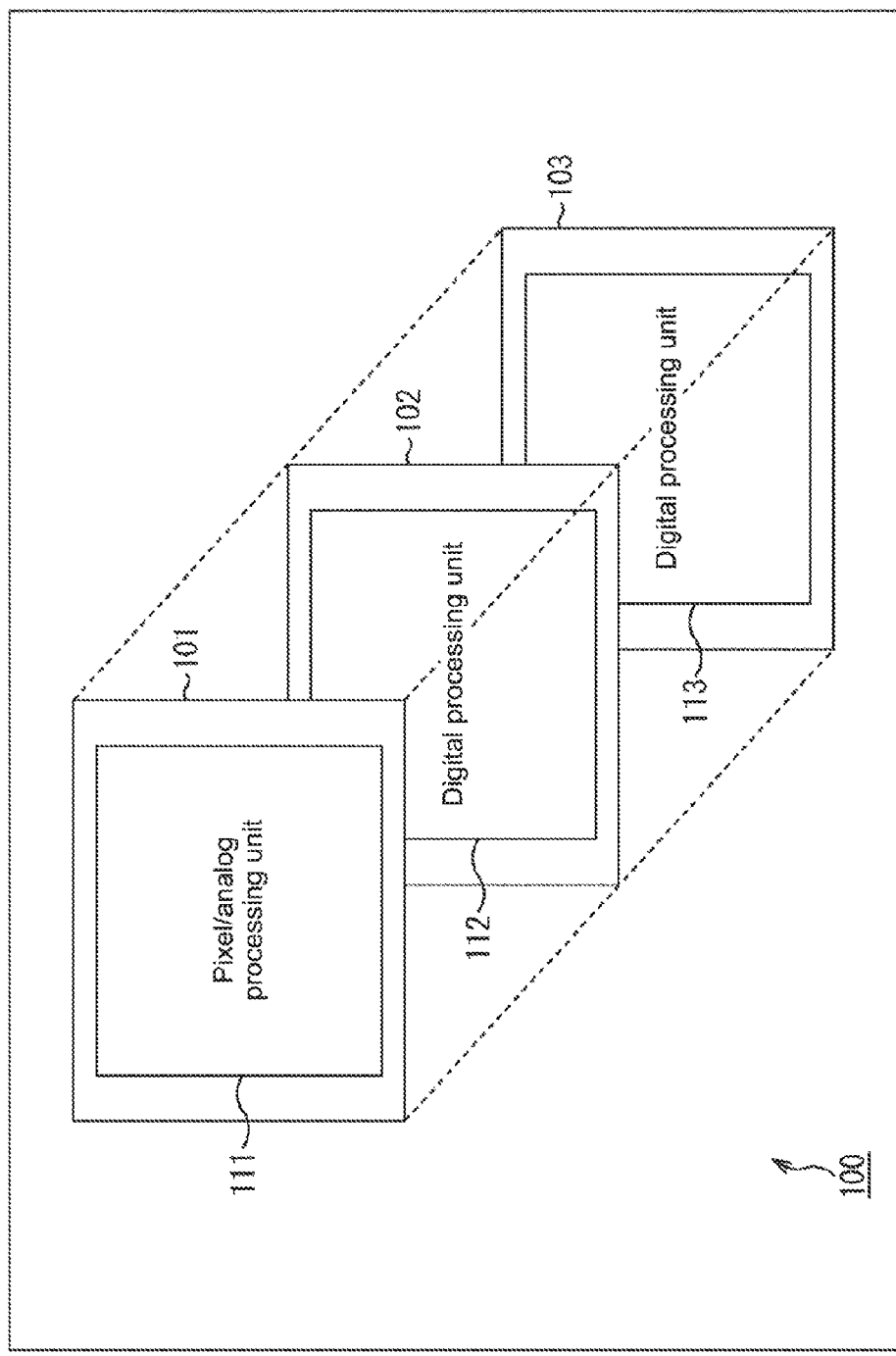
FIG. 2 A diagram showing a main configuration example of an image sensor.

FIG. 2 is a diagram showing a main configuration example of an image sensor as an embodiment of a circuit substrate (or image sensor) to which the present technology is applied.

An image sensor 100 shown in FIG. 2 is a device that performs photoelectric conversion on light from an object, and outputs it as image data. For example, the image sensor 100 is configured as a CMOS image sensor using a CMOS (Complementary Metal Oxide Semiconductor) or a CCD image sensor using a CCD (Charge Coupled Device).

As shown in FIG. 2, the image sensor 100 includes three semiconductor substrates (laminated chips (a pixel chip 101, a logic chip 102, and a logic chip 103)) superimposed one another.

In the pixel chip 101, a pixel/analog processing unit 111 in which a unit pixel configuration, an analog circuit, and the like are formed is formed. Further, in the logic chip 102, a digital processing unit 112 in which a digital circuit and the like are formed is formed. Further, in the logic chip 103, a digital processing unit 113 in which a digital circuit and the like are formed is formed.

The pixel chip 101, the logic chip 102, and the logic chip 103 are superimposed one another in the state where the chips are mutually insulated. That is, the configuration of the pixel/analog processing unit 111, the configuration of the logic chip 102, and the configuration of the logic chip 103 are basically mutually insulated. Note that although illustration is omitted, (necessary parts of) the configuration formed in the pixel/analog processing unit 111, the configuration formed in the digital processing unit 112, and the configuration formed in the digital processing unit 113 are electrically connected to each other via, for example, a through hole via (VIA) as necessary.

Note that although description has been made with the image sensor including three-layered chips as an example in FIG. 2, the number of layers of the image sensor 100 can be arbitrarily set. For example, it may be a single layer, two layers, or four or more layers.

In the following, the case where the image sensor includes three-layered chips as is the example of FIG. 2 will be described.

(Pixel/Analog Processing Unit)

Figure 3:
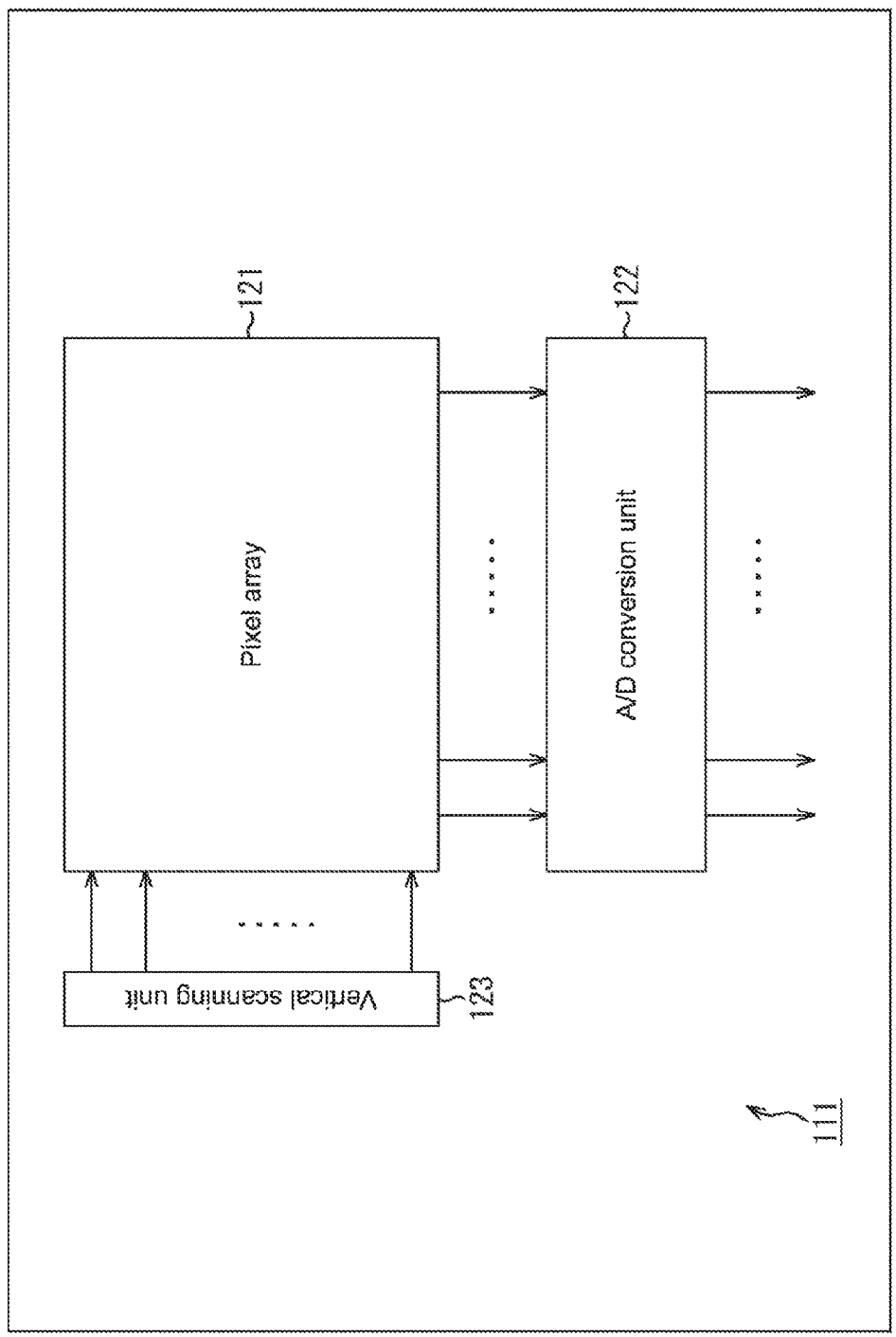
FIG. 3 A diagram showing a main configuration example of a pixel/analog processing unit.

FIG. 3 is a diagram showing a main configuration example of a circuit formed in the pixel/analog processing unit 111.

As shown in FIG. 3, is the pixel/analog processing unit 111, a pixel array 121, an A/D conversion unit 122, a vertical scanning unit 123, and the like are formed.

The pixel array 121 is a pixel area is which pixel configurations (unit pixels 131) including photoelectric conversion elements such as photodiodes are arranged is a flat surface form or curved surface form.

The A/D conversion unit 122 performs A/D conversion on as analog signal and the like read from each unit pixel of the pixel array 121, and outputs the digital data thereof.

The vertical scanning unit 123 controls the operation of a transistor of each unit pixel of the pixel array 121. That is, charges stored in each unit pixel of the pixel array 121 are read under control of the vertical scanning unit 123, supplied to the A/D conversion unit 122 as a pixel signal via a vertical signal line (VSL) for each column of the unit pixels, and A/D converted.

The A/D conversion unit 122 supplies the A/D conversion results (digital data (pixel data) of each pixel signal) to the logic circuit (digital circuit) formed in the digital processing unit 112 or the digital processing unit 113 for each column of the unit pixels.

(Pixel Array)

Figure 4:
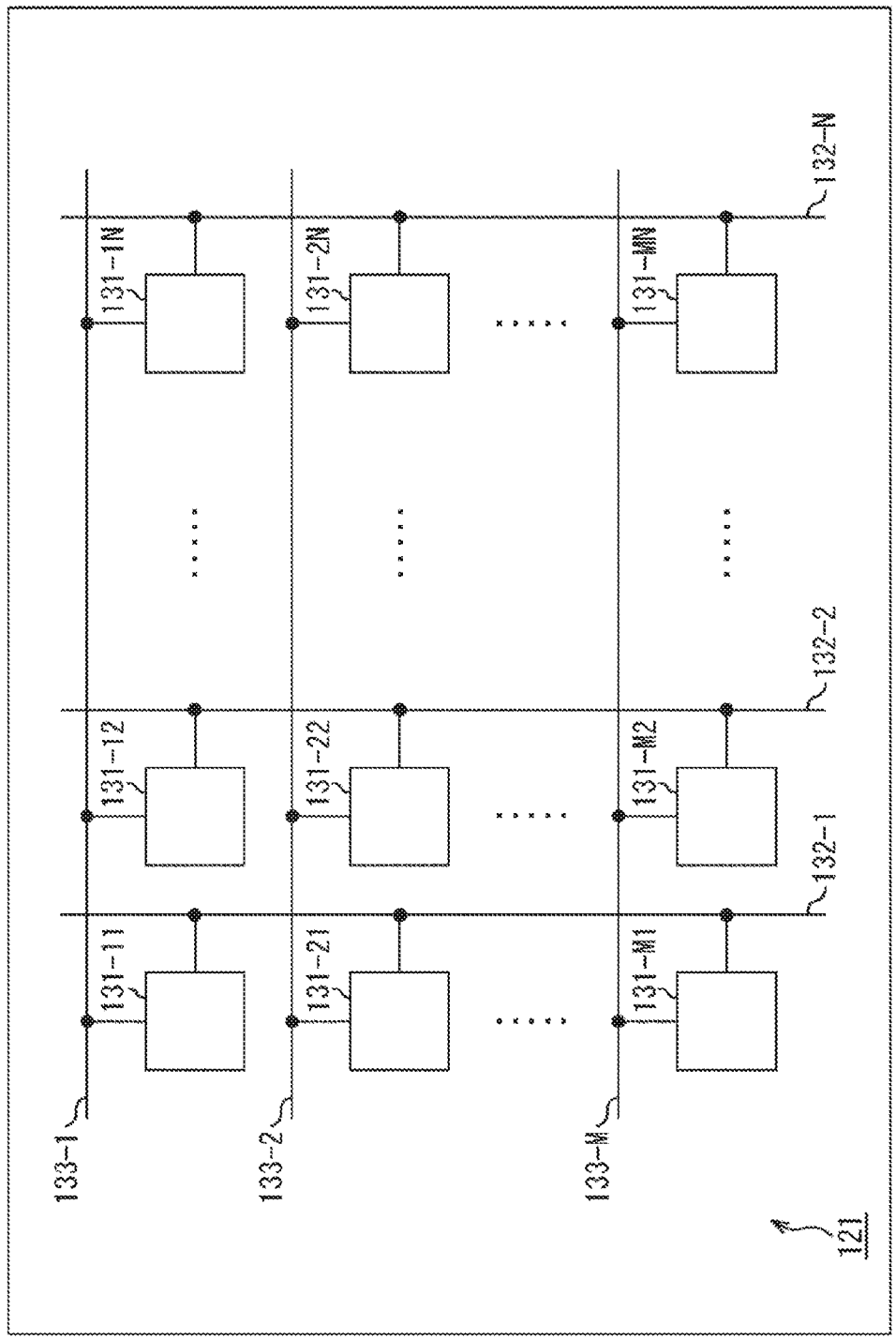
FIG. 4 A diagram showing a main configuration example of a pixel array.

As shown in FIG. 4, in the pixel array 121, a unit pixel 131-11 to a unit pixel 131-MN are formed (M and N represents an arbitrary natural number). In the case where the unit pixel 131-11 to the unit pixel 131-MN do not need to be distinguished from each other, they are referred to as the unit pixel 131. That is, as shown in FIG. 4, in the pixel array 121, M rows N columns of unit pixels 131 are arranged in a matrix pattern (an array pattern).

Further, as shown in FIG. 4, in the pixel array 121, a vertical signal line 132-1 to a vertical signal line 132-N and a control line 133-1 to a control line 133-M are formed. In the case where the vertical signal line 132-1 to the vertical signal line 132-N do not need to be distinguished from each other for description, they are referred to as the vertical signal line 132. In the case where the control line 133-1 to the control line 133-M do not need to be distinguished from each other for description, they are referred to as the control line 133.

To the unit pixel 131, the vertical signal line 132 corresponding to the respective columns is connected for each column, and the control line 133 corresponding to the respective rows is connected for each row. Via each control line 133, a control signal for each unit pixel (each row) 131 is transmitted from the vertical scanning unit 123.

The signal read from the unit pixel 131 depending on the control signal supplied from the vertical scanning unit 123 via the control line 133 is transmitted to the A/D conversion unit 122 via the vertical signal line 132. Note that although each row of the control line 133 is shown as one line in FIG. 4 it actually includes a plurality of control lines for various transistors in the unit pixel 131.

Note that although a signal line through which a pixel signal is transmitted is provided for each column and a control line is provided for each row in the description of FIG. 4, arrangement of the unit pixel, signal line, and control line is not limited to the example in FIG. 4. That is, for example, the arrangement of the unit pixel 131 can be arbitrarily determined, and is not limited to the array form. For example, the unit pixel 131 may be arranged to form a honeycomb structure. Further, for example, a signal line may be formed for each row, and a signal read from each unit pixel may be transmitted for each row. Alternatively, a signal line may be formed for each area of the pixel array 121, and a signal read from each unit pixel may be transmitted for each area. Further, for example, a control line may be provided in an array form, and a control target may be selected for each unit pixel.

(Unit Pixel Configuration)

Figure 5:
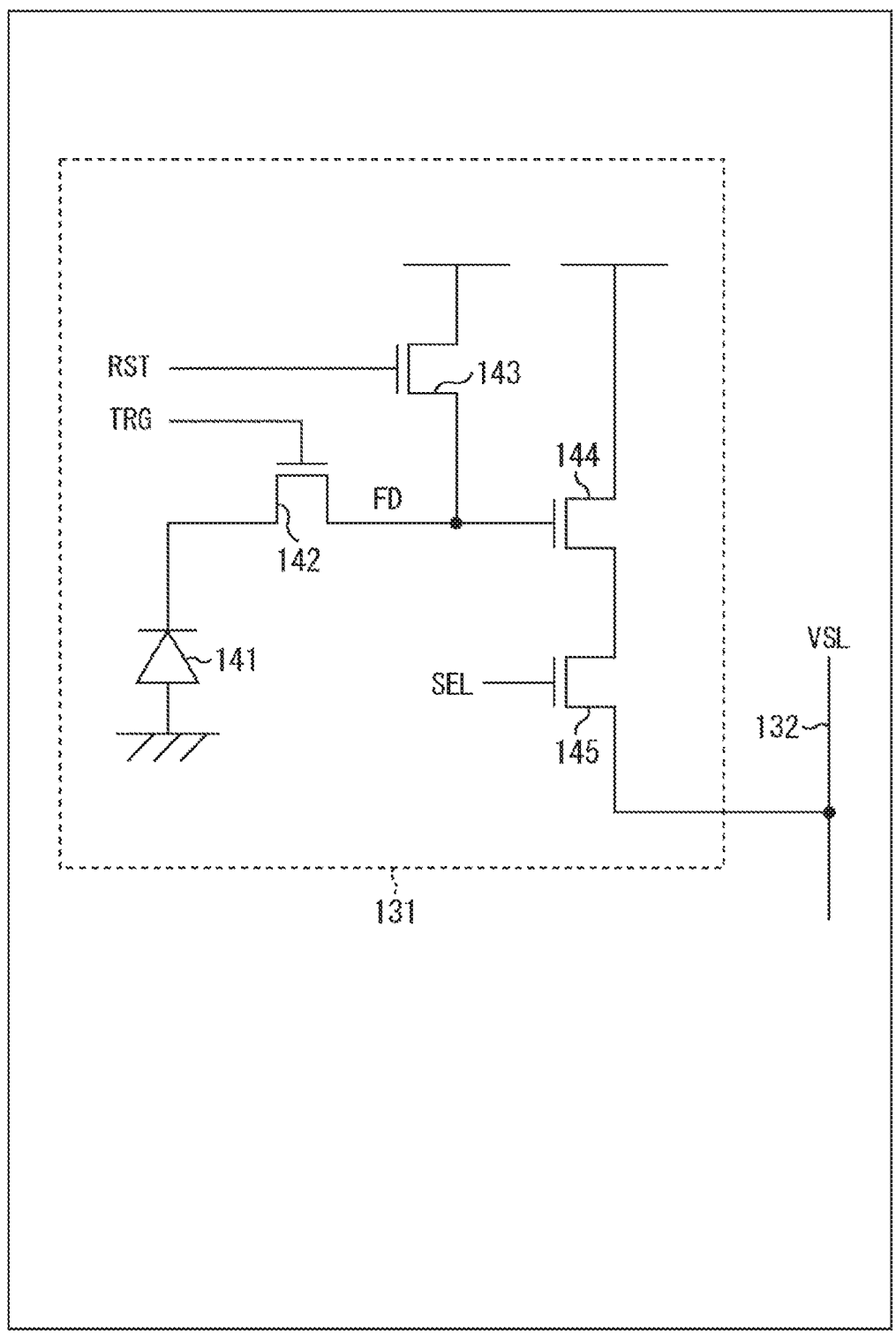
FIG. 5 A diagram showing a main configuration example of a unit pixel.

FIG. 5 is a diagram showing a main configuration example of the circuit configuration of the unit pixel 131. In the case of the example shown in FIG. 5, the unit pixel 131 includes a photodiode (PD) 141, a transfer transistor 142, a reset transistor 143, an amplification transistor 144, and a select transistor 145.

The photodiode (PD) 141 photoelectrically converts received light into photocharges (herein, photoelectrons) having the amount of charges corresponding to the light amount, and stores the photocharges. The anode electrode of the photodiode (PD) 141 is connected to the ground of the pixel area (pixel ground), and the cathode electrode of the photodiode (PD) 141 is connected to a floating diffusion (FD) via the transfer transistor 142. It goes without saying that a method in which the cathode electrode of the photodiode (PD) 141 is connected to a power supply of the pixel area (pixel power source), the anode electrode of the photodiode (PD) 141 is connected to the floating diffusion (FD) via the transfer transistor 142, and the photocharges are read as photoholes may be used.

The transfer transistor 142 controls reading of photocharges from the photodiode (PD) 141. The drain electrode of the transfer transistor 142 is connected to the floating diffusion, and the source electrode of the transfer transistor 142 is connected to the cathode electrode of the photodiode (PD) 141. Further, to the gate electrode of the transfer transistor 142, a transfer control line (TRG) is connected. A transfer control signal supplied from the vertical scanning unit 123 (FIG. 3) is transmitted through the transfer control line (TRG). When the transfer control line (TRG) (i.e., the gate potential of the transfer transistor 142) is in an off-state, photocharges are not transferred from the photodiode (PD) 141 (photocharges are stored in the photodiode (PD) 141). The transfer control line (TRG) (i.e., the gate potential of the transfer transistor 142) is in an on-state, the photocharges stored in the photodiode (PD) 141 are transferred to the floating diffusion (FD).

The reset transistor 143 resets the potential of the floating diffusion (FD). The drain electrode of the reset transistor 143 is connected to the power source potential, and the source electrode of the reset transistor 143 is connected to the floating diffusion (FD). Further, to the gate electrode of the reset transistor 143, a reset control line (RST) is connected. A reset control signal supplied from the vertical scanning unit 123 (FIG. 3) is transmitted through the reset control line (RST). When the reset control signal (RST) (i.e., the gate potential of the reset transistor 143) is in an off-state, the floating diffusion (FD) is cut off from the power source potential. When the reset control signal (RST) (i.e., the gate potential of the reset transistor 14) in an on-state, the charges of the floating diffusion (FD) are ejected in the power source potential, and the floating diffusion (PD) is The amplification transistor 144 amplifies the potential change of the floating diffusion (FD), and outputs it as an electric signal (analog signal). The gate electrode of the amplification transistor 144 is connected to the floating diffusion (PD), the drain electrode of the amplification transistor 144 is connected to a source follower power supply voltage, and the source electrode of the amplification transistor 144 is connected to the drain electrode of the select transistor 145. For example, the amplification transistor 144 outputs the potential of the floating diffusion (FD) reset by the reset transistor 143 to the select transistor 145 as a reset signal (reset level). Further, the amplification transistor 144 outputs, to the select transistor 145 as an optical storage signal (signal level), the potential of the floating diffusion (PD) to which photocharges are transferred by the transfer transistor 142.

The select transistor 145 controls the output to a vertical signal line (VSL) 132 of an electric signal supplied from the amplification transistor 144 (i.e., the A/D conversion unit 122). The drain electrode of the select transistor 145 is connected to the source electrode of the amplification transistor 144, and the source electrode of the select transistor 145 is connected to the vertical signal line 132. Further, to the gate electrode of the select transistor 145, a select control line (SEL) is connected. A select control signal supplied from the vertical scanning unit 123 (FIG. 3) is transmitted through the select control line (SEL). When the select control signal (SEL) (i.e., the gate potential of the select transistor 145) is in an off-state, the amplification transistor 144 and the vertical signal line 132 are electrically cut off from each other. Therefore, in this state, a reset signal, a pixel signal, and the like are not output from the unit pixel 131. When the select control signal (SEL) (i.e., the gate potential of the select transistor 145) is in an on-state, the unit pixel 131 is in a selected state. That is, the amplification transistor 144 and the vertical signal line 132 are electrically connected to each other, and the signal output from the amplification transistor 144 is supplied to the vertical signal line 132 as a pixel signal of the unit pixel 131. Specifically, a reset signal, a pixel signal, and the like are read from the unit pixel 131.

Note that the configuration of the unit pixel 131 can be arbitrarily determined, and is not limited to the example in FIG. 5.

(Conductor Loop)

In the pixel/analog processing unit 111 having the above-mentioned configuration, various conductor loops (loopshaped (annular) conductors) are formed by the above-mentioned control line (the control line 133) that controls various transistors, the vertical signal line 132, the analog power supply wiring, the digital power supply wiring, and the like when a unit pixel is selected as a target for signal reading or the like. A magnetic flux generated from a near power supply wiring or the like passes through the loop surface of the conductor loop, thereby generating an induced electromotive force.

In the case of the pixel array 121, dimensions of the conductor loop depend on the position of the selected pixel as shown in FIG. 1. Therefore, when the position of the selected pixel is changed, also the dimensions (size, shape) of the conductor loop and an induced electromotive force generated in the conductor loop are changed.

(Power Supply Wiring 1)

Examples of such a conductor that causes an induced electromotive force to be generated in the conductor loop formed in the pixel array 121 include power supply wirings formed in the pixel/analog processing unit 111, the digital processing unit 112, and the digital processing unit 113. In the following, description will be made with power supply wirings of the digital processing unit 112 and the digital processing unit 113 as an example.

Figure 6:
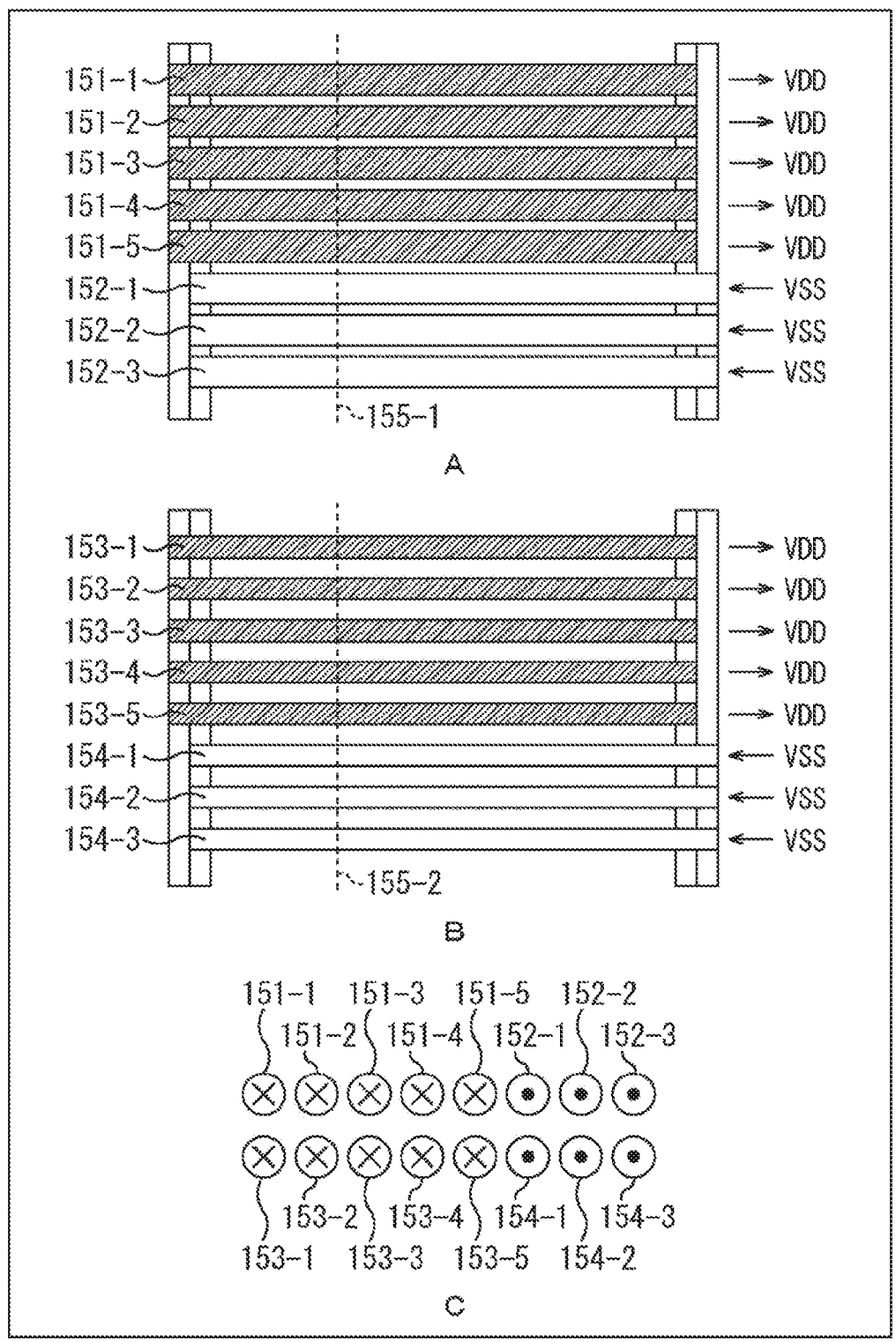
FIG. 6 A diagram showing an example of power supply wirings of a digital processing unit.

FIG. 6 is a diagram showing an arrangement example of power supply wirings formed in the digital processing unit 112 and the digital processing unit 113.

Part A of FIG. 6 shows an arrangement example of the power supply wirings formed is the digital processing unit 112. In the example of part A of FIG. 6, a linear power supply wiring (VDD) 151-1 to a linear power supply wiring (VDD) 151-5 and a linear power supply wiring (VSS) 152-1 to a linear power supply wiring (VSS) 152-3 are arranged substantially in parallel with each other. In the case where the power supply wiring (VDD) 151-1 to the power supply wiring (VDD) 151-5 do not need to be distinguished from each other for description, they are referred to as the power supply wiring (VDD) 151. Further, in the case where the power supply wiring (VSS) 152-1 to the power supply wiring (VSS) 152-3 do not need to be distinguished from each other for description, they are referred to as the power supply wiring (VSS) 152.

Part B of FIG. 6 shows an arrangement example of the power supply wiring formed in the digital processing unit 113. In the example of part B of FIG. 6, a linear power supply wiring (VDD) 153-1 to a linear power supply wiring (VDD) 153-5 and a linear power supply wiring (VSS) 154-1 to a linear power supply wiring (VSS) 154-3 are arranged substantially in parallel with each other.

The power supply wiring (VDD) 153-1 to the power supply wiring (VDD) 153-5 are respectively arranged at positions where they are superimposed on the power supply wiring (VDD) 151-1 to the power supply wiring (VDD) 151-5 via a predetermined insulation layer. Further, the power supply wiring (VSS) 154-1 to the power supply wiring (VSS) 154-3 are respectively arranged at positions where they are superimposed on the power supply wiring (VDD) 151-1 to the power supply wiring (VDD) 151-3 via a predetermined insulation layer.

In the case where the power supply wiring (VDD) 153-1 to the power supply wiring (VDD) 153-5 do not need to be distinguished from each other for description, they are referred to as the power supply wiring (VDD) 153. Further, in the case where the power supply wiring (VSS) 154-1 to the power supply wiring (VSS) 154-3 do not need to be distinguished from each other for description, they are referred to as the power supply wiring (VSS) 154.

In part A and part B of FIG. 6, arrows on the right side each represent the direction of current flowing through the conductor. That is, the orientations of current flowing through the power supply wiring (VDD) 151 and the power supply wiring (VDD) 153 are substantially opposite to (different from) the orientations of current flowing through the power supply wiring (VSS) 152 and the power supply wiring (VSS) 154.

Dotted lines 155-1 shown in part A of FIG. 6 and dotted lines 155-2 shown in part B of FIG. 6 show the same position when viewed from the layered direction of the digital processing unit 112 and the digital processing unit 113. The dotted lines 155-1 and the dotted lines 155-2 are referred to as the dotted lines 155 to represent both of them. Part C of FIG. 6 shows an example of a cross-sectional view when the logic chip 102 and the logic chip 103 are cut along the dotted lines 155.

In part C of FIG. 6, current flows through the power supply wiring (VDD) 151 and the power supply wiring (VDD) 153 shown by a mark of "×" toward the back side of the figure. Further, current flows through the power supply wiring (VSS) 152 and the power supply wiring (VSS) 154 shown by a mark of "●" toward the front side of the figure.

As shown in part C of FIG. 6, the wirings of the power supply wiring (VDD) 151 and the power supply wiring (VSS) 152 are respectively formed to be superimposed on the wirings of the power supply wiring (VDD) 153 and the power supply wiring (VSS) 154.

In a conductor pair of two conductors (power supply wirings) adjacent to each other in the layered direction of two layers (in this example, the logic chip 102 and the logic chip 103) in which conductors (power supply wirings) are formed, the orientations of current flowing through the two conductors are substantially the same. For example, current flow through the power supply wiring (VDD) 151-1 and the power supply wiring (VDD) 153-1 in substantially the same direction. The same shall apply to other power supply wirings.

(Power Supply Wiring 2)

Figure 7:
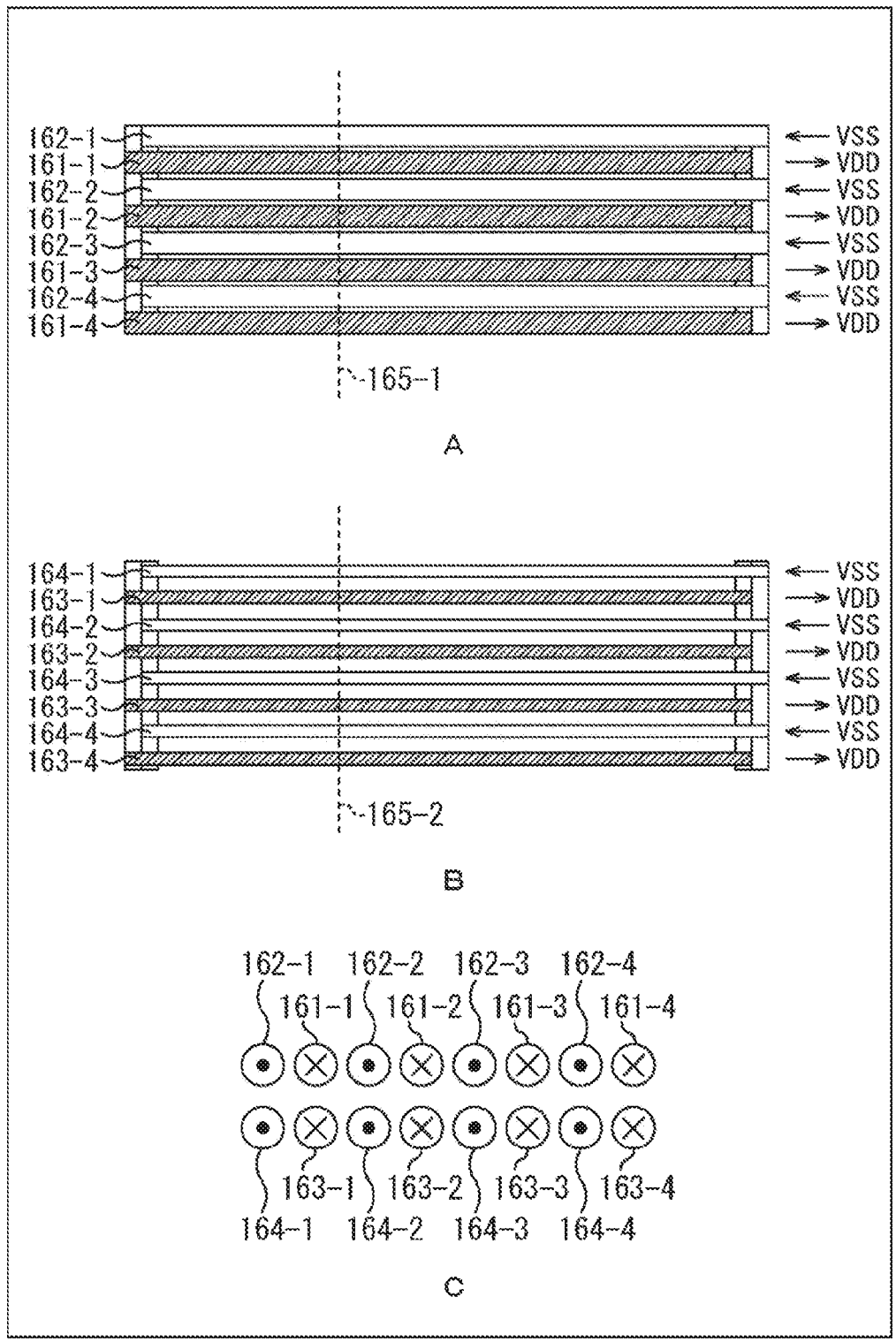
FIG. 7 A diagram showing an example of power supply wirings of the digital processing unit.

FIG. 7 is a diagram showing another arrangement example of the power supply wirings formed in the digital processing unit 112 and the digital processing unit 113.

Part A of FIG. 7 shows an arrangement example of the power supply wirings formed in the digital processing unit 112. In the example shown in part A of FIG. 7, a linear power supply wiring (VDD) 161-1 to a linear power supply wiring (VDD) 161-4 and a linear power supply wiring (VSS) 162-1 to a linear power supply wiring (VSS) 162-4 are arranged substantially in parallel with each other in the case where the power supply wiring (VDD) 161-1 to the power supply wiring (VDD) 161-4 do not need to be distinguished from each other, they are referred to as the power supply wiring (VDD) 161. Further in the case where the power supply wiring (VSS) 162-1 to the power supply wiring (VSS) 162-4 do not need to be distinguished from each other, they are referred to as the power supply wiring (VSS) 162.

Part B of FIG. 7 shows an arrangement example of the power supply wirings formed in the digital processing unit 113. In the example shown in part B of FIG. 7, a linear power supply wiring (VDD) 163-1 to a linear power supply wiring (VDD) 163-4 and a linear power supply wiring (VSS) 164-1 to a linear power supply wiring (VSS) 164-4 are arranged substantially in parallel with each other.

The power supply wiring (VDD) 163-1 to the power supply wiring (VDD) 163-4 are respectively arranged at positions where they are superimposed on the power supply wiring (VDD) 161-1 to the power supply wiring (VDD)

161-4 via a predetermined insulation layer. Further, the power supply wiring (VSS) 164-1 to the power supply wiring (VSS) 164-4 are respectively arranged at positions where they are superimposed on the power supply wiring (VSS) 162-1 to the power supply wiring (VSS) 162-4 via a predetermined insulating layer.

In the case where the power supply wiring (VDD) 163-1 to the power supply wiring (VDD) 163-4 do not need to be distinguished from each other for description, they are referred to as the power supply wiring (VDD) 163. Further, in the case where the power supply wiring (VSS) 164-1 to the power supply wiring (VSS) 164-4 do not need to be distinguished from each other for description, they are referred to as the power supply wiring (VSS) 164.

In part A and part B of FIG. 7, arrows on the right side each represent the direction of current flowing through the conductor. That is, the orientations of current flowing through the power supply wiring (VDD) 161 and the power supply wiring (VDD) 163 are substantially opposite to (different from) the orientations of current flowing through the power supply wiring (VSS) 162 and the power supply wiring (VSS) 164.

Further, as shown in part A of FIG. 7, the power supply wiring (VDD) 161 and the power supply wiring (VSS) 162 are alternately arranged. Similarly, as shown in part B of FIG. 7, the power supply wiring (VDD) 163 and the power supply wiring (VSS) 164 are alternately arranged.

Note that although the power supply wiring (VDD) 161-1 to the power supply wiring (VDD) 161-4 and the power supply wiring (VSS) 162-1 to the power supply wiring (VSS) 162-4 are shown as respective single wirings in part A of FIG. 7, they may each be formed by a plurality of wirings. Similarly, although the power supply wiring (VDD) 163-1 to the power supply wiring (VDD) 163-4 and the power supply wiring (VSS) 164-1 to the power supply wiring (VSS) 164-4 are shown as respective single wirings in part B of FIG. 7, they may each be formed by a plurality of wirings.

Dotted lines 165-1 shown in part A of FIG. 7 and dotted lines 165-2 shown in part B of FIG. 7 show the same position when viewed from the layered direction of the digital processing unit 112 and the digital processing unit 113. The dotted lines 165-1 and the dotted lines 165-2 are referred to as the dotted lines 165 to represent, both of them. Part C of FIG. 7 shows an example of a cross-sectional view when the log is chip 102 and the logic chip 103 are cut along the dotted lines 165.

In part C of FIG. 7, current flows through the power supply wiring (VDD) 161 and the power supply wiring (VDD) 163 shown by a mark of "×" toward the back side of the figure. Further, current flows through the power supply wiring (VSS) 162 and the power supply wiring (VSS) 164 shown by a mark of "●" toward the front side of the figure.

As shown in part C of FIG. 7, the wirings of the power supply wiring (VDD) 161 and the power supply wiring (VSS) 162 are respectively formed to be superimposed on the wirings of the power supply wiring (VDD) 163 and the power supply wiring (VSS) 164. The orientations of current flowing through two conductors (power supply wirings) adjacent to each other in the layered direction of two layers (in this example, the logic chip 102 and the logic chip 103) in which conductors (power supply wirings) are formed are substantially the same. For example, current flow through the power supply wiring (VDD) 161-1 and the power supply wiring (VDD) 163-1 in substantially the same direction. The same shall apply to other power supply wirings.

(Power Supply Wiring 3)

Figure 8:
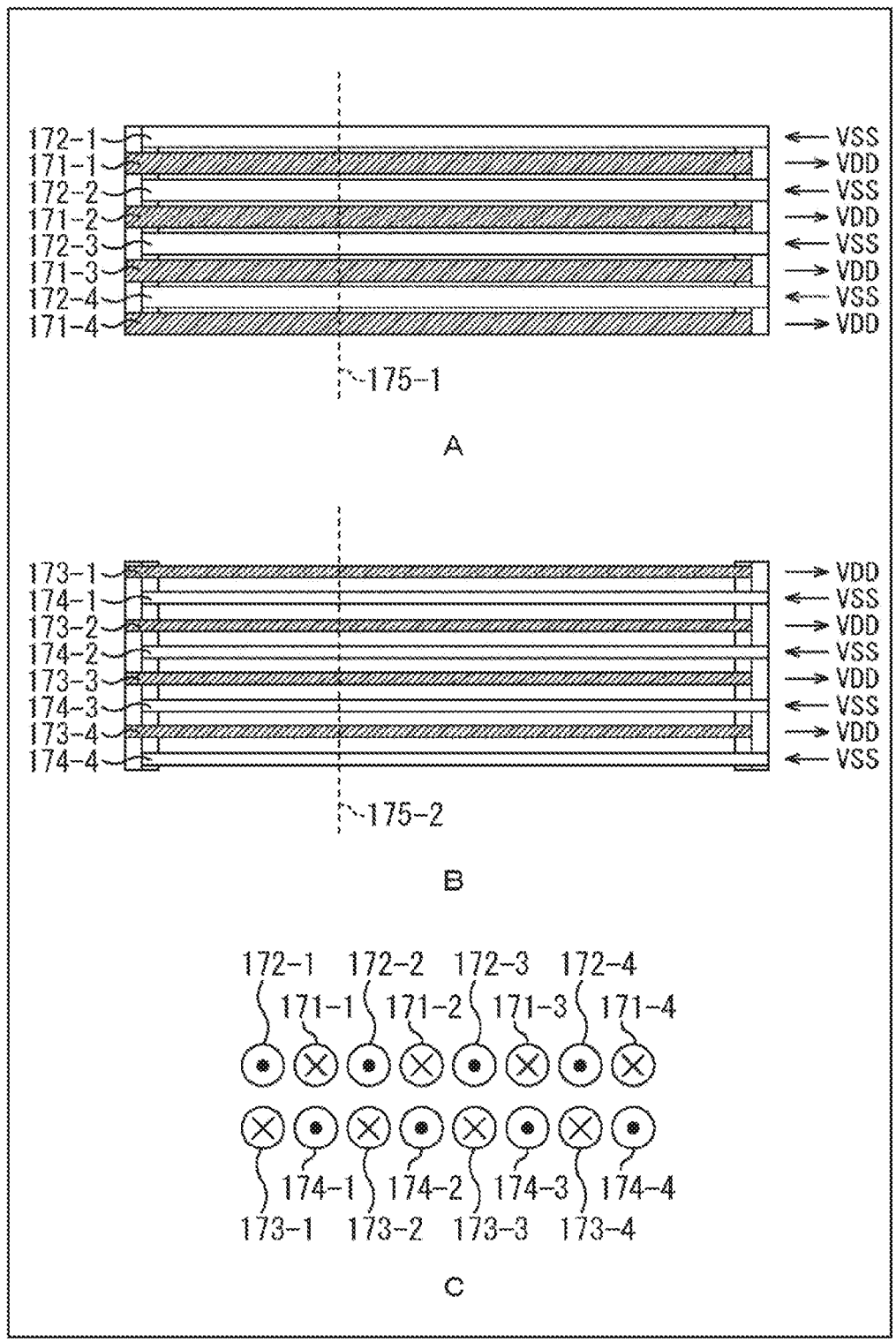
FIG. 8 A diagram showing an example of power supply wirings of the digital processing unit.

FIG. 8 is a diagram showing still another arrangement example of the power supply wirings formed in the digital processing unit 112 and the digital processing unit 113.

Part A of FIG. 8 shows an arrangement example of the power supply wirings formed in the digital processing unit 112. In the example shown in part A of FIG. 8, a linear power supply wiring (VDD) 171-1 to a linear power supply wiring (VDD) 171-4 and a linear power supply wiring (VSS) 172-1 to a linear power supply wiring (VSS) 172-4 are arranged substantially in parallel with each other. In the case where the power supply wiring (VDD) 171-1 to the power supply wiring (VDD) 171-4 do not need to be distinguished from each other, they are referred to as the power supply wiring (VDD) 171. Further in the case where the power supply wiring (VSS) 172-1 to the power supply wiring (VSS) 172-4 do not need to be distinguished from each other, they are referred to as the power supply wiring (VSS) 172.

Part B of FIG. 8 shows an arrangement example of the power supply wirings formed in the digital processing unit 113. In the example shown in part B of FIG. 7, a linear power supply wiring (VDD) 173-1 to a linear power supply wiring (VDD) 173-4 and a linear power supply wiring (VSS) 174-1 to a linear power supply wiring (VSS) 174-4 are arranged substantially in parallel with each other.

The power supply wiring (VDD) 173-1 to the power supply wiring (VDD) 173-4 are respectively arranged at positions where they are superimposed on the power supply wiring (VSS) 172-1 to the power supply wiring (VSS) 172-4 via a predetermined insulation layer. Further, the power supply wiring (VSS) 174-1 to the power supply wiring (VSS) 174-4 are respectively arranged at positions where they are superimposed on the power supply wiring (VDD) 171-1 to the power supply wiring (VDD) 171-4 via a predetermined insulating layer.

In the case where the power supply wiring (VDD) 173-1 to the power supply wiring (VDD) 173-4 do not need to be distinguished from each other for description, they are referred to as the power supply wiring (VDD) 173. Further, in the case where the power supply wiring (VSS) 174-1 to the power supply wiring (VSS) 174-4 do not need to be distinguished from each other for description, they are referred to as the power supply wiring (VSS) 174.

In part A and part B of FIG. 8, arrows on the right side each represent the direction of current flowing through the conductor. That is, the orientations of current flowing through the power supply wiring (VDD) 171 and the power supply wiring (VDD) 173 are substantially opposite to (different from) the orientations of current flowing through the power supply wiring (VDD) 172 and the power supply wiring (VSS) 174.

Further, as shown in part A of FIG. 8, the power supply wiring (VDD) 171 and the power supply wiring (VSS) 172 are alternately arranged. Similarly, as shown in part B of FIG. 8, the power supply wiring (VDD) 173 and the power supply wiring (VSS) 174 are alternately arranged.

Note that although the power supply wiring (VDD) 171-1 to the power supply wiring (VDD) 171-4 and the power supply wiring (VSS) 172-1 to the power supply wiring (VSS) 172-4 are shown as respective single wirings in part A of FIG. 8, they may each be formed by a plurality of wirings. Similarly, although the power supply wiring (VDD) 173-1 to the power supply wiring (VDD) 173-4 and the power supply wiring (VSS) 174-1 to the power supply wiring (VSS) 174-4 are shown as respective single wirings in part B of FIG. 8, they may each be formed by a plurality of wirings.

Dotted lines 175-1 shown in part A of FIG. 8 and dotted lines 175-2 shown in part B of FIG. 8 show the same position when viewed from the layered direction of the digital processing unit 112 and the digital processing unit 113. The dotted lines 175-1 and the dotted lines 175-2 are referred to as the dotted lines 175 to represent both of them. Part C of FIG. 8 shows an example of a cross-sectional view when the logic chip 102 and the logic chip 103 are cut along the dotted lines 175.

In part C of FIG. 8, current flows through the power supply wiring (VDD) 171 and the power supply wiring (VDD) 173 shown by a mark of "×" toward the back side of the figure. Further, current flows through the power supply wiring (VSS) 172 and the power supply wiring (VSS) 174 shown by a mark of "●" toward the front side of the figure.

As shown in part C of FIG. 8, the wirings of the power supply wiring (VDD) 171 and the power supply wiring (VSS) 172 are respectively formed to be superimposed on the wirings of the power supply wiring (VSS) 174 and the power supply wiring (VDD) 173. The orientations of current flowing through two conductors (power supply wirings) adjacent to each other in the layered direction of two layers (in this example, the logic chip 102 and the logic chip 103) in which conductors (power supply wirings) are formed are substantially opposite to each other (orientations of current are different from each other). For example, current, flow through the power supply wiring (VDD) 171-1 and the power supply wiring (VSS) 174-1 in a substantially opposite direction. The same shall apply to other power supply wirings.

(Power Supply Wiring 4)

Figure 9:
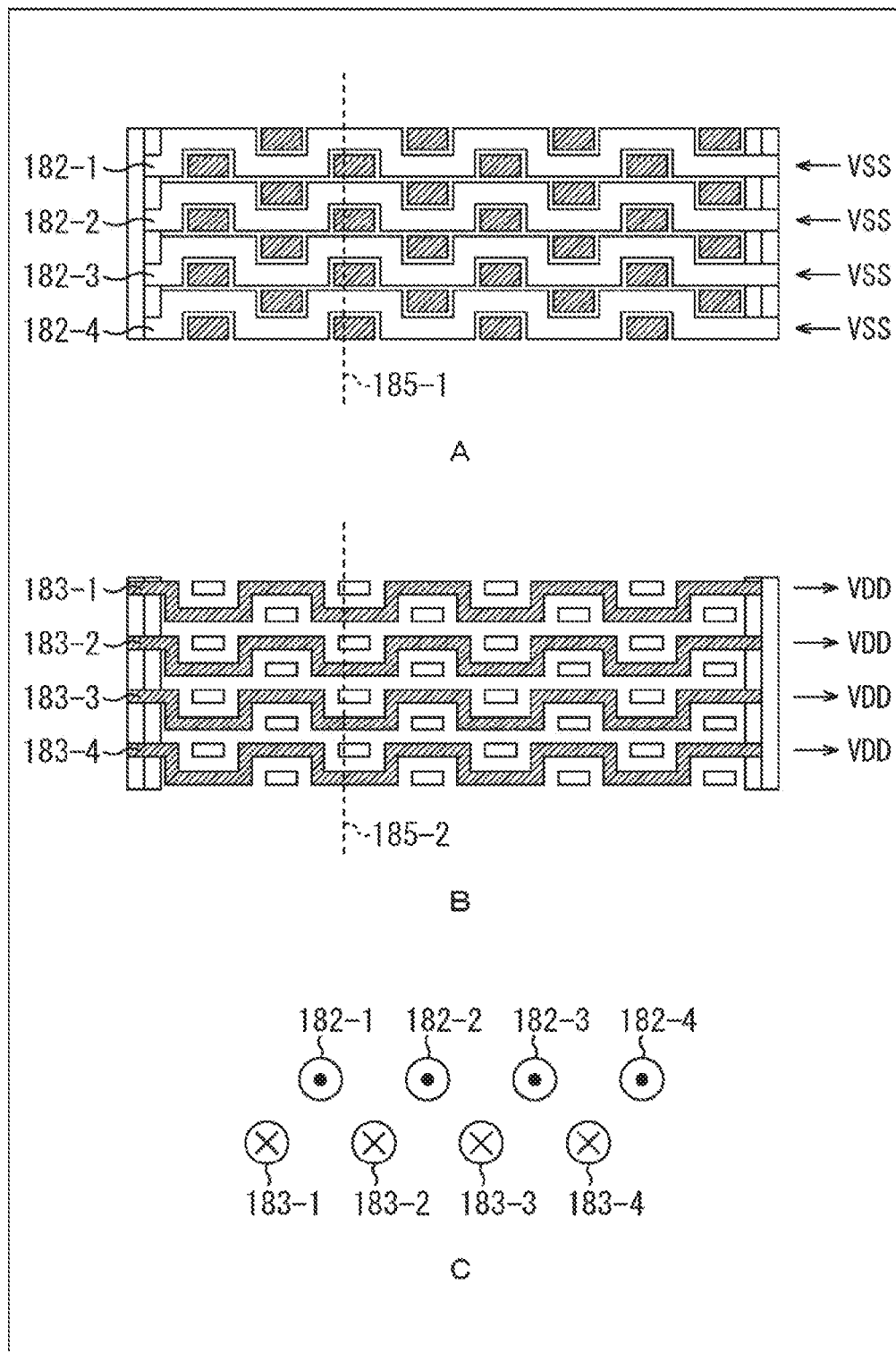
FIG. 9 A diagram showing an example of power supply wirings of the digital processing unit.

FIG. 9 is still another arrangement example of the power supply wirings formed in the digital processing unit 112 and the digital processing unit 113.

Part A of FIG. 9 shows an arrangement example of the power supply wirings formed in the digital processing unit 112. In the example of part A of FIG. 9, a power supply wiring (VSS) 182-1 to a power supply wiring (VSS) 182-4 are arranged substantially in parallel with each other. In the case where the power supply wiring (VSS) 182-1 to the power supply wiring (VSS) 182-4 do not need to be distinguished from each other for description, they are referred to as the power supply wiring VSS) 182.

As shown in part A of FIG. 9, at least a part of each power supply wiring (VSS) 182 snakes to form a meander shape. That is, each power supply wiring (VSS) has a periodic structure in which the shape thereof is periodically changed in the longitudinal direction.

Part B of FIG. 9 shows an arrangement example of the power supply wirings formed in the digital processing unit 113. In the example of part B of FIG. 9, a power supply wiring (VDD) 183-1 to a power supply wiring (VDD) 183-4 are arranged substantially in parallel with each other. The power supply wiring (VDD) 183-1 to the power supply wiring (VDD) 183-4 are respectively arranged at positions where they are superimposed on the power supply wiring (VSS) 182-1 to the power supply wiring (VSS) 182-4 via an insulation layer. In the case where the power supply wiring (VDD) 183-1 to the power supply wiring (VDD) 183-4 do not need to be distinguished from each other for description, they are referred to as the power supply wiring (VDD) 183.

As shown in part B of FIG. 9, at least a part of each power supply wiring (VDD) 183 snakes to form a meander shape. That is, each power supply wiring (VDD) 183 has a periodic structure in which the shape thereof is periodically changed in the longitudinal direction.

In part A and part B of FIG. 9, arrows on the right side each represent the direction of current flowing through the conductor. That, is, the orientations of current flowing through the power supply wiring (VDD) 183 and the power supply wiring (VSS) 182 are substantially opposite to (different from) each other.

Dotted lines 185-1 shown in part A of FIG. 9 and dotted lines 185-2 shown in part B of FIG. 9 show the same position when viewed from the layered direction of the digital processing unit 112 and the digital processing unit 113. The dotted lines 185-1 and the dotted lines 185-2 are referred to as the dotted lines 185 to represent both of them. Part C of FIG. 9 shows an example of a cross-sectional view when the logic chip 102 and the logic chip 103 are cut along the dotted lines 185.

In part C of FIG. 9, current flows through the power supply wiring (VDD) 183 shown by a mark of "×" toward the back side of the figure. Further, current flows through the power supply wiring (VSS) 182 shown by a mark of "●" toward the front side of the figure.

As shown in part A or part C of FIG. 9, in the layer of the logic chip 102 (the digital processing unit 112), the power supply wiring (VSS) 182 is formed but the power supply wiring (VDD) 183 is not formed. Further, as shown in part B or part C of FIG. 9, in the layer of the logic chip 103 (the digital processing unit 113), the power supply wiring (VDD) 183 is formed but the power supply wiring (VSS) 182 is not formed. That is, in the same layer, the orientations of current flowing through the adjacent conductors are substantially the same.

Further, as shown in part C of FIG. 9, the power supply wiring (VSS) 182 and the power supply wiring (VDD) 183 are adjacent to each other in the layered direction. That is, the orientations of current flowing through the conductors adjacent in the layered direction are substantially opposite to each other (the orientations of current are different from each other). For example, current flows through the power supply wiring (VSS) 182-1 and the power supply wiring (VDD) 183-1 in a substantially opposite direction. The same shall apply to other power supply wirings.

Note that in part C of FIG. 9, the power supply wiring (VSS) 182 and the power supply wiring (VDD) 183 are not adjacent to each other in the direction perpendicular to the layer. However, since the wirings snake as shown in part A or part B of FIG. 9, there is a part adjacent in the direction perpendicular to the layer. Further, also in the cut surface shown in part C of FIG. 9, the distance between both wirings is sufficiently small. Therefore, the power supply wiring (VSS) 182 and the power supply wiring (VDD) 183 are adjacent to each other in the layered direction.

(Power Supply Wiring 5)

Figure 10:
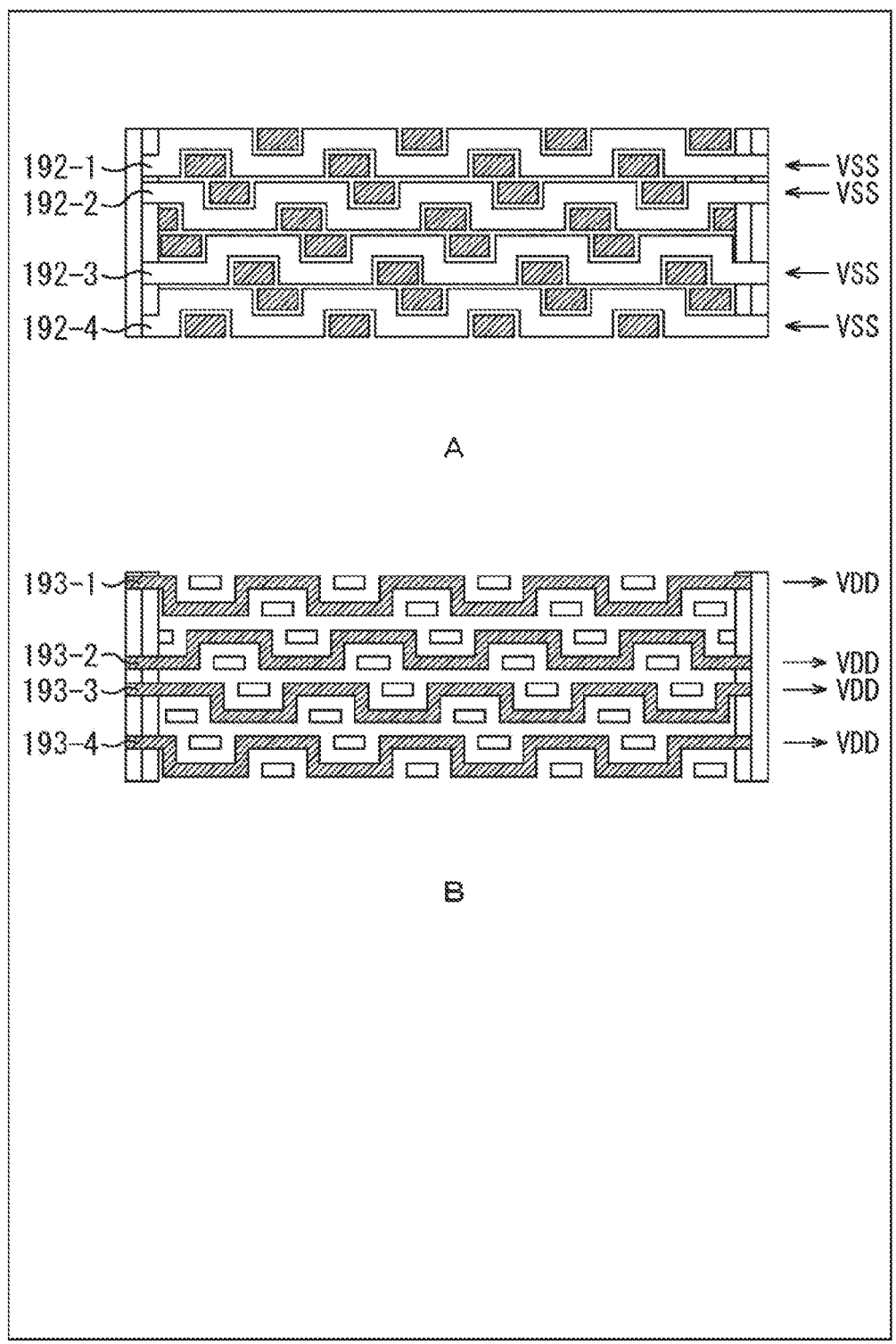
FIG. 10 A diagram showing an example of power supply wirings of the digital processing unit.

FIG. 10 is a diagram showing still another arrangement example of the power supply wirings formed in the digital processing unit 112 and the digital processing unit 113.

Part A of FIG. 10 shows an arrangement example of the power supply wirings formed in the digital processing unit 112. In the example shown in part A of FIG. 10, a power supply wiring (VSS) 192-1 to a power supply wiring (VSS) 192-4 are alternately arranged. In the case where the power supply wiring (VSS) 192-1 to the power supply wiring (VSS) 192-4 do not need to be distinguished from each other, they are referred to as the power supply wiring (VSS) 192.

As shown in part A of FIG. 10, at least a part of the power supply wiring (VSS) 192 snakes to form a meander shape.

That is, each power supply wiring (VSS) 192 has a periodic structure in which the shape thereof is periodically changed in the longitudinal direction.

Note that although the position of the power supply wiring (VSS) 182 in the longitudinal direction in the periodic structure of each power supply wiring (VSS) 182 is the same in the case of the example shown in part A of FIG. 9, the position of the power supply wiring (VSS) 192 the longitudinal direction of a part of each power supply wiring (VSS) 192, which is an origin of the periodic structure (referred to also as origin position), is displaced in the case of the example shown in part A of FIG. 10. That is, the periodic structure of each power supply wiring (VSS) 192 is formed at a different position in the longitudinal direction of the power supply wiring (VSS) 192.

Part B of FIG. 10 shows an arrangement example of the power supply wirings formed in the digital processing unit 113. In the example of part B of FIG. 10, a power supply wiring (VDD) 193-1 to a power supply wiring (VDD) 193-4 are arranged substantially in parallel with each other. The power supply wiring (VDD) 193-1 to the power supply wiring (VDD) 193-4 are respectively arranged at positions where they are superimposed on the power supply wiring (VSS) 192-1 to the power supply wiring (VSS) 192-4 via a predetermined insulation layer. In the case where the power supply wiring (VDD) 193-1 to the power supply wiring (VDD) 193-4 do not need to be distinguished from each other, they are referred to as the power supply wiring (VDD) 193.

As shown in part B of FIG. 10, at least a part of each power supply wiring (VDD) 193 snakes to form a meander shape. That is, each power supply wiring (VDD) 193 has a periodic structure in which the shape thereof is periodically changed in the longitudinal direction.

Note that although the position of the power supply wiring (VDD) 193 in the longitudinal direction in the periodic structure of each power supply wiring (VDD) 193 is the same in the case of the example shown in part B of FIG. 9, the position of the power supply wiring (VDD) 193 in the longitudinal direction of a part of each power supply wiring (VDD) 193, which is an origin position of the periodic structure, is displaced in the case of the example shown in part B of FIG. 10, as in the case of part A of FIG. 10. That is, the periodic structure of each power supply wiring (VDD) 193 is formed at a different position in the longitudinal direction of the power supply wiring (VDD) 193.

In part A and part B of FIG. 10, arrows on the right side each represent the direction of current flowing through the conductor. That is, the orientations of current flowing through the power supply wiring (VDD) 193 and the power supply wiring (VSS) 192 are substantially opposite to (different from) each other.

In the layer of the logic chip 102 (the digital processing unit 112), the power supply wiring (VSS) 192 is formed but the power supply wiring (VDD) 193 is not formed. Further, in the layer of the logic chip 103 (the digital processing unit 113), the power supply wiring (VDD) 193 is formed but the power supply wiring (VSS) 192 is not formed.

That is, the orientations of current flowing through the adjacent conductors in the same layer are substantially the same, and the orientations of current flowing through the adjacent conductors in the layered direction are substantially opposite to each other (the orientations of current are different from each other).

(Wiring Layout)

Note that the power supply wirings in each example shown in FIG. 6 to FIG. 10 may be formed at arbitrary positions in the digital processing unit 112 and the digital processing unit 113 as long as magnetic fluxes generated the power supply wirings pass through the loop surface of the conductor loop formed in the pixel/analog processing unit 111 and an induced electromotive force is generated in the conductor loop.

For example, these power supply wirings may be formed at positions in the digital processing unit 112 and the digital processing unit 113 where they are superimposed on the conductor loop formed in the pixel/analog processing unit 111. It goes without saving that these power supply wirings do not necessarily need to be superimposed on the conductor loop.

Further, each example of the above-mentioned layouts only has to be formed on at least a part of the power supply wirings formed in the digital processing unit 112 and the digital processing unit 113. For example, some power supply wirings only have to be arranged in the layout described in the above-mentioned example. Alternatively, for example, a part of the power supply wirings only has to be arranged in the layout described in the above-mentioned example.

The length or thickness of each power supply wiring can be arbitrarily determined. Further, also the number of power supply wirings can be arbitrarily determined. Further, although the case where the power supply wirings are provided in two layers has been described, the number of layers in which the power supply wirings are formed may be one or three or more.

(Comparison of Magnetic Field Intensity Distribution)

In the following, the above-mentioned layouts are compared with each other. First, comparison of the magnetic field intensity distribution in the power supply wirings in each layout example is performed.

Figure 11:
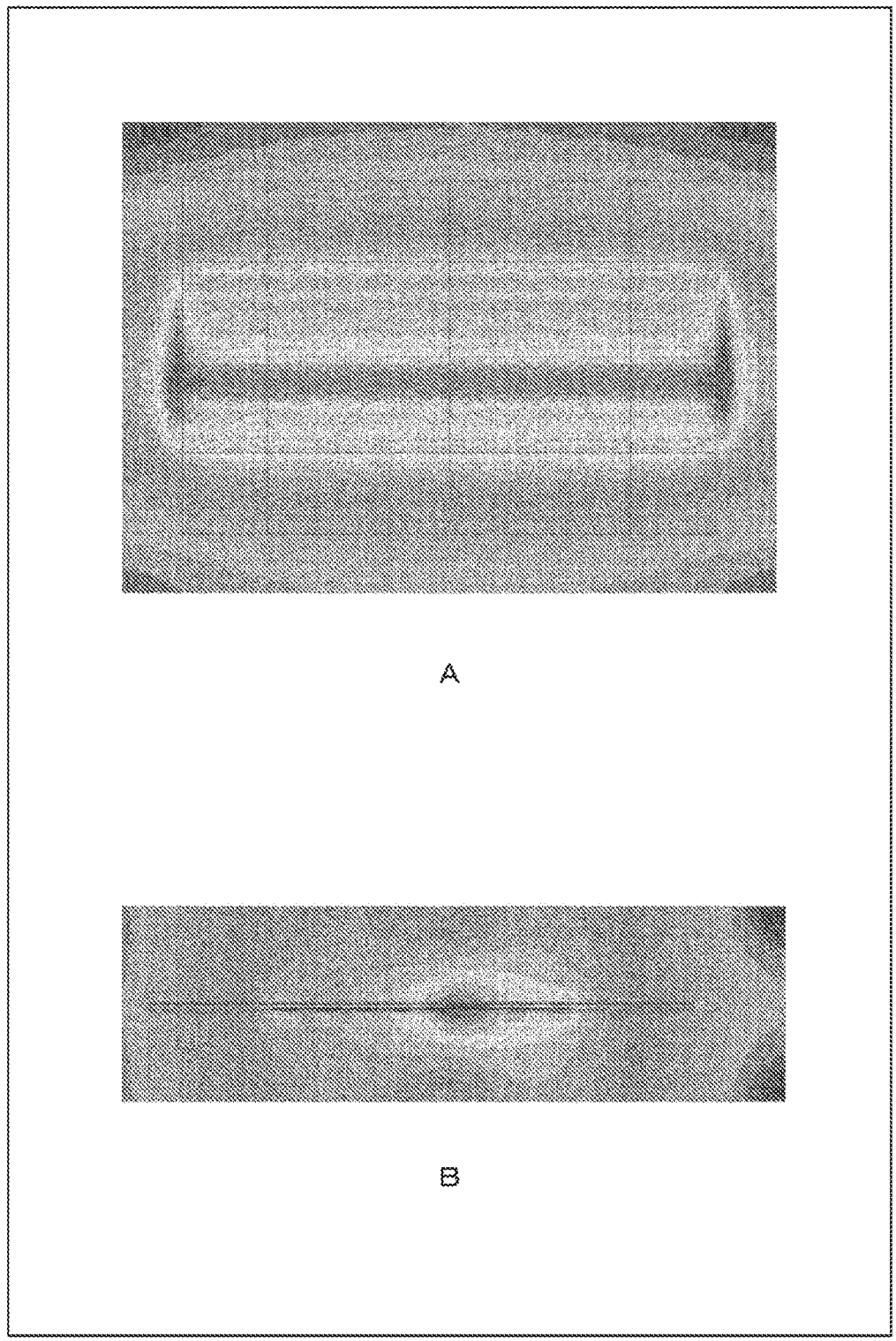
FIG. 11 A diagram showing an example of a magnetic field intensity distribution.

FIG. 11 is a diagram showing an example of intensity distribution of the magnetic field generated by the power supply wiring (VDD) 151, the power supply wiring (VSS) 152, the power supply wiring (VDD) 153, and the power supply wiring (VSS) 154 shown in FIG. 6. Part A of FIG. 11 shows the magnetic field intensity distribution when viewed from a direction similar to the layered direction in part A or part B of FIG. 6. Part B of FIG. 11 shows the magnetic field intensity distribution when viewed from a direction similar to the direction of the cross-sectional layer in part C of FIG. 6. In this case, the concentration is extremely high at a narrow place of the central portion in part A or part B of FIG. 11, which represents that the peak of the magnetic field intensity concentrates in a part thereof and is high (magnetic fluxes are not sufficiently cancelled out).

Figure 12:
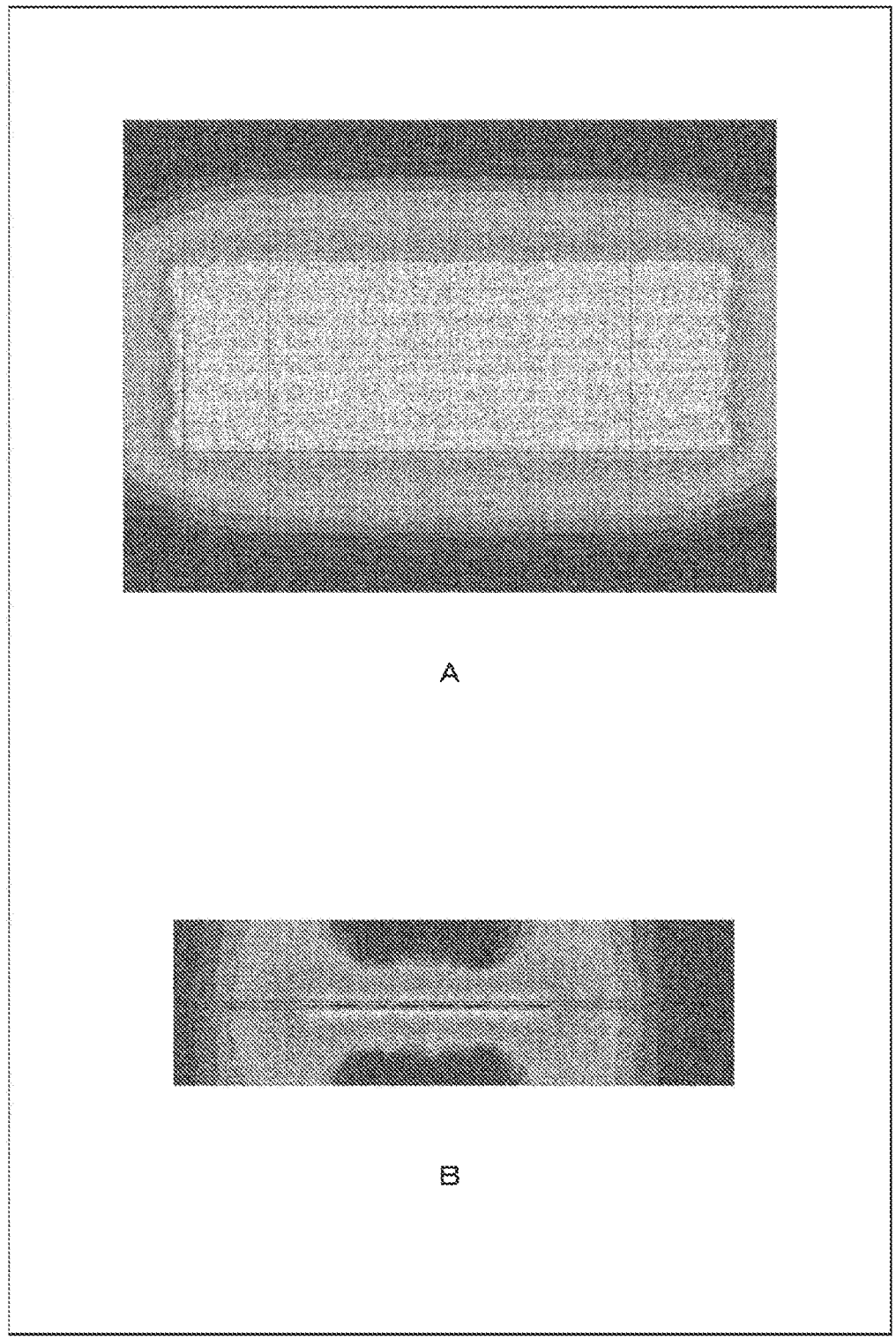
FIG. 12 A diagram showing an example of the magnetic field intensity distribution.

FIG. 12 is a diagram showing an example of intensity distribution of the magnetic field generated by the power supply wiring (VDD) 161, the power supply wiring (VSS) 162, the power supply wiring (VDD) 163, and the power supply wiring (VSS) 164 in FIG. 7. Part A of FIG. 12 shows the magnetic field intensity distribution when viewed from a direction similar to the layered direction in part A or part B of FIG. 7. Part B of FIG. 12 shows the magnetic field intensity distribution when viewed from a direction similar to the direction of the cross-sectional layer in part C of FIG. 7

In this case, the concentration at the central portion of part A or part B of FIG. 12 is lower than that in the example of FIG. 11, which represents that the peak of the magnetic field intensity is distributed and reduced. In the case of the layout of the example shown in FIG. 7, two types of power supply wirings in which the orientations of current are substantially opposite to each other are uniformly distributed in a wide range as compared with tree case of the example of FIG. 6. For that reason, as shown in FIG. 12, the magnetic fluxes are cancelled out and the peak of the magnetic field intensity is reduced in a wide range as compared with the case of the example of FIG. 11.

Figure 13:
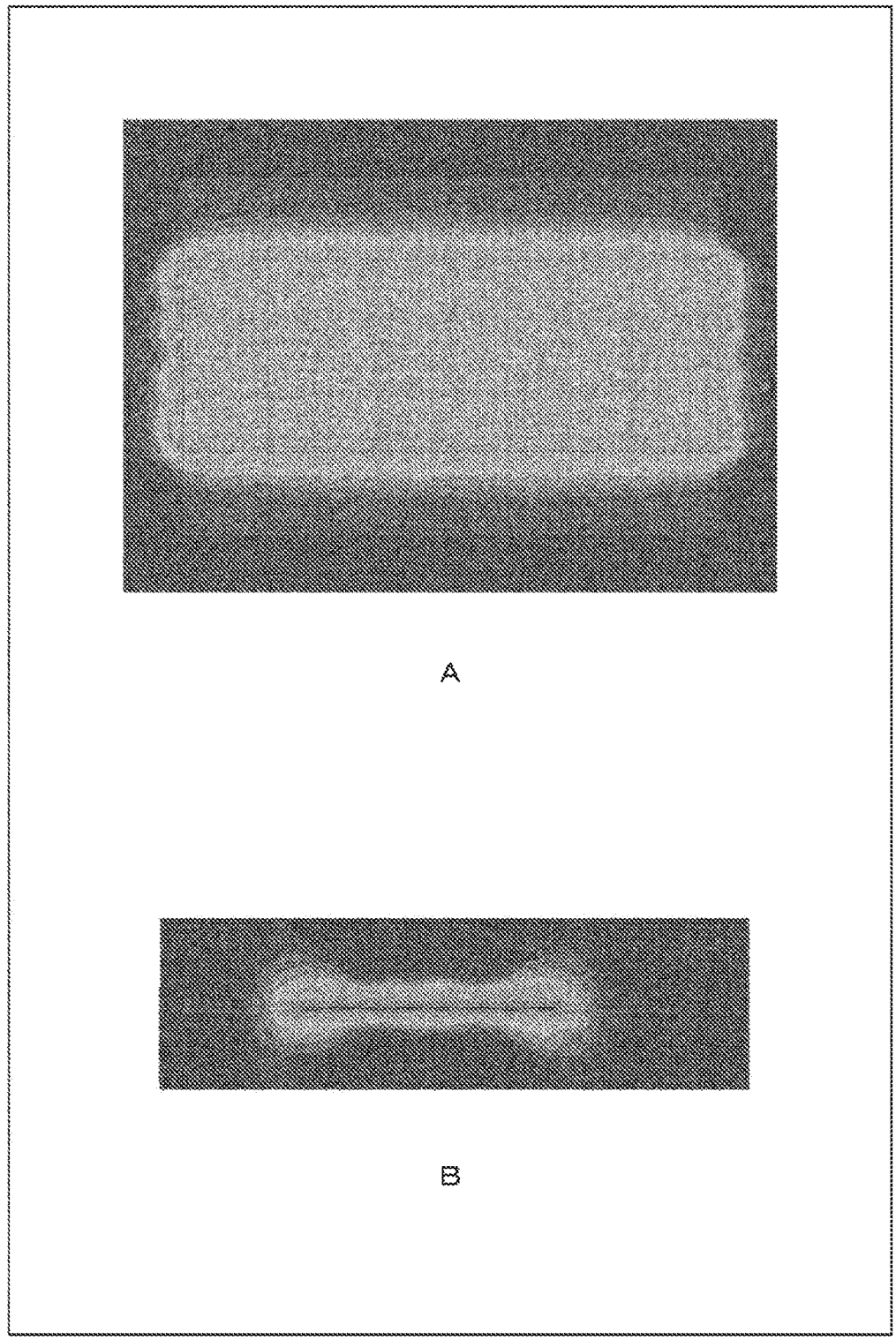
FIG. 13 A diagram showing an example of the magnetic field intensity distribution.

FIG. 13 is a diagram showing an example of intensity distribution of the magnetic field generated by the power supply wiring (VDD) 171, the power supply wiring (VSS) 172, the power supply wiring (VDD) 173, and the power supply wiring (VSS) 174 in FIG. 8. Part A of FIG. 13 shows the magnetic field intensity distribution when viewed from a direction similar to the layered direction in part A or part B of FIG. 8. Part B of FIG. 13 shows the magnetic field intensity distribution when viewed from a direction similar to the direction of the cross-sectional layer in part C of FIG. 8.

In this case, the concentration at the central portion of part A or part B of FIG. 13 is further lower than that in the example of FIG. 12, which represents that the peak of the magnetic field intensity is further reduced. In the case of the layout of the example shown in FIG. 8, the orientations of current flowing through the power supply wirings adjacent to each other between layers are substantially opposite to each other, as compared with the example of the layout shown in FIG. 7. For that reason, as shown in FIG. 13, the magnetic fluxes are cancelled out and the peak of the magnetic field intensity is further reduced as compared with the example shown in FIG. 12.

Figure 14:
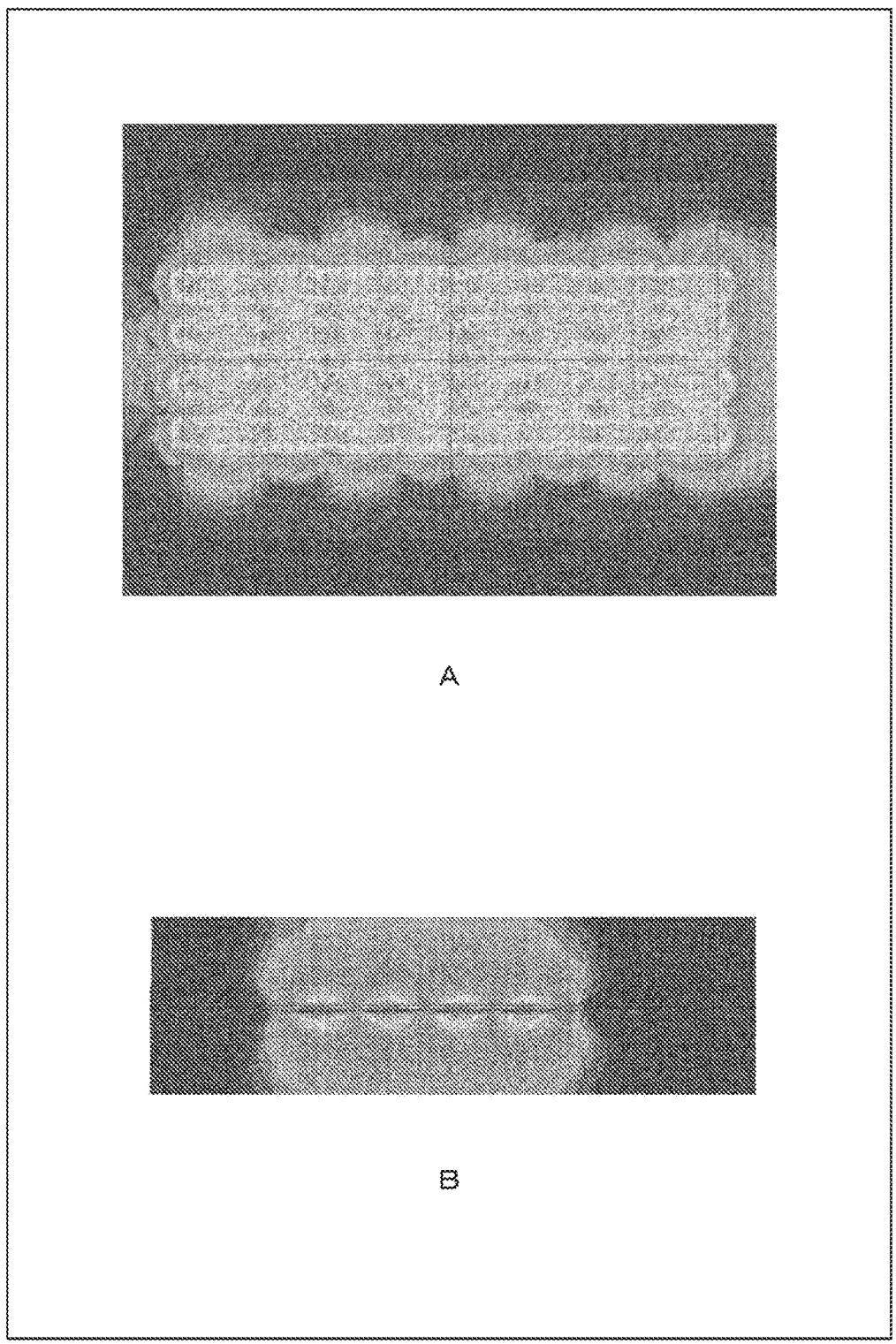
FIG. 14 A diagram showing an example of the magnetic field intensity distribution.

FIG. 14 is a diagram showing an example of intensity distribution of the magnetic field generated by the power supply wiring (VSS) 182 and the power supply wiring (VDD) 183 in FIG. 9. Part A of FIG. 14 shows the magnetic field intensity distribution when viewed from a direction similar to the layered direction in part A or part B of FIG. 9. Part B of FIG. 14 shows the magnetic field intensity distribution when viewed from a direction similar to the direction of the cross-sectional layer in part C of FIG. 9.

In this case, the concentration at the central portion of part A or part B of FIG. 14 is lower than that in the example of FIG. 11, which represents that the peak of the magnetic field intensity is distributed and reduced. In the case of the layout of the example shown in FIG. 9, two power supply wirings adjacent in the layered direction form a conductor pair, and the conductor pair itself has a periodic structure (meandering) including a part in which the power supply wirings are superimposed one another and apart from each other. For every half period of the periodic structure, the orientation of the line of magnetic force (magnetic: flux) generated by the conductor pair is inverted. For that reason, because the magnetic fluxes generated by the conductor pair is cancelled out, the peak of the magnetic field intensity is distributed and reduced as compared with the example of FIG. 11, as shown in FIG. 14.

Figure 15:
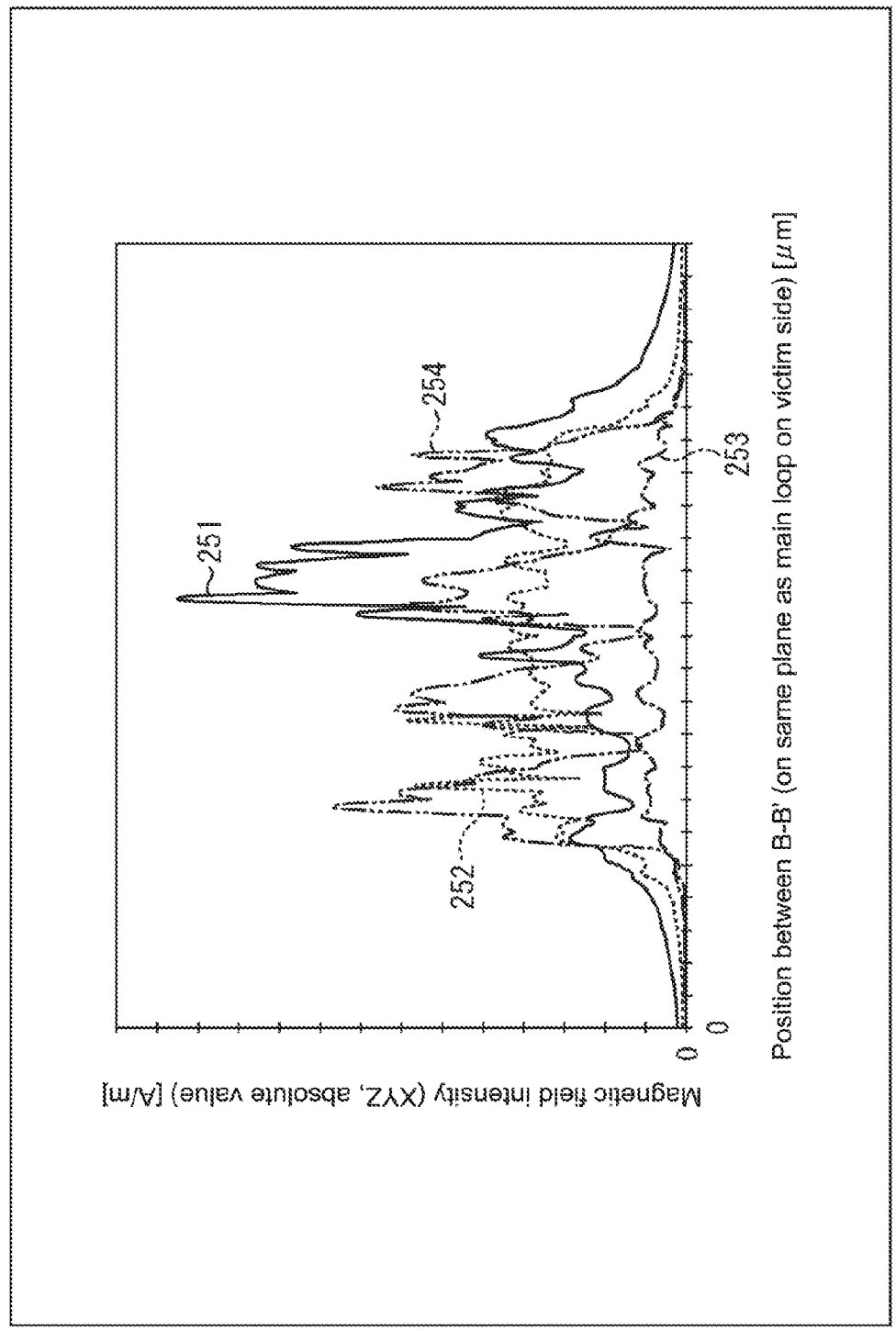
FIG. 15 A diagram showing a comparative example of the magnetic field intensity.

The graph shown in FIG. 15 shows an example of the magnetic field intensity distribution in the dotted lines 155, the dotted lines 165, the dotted lines 175, and the dotted lines 185 for the examples of FIG. 6 to FIG. 9, respectively. In FIG. 15, a solid line 251 represents the magnetic field intensity distribution on the dotted lines 155 in the power supply wirings of the layout example shown in FIG. 6. Dotted lines 252 represent the magnetic field intensity distribution on the dotted lines 165 in the power supply wirings of the layout example shown in FIG. 7. An alternate long and short dash line 253 represents the magnetic field intensity distribution on the dotted lines 175 in the power supply wirings of the layout example shown in FIG. 8. An alternate long and two short dashes line 254 represents the magnetic field intensity distribution on the dotted lines 185 in the power supply wirings of the layout example shown in FIG. 9. As shown in this graph, the peaks of the dotted lines 252, the alternate long and short dash line 253, and the alternate long and two short dashes line 254 are reduced as compared with that of the solid line 251.

Note that because it is obvious that the layout shown in FIG. 10 is basically similar to the layout shown in FIG. 9 and the peak of the magnetic field intensity can be reduced at least more than that in the case of the layout shown in FIG. 9, description thereof will be omitted.

As described above, in any case of the layouts shown in FIG. 7 to FIG. 10, it is possible to reduce the peak of the magnetic field intensity more than that in the example shown in FIG. 6. When the peak of the magnetic field intensity is reduced, an induced electromotive force generated in the conductor loop is reduced in an amount corresponding to the reduction of the peak. Specifically, in any case of the layouts shown in FIG. 7 to FIG. 10, it is possible to reduce the noise generated in the conductor loop more than that in the example shown in FIG. 6.

(Comparison of Magnetic Fluxes for Change in Conductor Loop)

Next, comparison of magnetic fluxes for the change in the conductor loop in the layout examples will be described. Assumption is made that in a conductor loop 260 formed in the pixel/analog processing unit 111 shown in part A of FIG. 16, an induced electromotive force is generated by the magnetic flux of the power supply wiring in the layout examples shown in FIG. 6 to FIG. 10. The length of the conductor loop 260 in a predetermined direction (e.g., the longitudinal direction of the power supply wiring) is a conductor loop length $L_{LOOP}$ and the length of the conductor loop 260 in another predetermined direction (e.g., the direction perpendicular to the longitudinal direction) is a conductor loop width $W_{LOOP}$.

Figure 16:
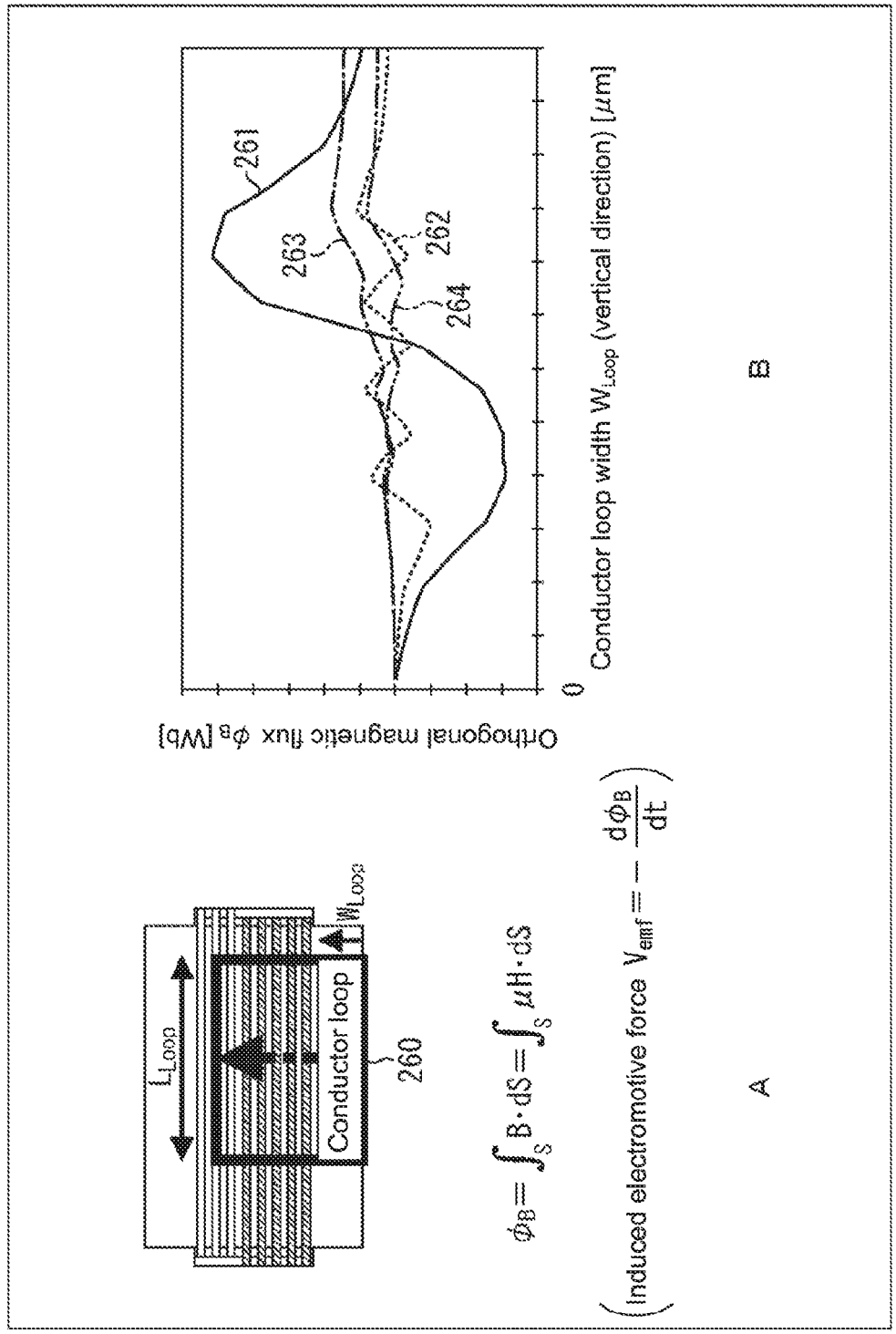
FIG. 16 A diagram showing a comparative example of a change in magnetic fluxes generated by a change in the conductor loop width.

As shown in part A of FIG. 16, the changes in magnetic fluxes that pass through the loop surface of the conductor loop 260 in the power supply wirings in the layout examples shown in FIG. 6, FIG. 7, FIG. 9, and FIG. 10 depending on the conductor loop width $W_{LOOP}$ are compared with each other. For each of the layout example shown in FIG. 6, FIG. 7, FIG. 9, and FIG. 10, the magnetic flux that passes through the loop surface of the conductor loop 260 is calculated by using the following equation (1).

(Math. 1)

$$\phi_B = \int_S B \cdot dS = \int_S \mu H \cdot dS \tag{1}$$

where $V_{emf} = -\dfrac{d\phi_B}{dt}$

The calculation results are shown in the graph of part B of FIG. 16. That is, in the graph shown in part B of FIG. 16, a solid line 261 represents the change in the magnetic flux in the power supply wiring in the layout example of FIG. 6 depending on the conductor loop width $W_{LOOP}$. Dotted lines 262 represent the change in the magnetic flux in the power supply wiring in the layout example of FIG. 7 depending on the conductor loop width $W_{LOOP}$. An alternate long and short dash line 263 represents the change in the magnetic flux in the power supply wiring in the layout example of FIG. 9 depending on the conductor loop width $W_{LOOP}$. An alternate long and two short dashes line 264 represents the change in the magnetic flux in the power supply wiring in the layout example of FIG. 10 depending on the conductor loop width $W_{LOOP}$.

As shown in part B of FIG. 16, peak values of the dotted lines 262, the alternate long and short dash line 263, and the alternate long and two short dashes line 264 are reduced more than that of the solid line 261.

Note that the layout shown in FIG. 8 is basically similar to the layout shown in FIG. 7, and the peak of the magnetic field intensity distribution in FIG. 6 is reduced more than that in FIG. 7 as described above. Therefore, because it is obvious that the peak of the magnetic flux that passes through the loop surface of the conductor loop 260 can be reduced at least more than that in the case of the layout of FIG. 7, description thereof will be omitted.

As described above, is any case of the layouts shown in FIG. 7 to FIG. 10, it is possible to reduce the peak of the magnetic flux that passes through the loop surface of the conductor loop 260 more than that in the case of the example shown in FIG. 6. When the peak of the magnetic flux that passes through the loop surface of the conductor loop 260 is reduced, an induced electromotive force generated in the conductor loop 260 is reduced in an amount corresponding to the reduction of the peak. Specifically, in any case of the layouts shown in FIG. 7 to FIG. 10, it is possible to reduce the noise generated in the conductor loop 260 by changing the conductor loop width $W_{LOOP}$ more than that in the example shown in FIG. 6.

Figure 17:
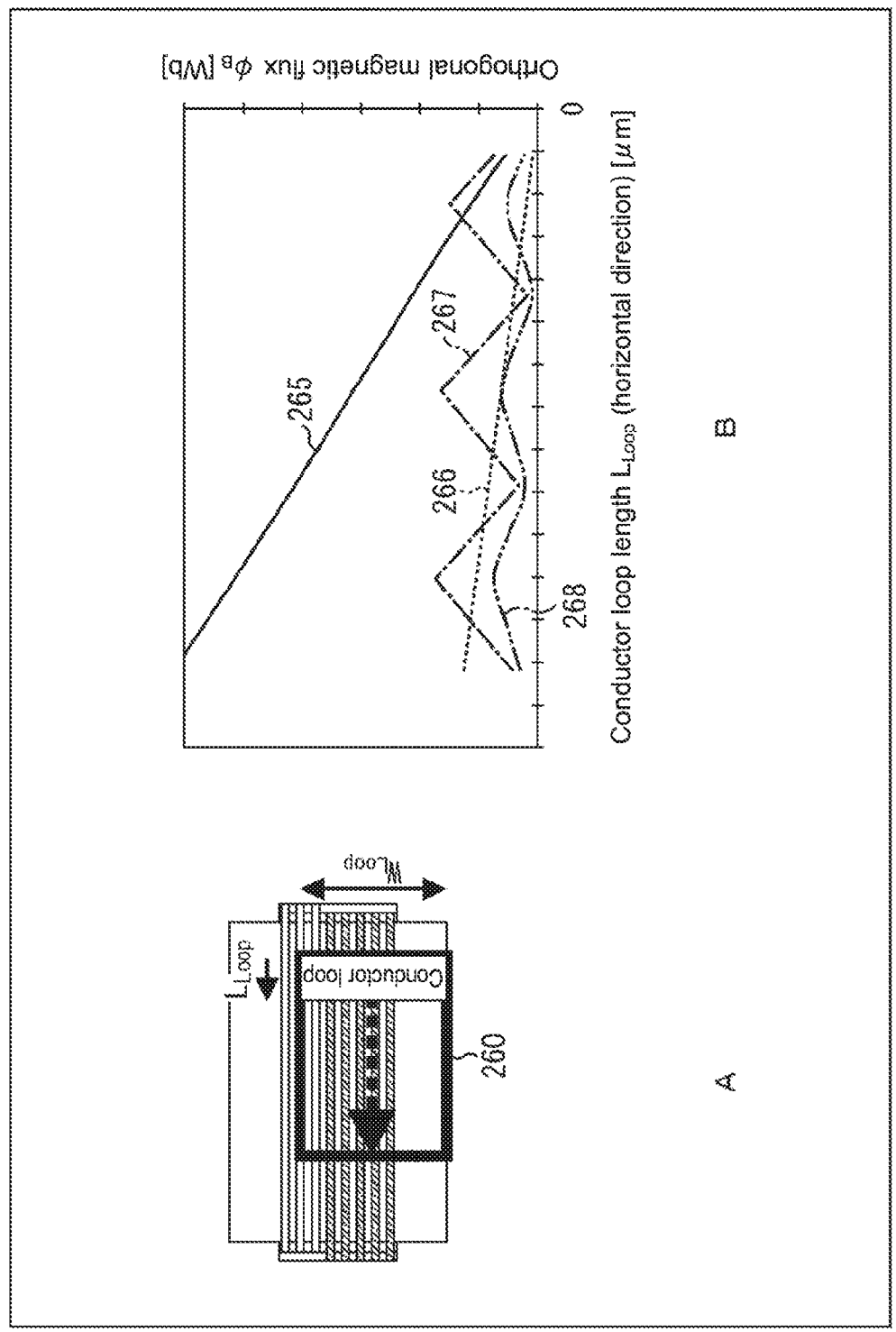
FIG. 17 A diagram showing a comparative example of a change in magnetic fluxes due to a change in the conductor loop length.

Next, as shown in part A of FIG. 17, magnetic fluxes depending on the conductor loop length $L_{LOOP}$ of the conductor loop 260 will be compared with each other, As shown in part A of FIG. 17, the changes in magnetic fluxes that pass through the loop surface of the conductor loop 260 in the power supply wirings in the layout examples shown in FIG. 6, FIG. 7, FIG. 9, and FIG. 10 depending on the conductor loop length $L_{LOOP}$ are compared with each other. For each of the layout example shown in FIG. 6, FIG. 7, FIG. 9, and FIG. 10, the magnetic flux that passes through the loop surface of the conductor loop 260 is calculated by using the above-mentioned equation (1), and the calculation results are shown in the graph of part B of FIG. 17.

That is, in the graph shown in part B of FIG. 17, a solid line 265 represents the change in the magnetic flux in the power supply wiring in the layout example of FIG. 6 depending on the conductor loop length $L_{LOOP}$. Dotted lines 266 represent the change in the magnetic flux in the power supply wiring in the layout example of FIG. 7 depending on the conductor loop length $L_{LOOP}$. An alternate long and short dash line 267 represents the change in the magnetic flux in the power supply wiring in the layout example of FIG. 9 depending on the conductor loop length $L_{LOOP}$. An alternate long and two short dashes line 268 represents the change in the magnetic flux in the power supply wiring in the layout example of FIG. 10 depending on the conductor loop length $L_{LOOP}$.

As shown in part B of FIG. 17, peak values of the dotted lines 266, the alternate long and short dash line 267, and the alternate long and two short dashes line 268 are reduced more than that of the solid line 265.

Note that the layout shown in FIG. 8 is basically similar to the layout shown in FIG. 7, and the peak of the magnetic field intensity distribution in FIG. 6 is reduced more than that in FIG. 7 as described above. Therefore, because it is obvious that the peak of the magnetic flux that passes through the loop surface of the conductor loop 260 can be reduced at least more than that in the case of the layout of FIG. 7, description thereof will be omitted.

As described above, in any case of the layouts shown in FIG. 7 to FIG. 10, it is possible to reduce the peak of the magnetic flux that passes through the loop surface of the conductor loop 260 more than that in the case of the example shown in FIG. 6. When the peak of the magnetic flux that passes through the loop surface of the conductor loop 260 is reduced, an induced electromotive force generated in the conductor loop 260 is reduced in an amount corresponding to the reduction of the peak. Specifically, in any case of the layouts shown in FIG. 7 to FIG. 10, it is possible to reduce the noise generated in the conductor loop 260 by changing the conductor loop length $L_{LOOP}$ more than that in the example shown in FIG. 6.

That is, by applying any of the layout examples described with reference to FIG. 7 to FIG. 10 as the layout of the power supply wirings formed in the digital processing unit 112 or the digital processing unit 113, the image sensor 100 is capable of reducing the noise generated in a pixel signal due to the change in the conductor loop and suppressing generation of striped image noise in a picked-up image. That is, it is possible to suppress the reduction in image quality of a picked-up image As described above, as shown in the power supply wirings of FIG. 7 or FIG. 8, for example, one or more conductors may be formed between a plurality of other conductors as a plurality of conductors that are each formed at a position where an induced electromotive force is generated by the magnetic field generated thereby in the conductor loop whose dimensions can be varied and have a structure that suppresses the change in the induced electromotive force generated by the change in dimensions of the conductor loop, and the orientations of current flowing through at least a part of the one or more conductors may be different from the orientations of current flowing through the other conductors.

Further, as shown in the power supply wirings of the example of FIG. 7, it may include a conductor pair of two conductors adjacent in the layered direction, in which the orientations of current flowing through the two conductors are the same. For example, in the case of the layout shown in FIG. 7, in a conductor pair of the power supply wiring (VDD) 161 and the power supply wiring (VDD) 163 or the power supply wiring (VSS) 162 and the power supply wiring (VSS) 164, the orientations of current flowing through the conductors are the same.

Alternatively, as shown in the power supply wirings of the examples of FIG. 8 to FIG. 10, it may include a conductor pair of two conductors adjacent in the layered direction, in which the orientations of current flowing through the two conductors are at least partially different from each other. For example, in the case of the layout shown in FIG. 8, in a conductor pair of the power supply wiring (VDD) 161 and the power supply wiring (VSS) 164 or the power supply wiring (VSS) 162 and the power supply wiring (VDD) 163, the orientations of current flowing through the conductors are at least partially different from each other. Further, as shown in the power supply wirings of the example of FIG. 8, the orientation of current flowing through each conductor of the conductor pair and the orientation of current flowing through another conductor adjacent to each conductor of the conductor pair in the layered direction may be at least partially different from each other.

Alternatively, as shown in the example of FIG. 9 or FIG. 10, the conductor pair may have a periodic structure in which the shape thereof is periodically changed in the longitudinal direction, and the direction of the line of magnetic force generated by the conductor pair may be changed for every half period of the periodic structure. In the case of the example of FIG. 9 or FIG. 10, at least a part of the power supply wiring in each layer has a meander shape, and thus, the conductor pair itself has a periodic structure in which the conductors are superimposed one another or apart from each other. Then, for every half period of the periodic structure, the direction of the line of magnetic force (polarity of magnetic flux) is inverted.

Further, as shown in the example of FIG. 10, it may include a plurality of conductor pairs, and the origin position of the periodic structure of one conductor pair may differ from an origin position of the periodic structure of the adjacent conductor pair. For example, in the case of the layout shown in FIG. 10, the position of the origin position of the periodic structure in each conductor pair in the longitudinal direction of the conductor pair is displaced.

Note that as shown in part B of FIG. 16 and part B of FIG. 17, the layout shown in FIG. 10 can reduce the peak of the magnetic flux more than the case of the layout shown in FIG. 9.

Figure 18:
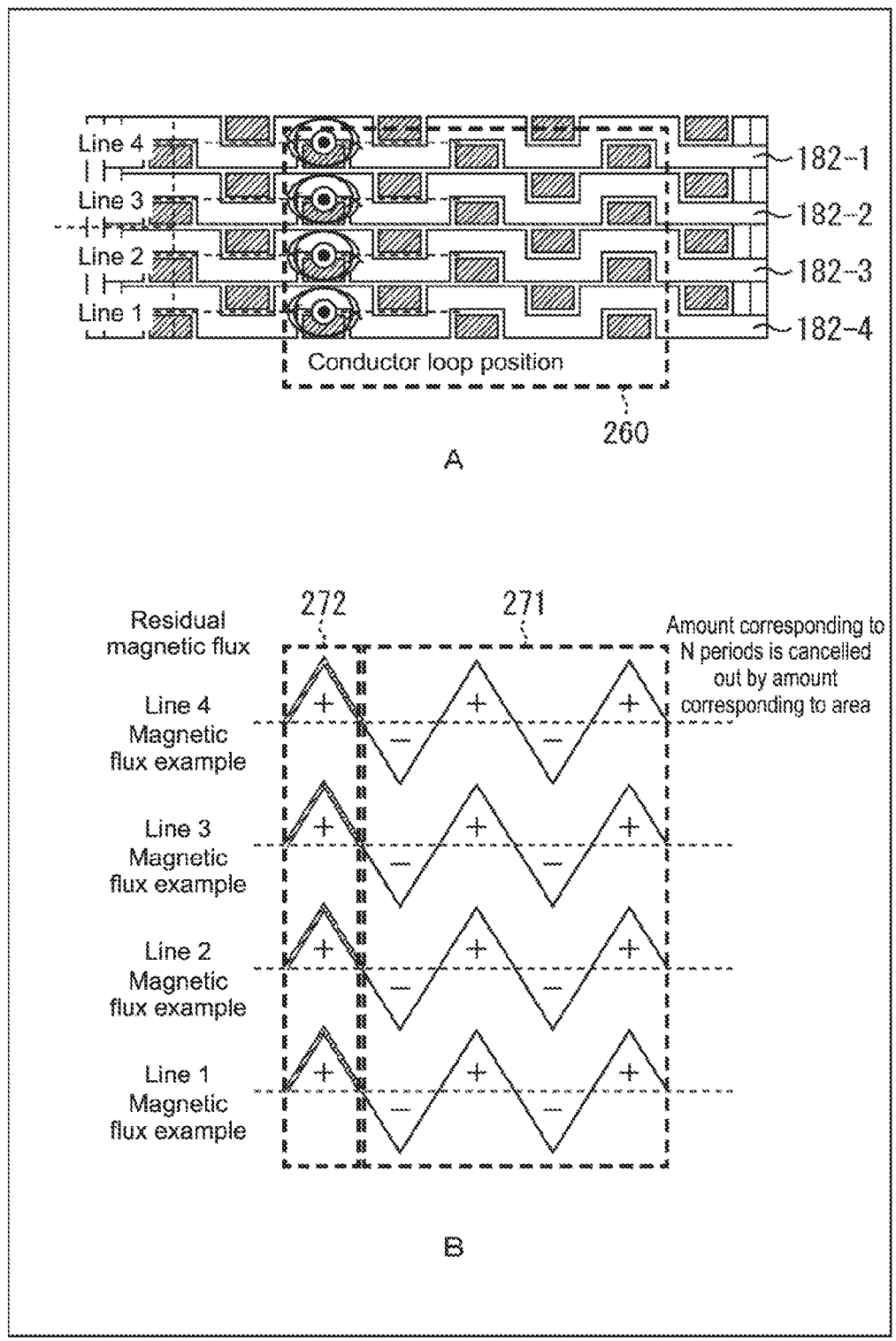
FIG. 18 A diagram describing an example of residual magnetic fluxes.

In the case of the layout example of FIG. 9, although the magnetic flux is high in a portion of the periodic structure of the conductor pair in which conductors are apart from each other, the position of the portion in the longitudinal direction is similar between the conductor pairs as shown in part A of FIG. 18. As shown in part B of FIG. 18, because the orientation of the magnetic flux is changed for every half period of the periodic structure, the magnetic flux generated in a portion 271 corresponding to N periods (N represents an integer) is canceled out, and a magnetic flux generated in a remaining portion 272 is the residual magnetic flux.

Figure 19:
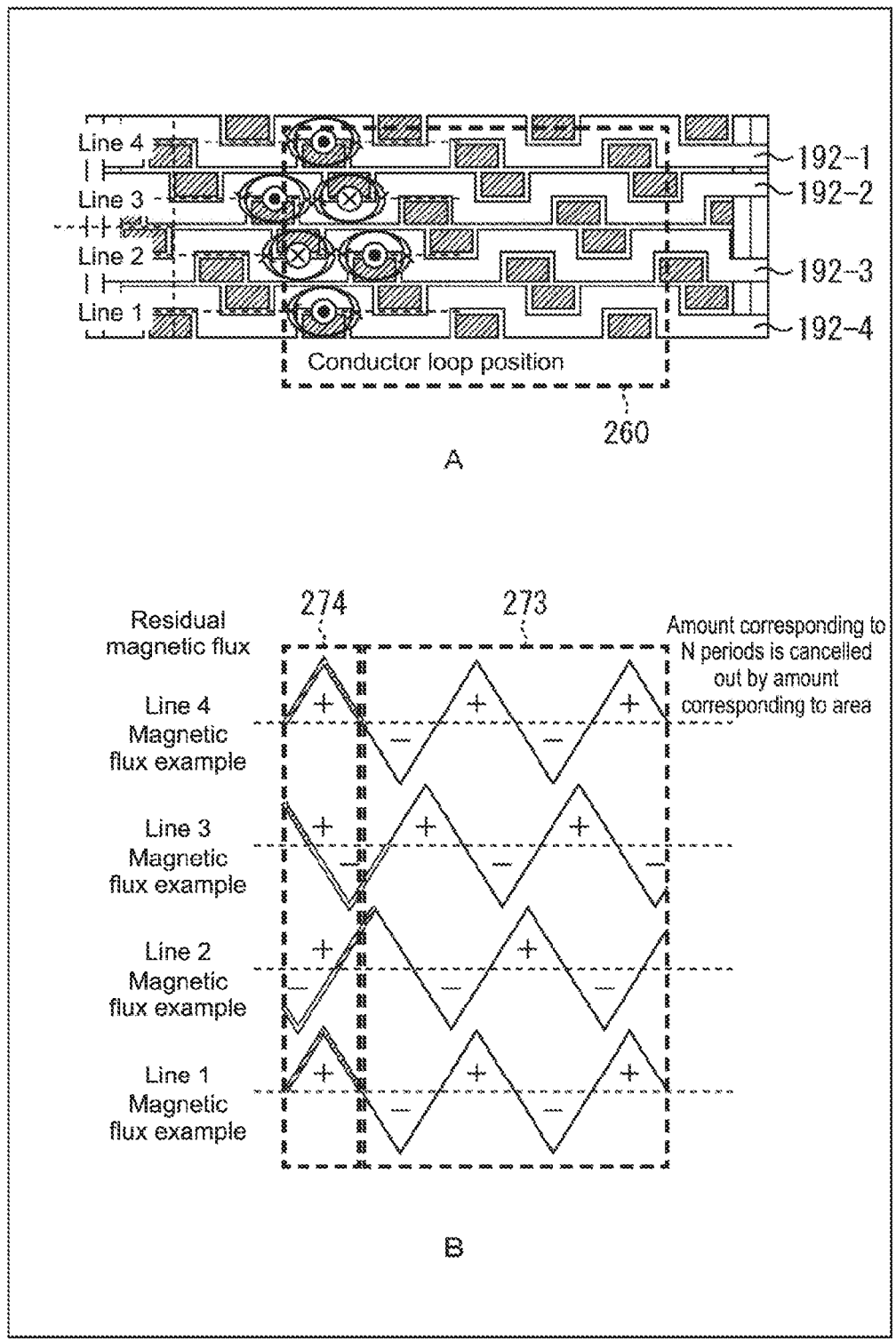
FIG. 19 A diagram describing an example of residual magnetic

On the other hand, in the case of the layout example of FIG. 10, the portion of the periodic structure of each conductor pair at which the magnetic flux is high in the longitudinal direction of the conductor pair is displaced for each conductor pair as shown in part A of FIG. 19. For that reason, as shown in part B of FIG. 19, the magnetic flux generated in a portion 273 corresponding to N periods (N represents an integer) is cancelled out, and also a part of the magnetic flux generated in a remaining portion 274 is cancelled out because the magnetic flux having an opposite polarity is generated in the remaining portion 274. The peak of the magnetic flux is reduced in that amount. Therefore, the layout example shown in FIG. 10 can suppress generation of noise in a conductor loop, which is caused due to a change in the conductor loop, as compared with the case of the layout example of FIG. 9. That is, the image sensor 100 is capable of suppressing the reduction in image quality of a picked-up image by applying the layout shown in FIG. 10 as the layout of the power supply wirings formed in the digital processing unit 112 or the digital processing unit 113, as compared with the case where the layout shown in FIG. 9 is applied.

(Comparison of Shift Amount)

Figure 20:
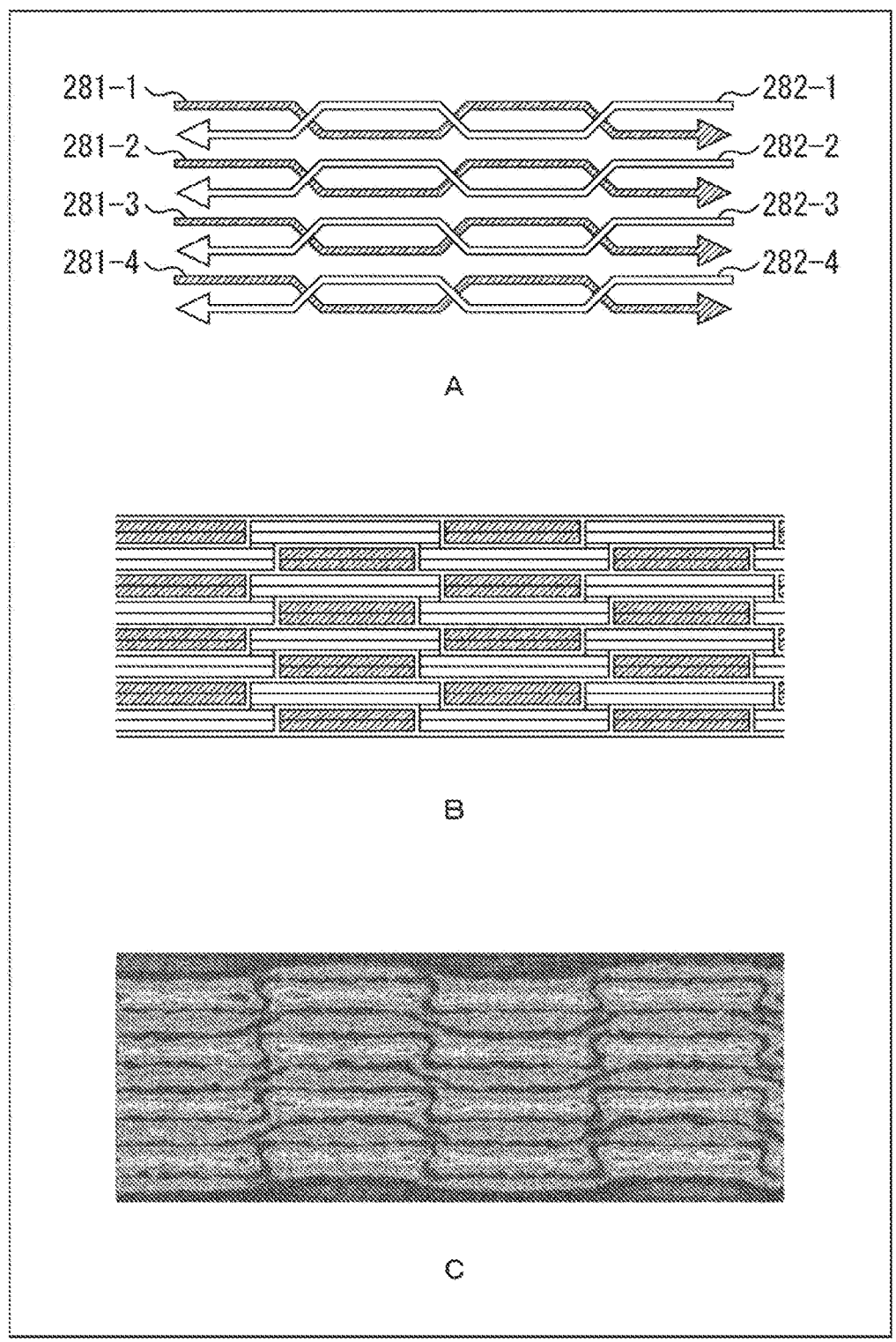
FIG. 20 A diagram showing a comparative example of the shift amount and the magnetic field intensity.

The shift amount of the periodic structure between such conductor pairs will be considered. FIG. 20 is a diagram describing the case where the shift amount is 0. Part A of FIG. 20 schematically shows the state of the layout of the power supply wirings. A power supply wiring (VDD) 281-1 to a power supply wiring (VDD) 281-4 and a power supply wiring (VSS) 282-1 to a power supply wiring (VSS) 282-4 each form a conductor pair, and current flows through the power supply wiring in a direction shown by an arrow. In the case of this example, the position of the periodic structure of each conductor pair in the longitudinal direction of the conductor pair is similar between the conductor pairs. These power supply wirings are actually arranged as shown in part B of FIG. 20. Therefore, the magnetic field intensity distribution is as shown in part C of FIG. 20.

Figure 21:
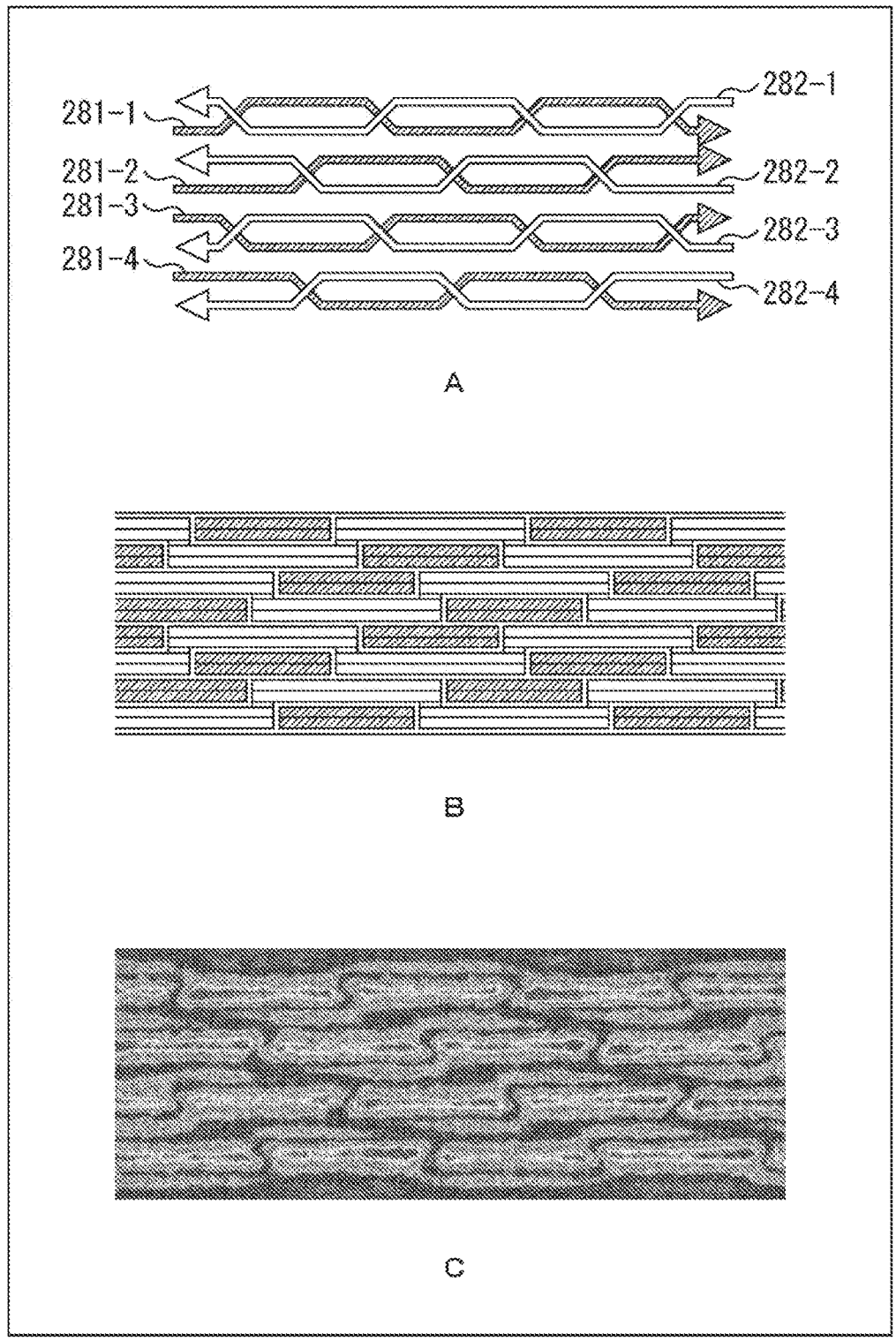
FIG. 21 A diagram showing a comparative example of the shift amount and the magnetic field intensity.

FIG. 21 is a diagram describing the case where the shift amount is one-fourth of the period of the periodic structure. Part A of FIG. 21 schematically shows the state of the layout of the power supply wirings. In the case of this example, the position of the periodic structure of each conductor pair in the longitudinal direction of the conductor pair is displaced is the amount corresponding to one-fourth of the period of the periodic structure. These power supply wirings are actually arranged as shown in part B of FIG. 21. Therefore, the magnetic field intensity distribution is as shown in part C of FIG. 21.

Figure 22:
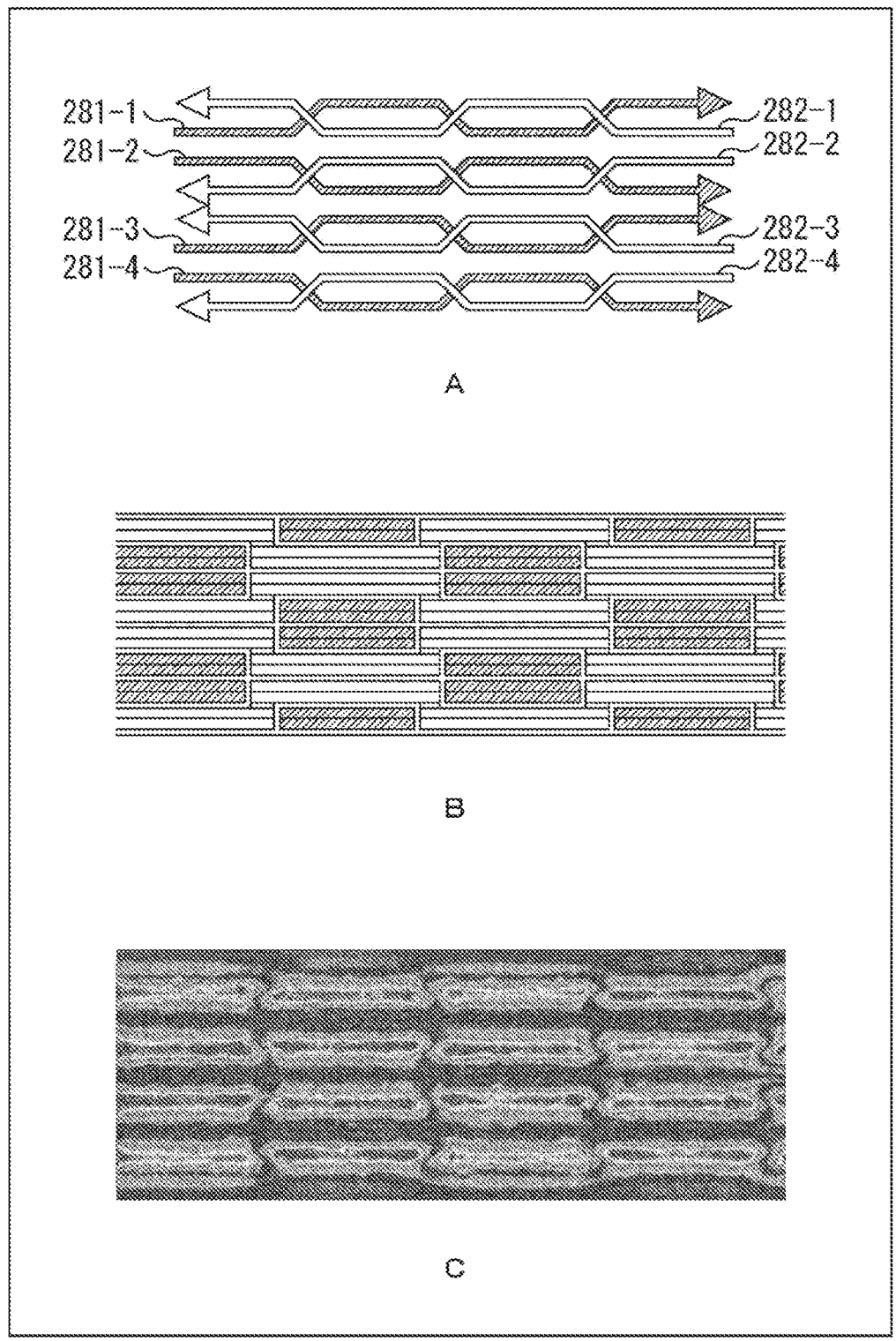
FIG. 22 A diagram showing a comparative example of the shift amount and the magnetic field intensity.

FIG. 22 is a diagram describing the case where the shift amount is one-second of the period of the periodic structure. Part A of FIG. 22 schematically shows the state of the layout of the power supply wirings. In the case of this example, the position of the periodic structure of each conductor pair in the longitudinal direction of the conductor pair is displaced in the amount corresponding to one-second of the period of the periodic structure. These power supply wirings are actually arranged as shown in part B of FIG. 22. Therefore, the magnetic field intensity distribution is as shown in part C of FIG. 22.

In the case where the distance between conductor pairs is sufficiently large, the shift amount is desired to be one-second of the period of the periodic structure. However, it is actually difficult to ensure such wiring intervals because of limitation of the layout. For that reason, the magnetic field intensity distribution is as shown in part C of FIG. 20, part C of FIG. 21, and part C FIG. 22, and the magnetic field concentrates in the vicinity of the center of the conductor pair as the shift amount becomes larger.

Figure 23:
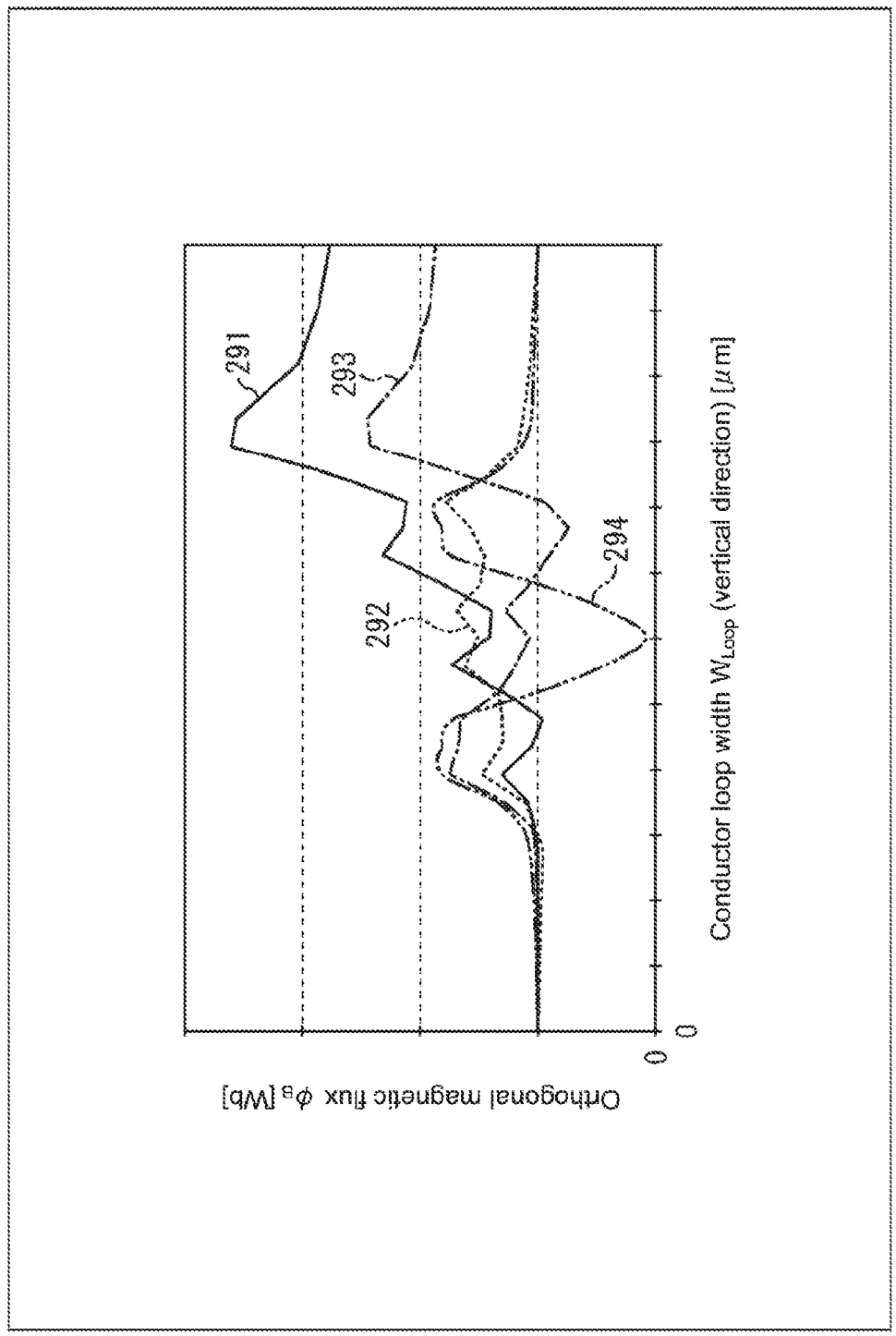
FIG. 23 A diagram showing a comparative example of the change in magnetic fluxes generated by the change in the conductor loop width, FIG. 24 A diagram showing a comparative example of a change in magnetic fluxes due to a change in the conductor loop.

FIG. 23 is a graph showing the comparison results obtained by comparing the change in the magnetic flux caused due to a change in the conductor loop width $W_{LOOP}$ of the conductor loop for each shift amount. In the graph of FIG. 23, a solid line 291 represents the change in the magnetic flux in the case where the shift amount is 0. Further, dotted lines 292 represent the change in the magnetic flux in the case where the shift amount is two-twelfth of the period of the periodic structure. Further, an alternate long and short dash line 293 represents the change in the magnetic flux in the case where the shift amount is four-twelfth of the period of the periodic structure. Further, an alternate long and two short dashes line 294 represents the change in the magnetic flux in the case where the shift amount is six-twelfth of the period of the periodic structure.

As shown in FIG. 23, the change amount of the magnetic flux is the largest in the case of the solid line 291. Other than that, the larger the shift amount is, the larger the change amount of the magnetic flux is. This is because the magnetic field intensity becomes locally higher as the shift amount becomes larger as described above.

It should be noted that as described above, it is possible to reduce the noise generated in the conductor loop 260 due to the change in the conductor loop width $W_{LOOP}$ by at least making the shift amount be equal to or less than one-second of the period of the periodic structure, as compared with the case where the shift amount is 0.

Note that the amount of change in the magnetic flux due to the change in dimensions of the conductor loop is not determined only by the shift amount of the periodic structure between conductor pairs, and is affected also by other various factors. Therefore, the shift amount is desired to have an optimal value depending on the actual layout. How to calculate the optimal value can be arbitrarily determined. For example, it may be possible to determine the optimal shift amount by changing the conductor loop width $W_{LOOP}$ of the conductor loop, searching for the maximum magnetic flux point, and changing the conductor loop length $L_{LOOP}$ of the conductor loop at the maximum magnetic flux point.

Figure 24:
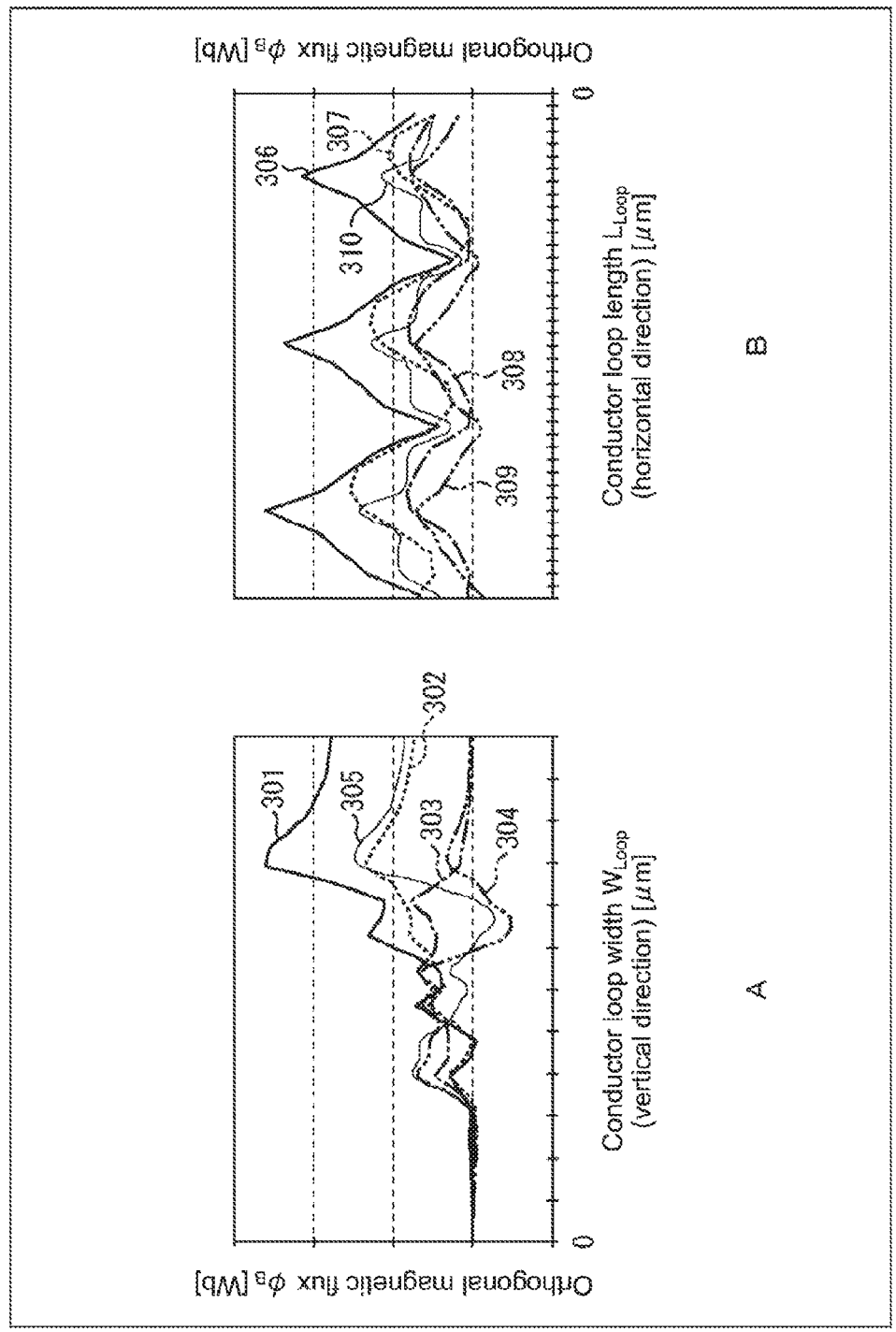

For example, first, the conductor loop length $L_{LOOP}$ of the conductor loop is temporarily set to a predetermined length, and the change in the magnetic flux caused due to the change in the conductor loop width $W_{LOOP}$ in the conductor loop length $L_{LOOP}$ is calculated for each shift amount. Part A of FIG. 24 is an example of a graph showing the comparison results obtained by comparing the thus-obtained change in the magnetic flux caused due to a change in the conductor loop width $W_{LOOP}$ of the conductor loop for each shift amount. In part A of FIG. 24, a thick line 301 represents the change in the magnetic flux in the case where the shift amount is 0. Dotted lines 302 represent the change in the magnetic flux in the case where the shift amount is one-twelfth of the period of the periodic structure. An alternate long and short dash line 303 represents the change in the magnetic flux in the case where the shift amount is two-twelfth of the period of the periodic structure. An alternate long and two short dashes line 304 represents the change in the magnetic flux in the case where the shift amount is three-twelfth of the period of the periodic structure. A fine line 305 represents the change in the magnetic flux in the case where the shift amount is four-twelfth of the period of the periodic structure.

Next, on the basis of such a graph, the conductor loop width $W_{LOOP}$ in which the maximum magnetic flux is obtained is searched for as the maximum magnetic flux point, and the change in the magnetic flux caused due to the change in the conductor loop length $L_{LOOP}$ at the maximum magnetic flux point (i.e., the conductor loop width $W_{LOOP}$ in which the maximum magnetic flux is obtained) is calculated.

Part B of FIG. 24 is an example of a graph showing the comparison results obtained by comparing the thus-obtained change in the magnetic flux caused due to a change in the conductor loop length $L_{LOOP}$ of the conductor loop for each shift amount. In part B of FIG. 24, a thick line 306 represents the change in the magnetic flux in the case where the shift amount is 0. Dotted lines 307 represent the change in the magnetic flux in the case where the shift amount is one-twelfth of the period of the periodic structure. An alternate long and short dash line 308 represents the change in the magnetic flux in the case where the shift amount is two-twelfth of the period of the periodic structure. An alternate long and two short, dashes line 309 represents the change in the magnetic flux in the case where the shift amount is three-twelfth of the period of the periodic structure. A fine line 310 represents the change in the magnetic flux in the case where the shift amount is four-twelfth of the period of the periodic structure.

Then, on the basis of such a graph, it only has to determine the shift amount in which the magnetic flux is reduced more. By calculating the shift amount in this way, it is possible to make the magnetic flux cancelling effect larger and suppress generation of noise in a conductor loop, which is caused due to a change in the conductor loop. That is, the image sensor 100 is capable of suppressing the reduction in image quality of a picked-up image by calculating the shift amount in this way.

Figure 25:
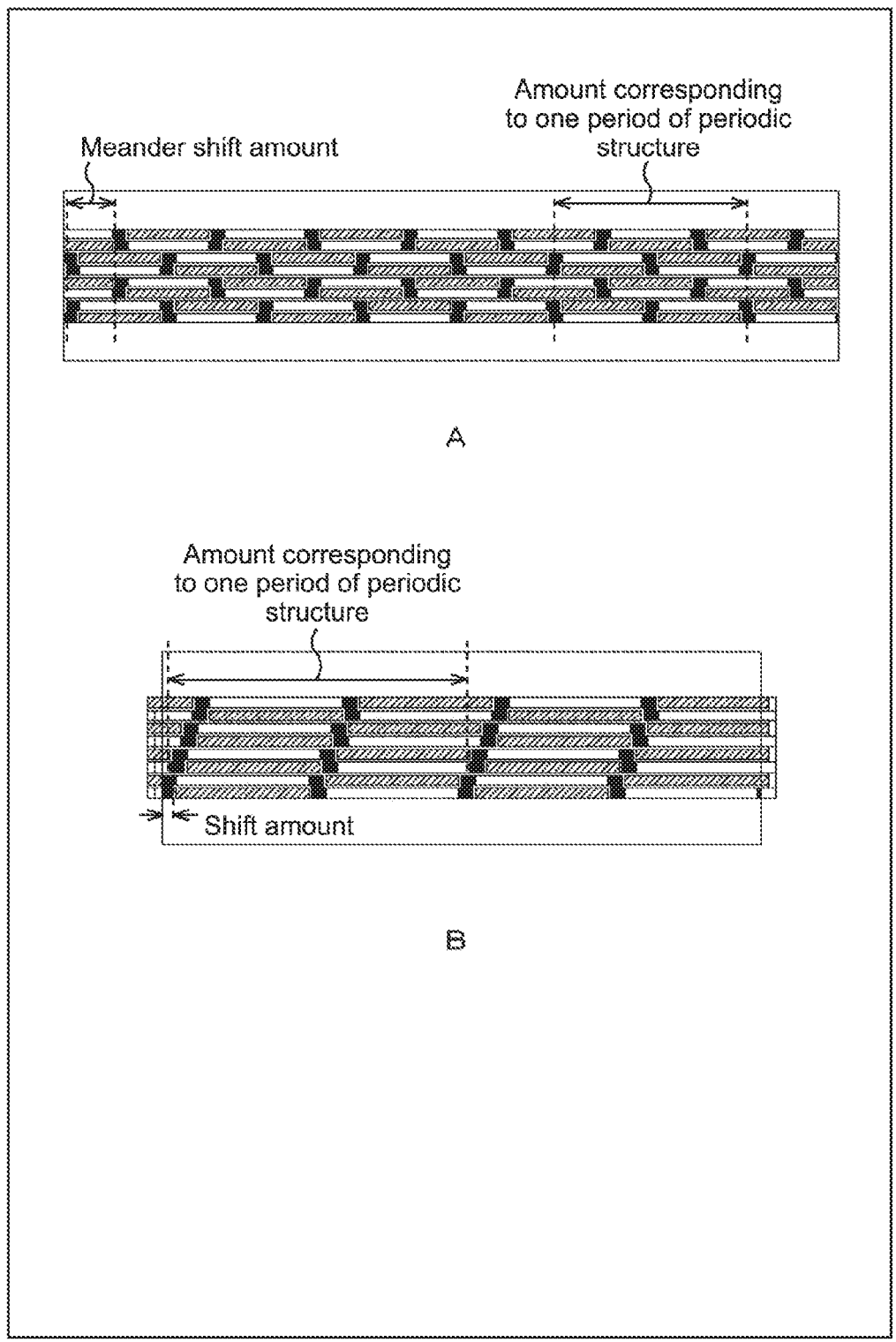
FIG. 25 A diagram describing an example of the shift amount of a periodic structure.

Note that in general, the shift amount is often desired to be approximately one-sixth of the period of the periodic structure as shown in the example of part A of FIG. 25.

Further, in the case where chips are stacked as in the image sensor 100, it needs to take into account the electrostatic capacitance between the chips, and it is not desirable to make the shift amount larger in most cases. In such a case, the shift amount may be approximately the wiring width of each power supply wiring as shown in the example of part B of FIG. 25, for example.

(Conductor Pair)

The structure of the above-mentioned conductor pair is not limited to the above-mentioned example. FIG. 26 to FIG. 30 each represent examples of the conductor pair. In FIG. 26 to FIG. 30, a conductor pair 321 to a conductor pair 324 each include the power supply wiring (VDD) and the power supply wiring (VSS), and each have a periodic structure.

The period length (the length of one period of the conductor pair in the longitudinal direction) of the periodic structure of the conductor pair can be arbitrarily determined. For example, as shown in part A of FIG. 26, the period length of the periodic structure may be the same in a plurality of conductor pairs. Further, the period length of the periodic structure of all conductor pairs formed in the digital processing unit 112 or the digital processing unit 113 may be the same.

Figure 26:
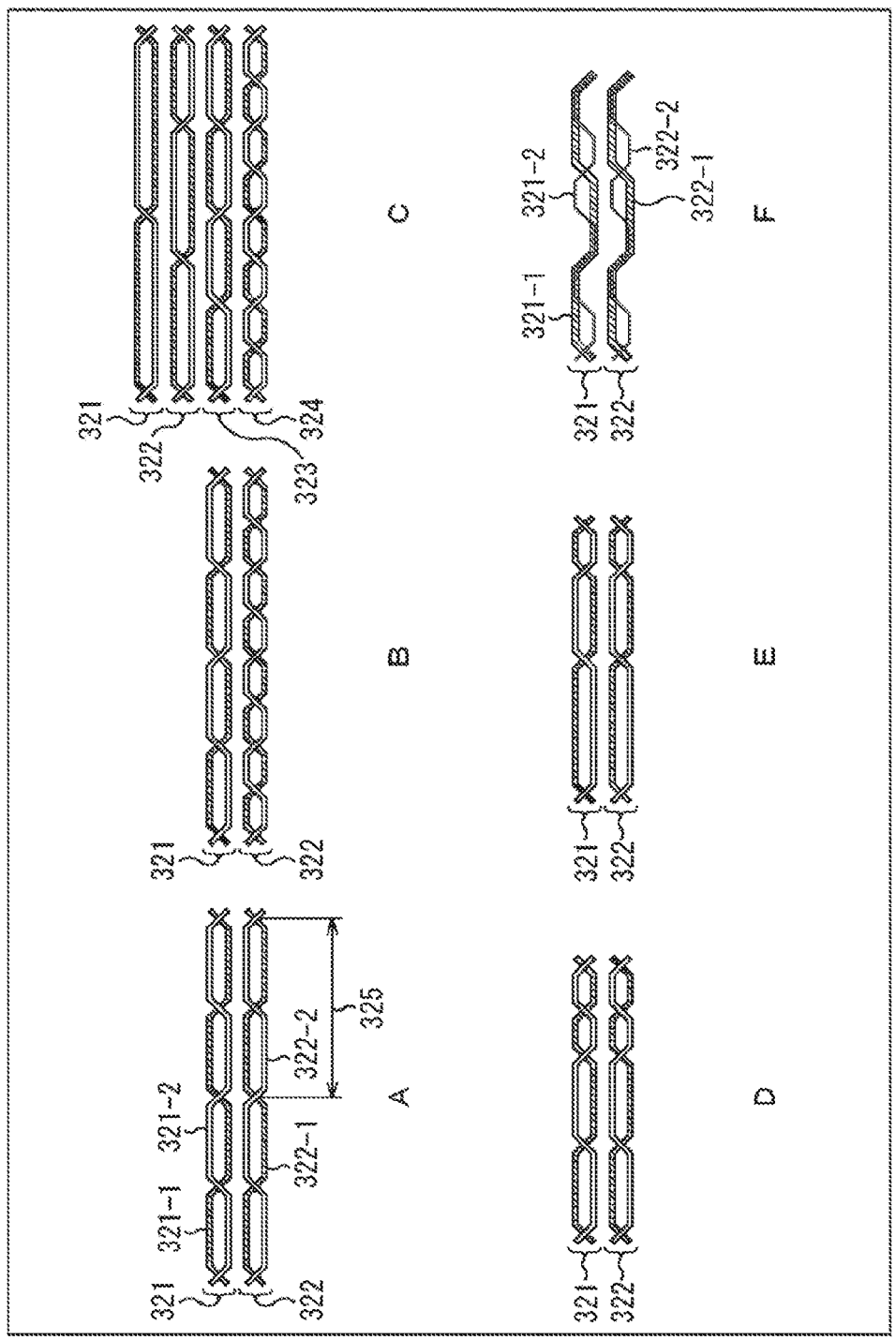
FIG. 26 A diagram describing a configuration example of a conductor pair.

In part A of FIG. 26, the conductor pair 321 includes a power supply wiring (VDD) 321-1 having a meander shape and a power supply wiring (VSS) 321-2 having a meander shape, and the power supply wirings form the periodic structure. Further, the conductor pair 322 includes a power supply wiring (VDD) 322-1 having a meander shape and a power supply wiring (VSS) 322-2 having a meander shape, and the power supply wirings form the periodic structure. As shown by a double-headed arrow 325, the period length of the periodic structure of the conductor pair 321 and the period length of the periodic structure of the conductor pair 322 are the same.

Further, as shown in the example of part B of FIG. 26 or part C of FIG. 26, the period length of the periodic structure may differ in a plurality of conductor pairs. That is, the period length of the periodic structure of at least one conductor pair may be different from the period length of the periodic structure of another conductor pair.

For example, as shown in part B of FIG. 26, the period length of the periodic structure may differ in the adjacent conductor pairs 321 and 322. The same shall apply to the case where the number of conductor pairs is three or more. For example, in the case where there are the conductor pair 321 to the conductor pair 324 as shown in part C of FIG. 26, the period length of the periodic structure may differ. It goes without saying that although the period length of the periodic structure of the conductor pair may differ as shown in this example, some conductor pairs may have the same period length as that of another conductor pair (that is, the number of period lengths may be lower than that of conductor pairs).

Further, as shown in the example of part D of FIG. 26 or part E of FIG. 26, the period length may be changed in the conductor pair. That is, a part of the periodic structure of the conductor pair may have a period length different from that of another part of the periodic structure of the conductor pair.

For example, as shown in the conductor pair 321 or the conductor pair 322 of part D of FIG. 26, the periodic structure of a single conductor pair may have two kinds of period lengths. Further, as shown in the conductor pair 321 or the conductor pair 322 of part E of FIG. 26, for example, the periodic structure of a single conductor pair may have three or more kinds of period lengths.

Further, as shown in the example of part F of FIG. 26, the period length of the periodic structure of the conductors (the power supply wirings) forming the conductor pair may differ. For example, as shown in part F of FIG. 26, in the power supply wiring (VDD) 321-1 and the power supply wiring (VSS) 321-2 forming the conductor pair 321, the period length of the periodic structure may differ.

Further, in the case where there are a plurality of conductor pairs, the period length of the periodic structure of each conductor may differ in ail conductor pairs. For example, in the case where there are the conductor pair 321 and the conductor pair 322 as shown in part F of FIG. 26, the period length of the periodic structure of each power supply wiring may differ in the conductor pair 321 as described above, and also the period length of the periodic structure of the power supply wiring (VDD) 322-1 and the power supply wiring (VSS) 322-2 may differ in the conductor pair 322.

It goes without saying that there may be a conductor pair including conductors having a different period length of the periodic structure and a conductor pair including conductors having the same period length of the periodic structure.

The shift amount or shift direction of the position of the periodic structure of the conductor pair in the longitudinal direction of the conductor pair can be arbitrarily determined. For example, as shown in the conductor pair 321 to the conductor pair 324 shown in part A of FIG. 27 or part B of FIG. 27, the shift amount and shift direction of the position of the periodic structure may be the same in all conductor pairs. Note that the shift direction can be arbitrarily determined, and may be up/down/left/right or any combination thereof. For example, as shown in the example of part B of FIG. 27, it may be shifted in a direction opposite to that in the example of part A of FIG. 27.

Figure 27:
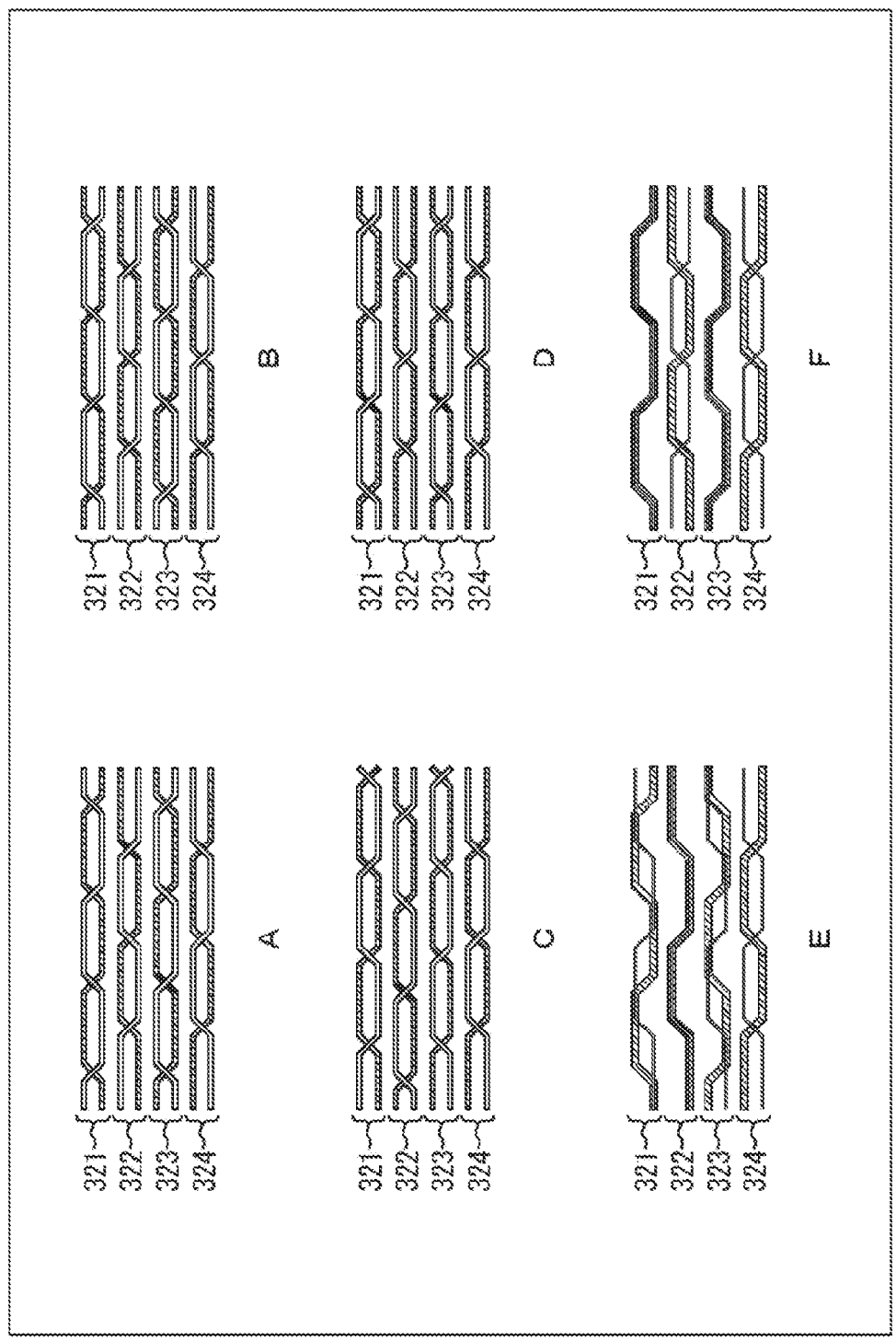
FIG. 27 A diagram describing a configuration example of the conductor pair.

Further, as shown in the example of part C of FIG. 27, the shift amount of the position of the periodic structure may be different for each set of conductor pairs. In the case of the example of part C of FIG. 27, the shift amount of the position of the periodic structure between the conductor pair 321 and the conductor pair 321 (that is, the relative position of the periodic structure of the conductor pair 322 in the longitudinal direction of the conductor pair 322 for the periodic structure of the conductor pair 321), the shift amount between the conductor pair 322 and the conductor pair 323 (that is, the relative position of the periodic structure of the conductor pair 323 in the longitudinal direction of the conductor pair 323 for the periodic structure of the conductor pair 322), and the shift amount between the conductor pair 323 and the conductor pair 324 (that is, the relative position of the periodic structure of the conductor pair 324 in the longitudinal direction of the conductor pair 324 for the periodic structure of the conductor pair 323) differ.

It goes without saying that the shift amount between some conductor pairs may be the same as the shift amount between other conductor pairs (that is, the number of shift amounts may be lower than the number of conductor pairs).

That is, the shift amount of the periodic structure between at least one set of conductor pairs may be different from the shift amount of the periodic structure between another set of conductor pairs.

The same shall apply to the shift direction. As shown in the example of part D of FIG. 27, the shift direction of the position of the periodic structure may be different for each set of conductor pairs. In the case of part C of FIG. 27, the shift direction of the periodic structure between the conductor pair 322 and the conductor pair 323 is substantially opposite to the shift direction of the periodic structure between the conductor pair 321 and the conductor pair 322 or the shift direction of the periodic structure between the conductor pair 323 and the conductor pair 324.

That is, the shift direction of the periodic structure between at least one set of conductor pairs may be different from the shift direction of the periodic structure between another set of conductor pairs.

It goes without saying that both of the shift amount and the shift direction may be changed for each set of conductor pairs. That is, the shift amount and shift direction of the periodic structure between at least one set of conductor pairs may be respectively different from the shift amount and shift direction of the periodic structure between another set of conductor pairs.

Note that as shown in part E of FIG. 27, the shift amount of the position of the periodic structure may be different for each conductor of the conductor pair. Further, as shown in part F of FIG. 27, the shift direction of the periodic structure may be different for each conductor of the conductor pair.

The periodic structure of the conductor par may have a meander shape or a twisted shape formed by two conductors, or a shape of a combination of the meander shape and the twisted shape.

Figure 28:
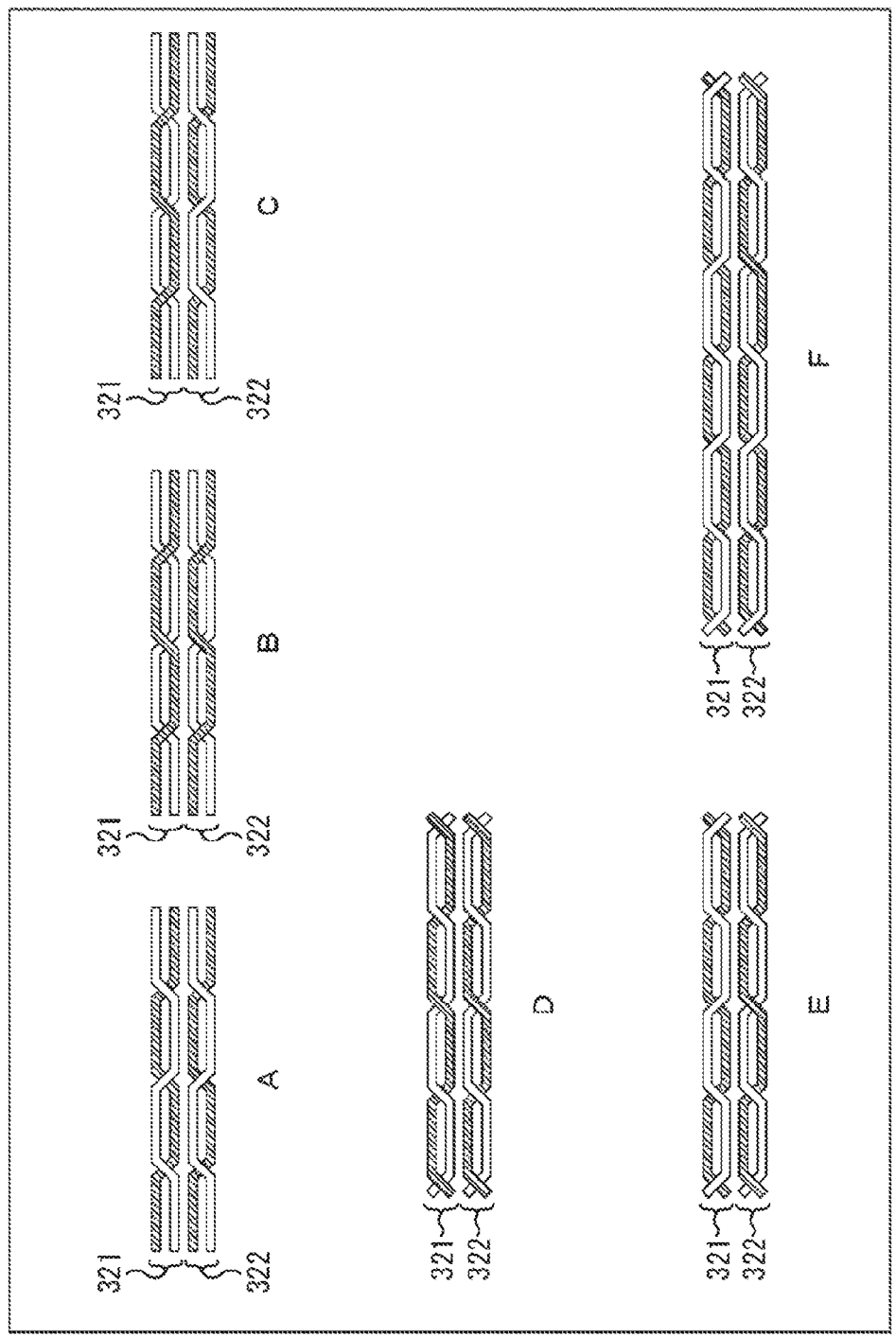
FIG. 28 A diagram describing a configuration example of the conductor pair.

For example, as shown in the conductor pair 321 or the conductor pair 322 shown in part A of FIG. 28, the conductor pair may include an upper power supply wiring (VSS) having a meander shape and a lower power supply wiring (VDD) having a meander shape.

Further, as shown in the conductor pair 321 or the conductor pair 322 shown in part B of FIG. 28, for example, the conductor pair may include an upper power supply wiring (VDD) having a meander shape and a lower power supply wiring (VSS) having a meander shape.

Further, as shown in the conductor pair 321 or the conductor pair 322 shown in part C of FIG. 28, for example, there may be a conductor pair including an upper power supply wiring (VDD) having a meander shape and a lower power supply wiring (VSS) having a meander shape and a conductor pair including an upper power supply wiring (VSS) having a meander shape and a lower power supply wiring (VDD) having a meander shape.

Further, as shown in the conductor pair 321 or the conductor pair 322 shown in part D of FIG. 28, for example, the conductor pair may include a power supply wiring (VDD) having a twisted shape and a power supply wiring (VSS) having a twisted shape that snake above and below one another.

Note that as shown in the conductor pair 321 or the conductor pair 322 shown in part E of FIG. 28, there may be a conductor pair including power supply wirings having a meander shape and a conductor pair including power supply wirings having a twisted shape.

Further, as shown in the conductor pair 321 or the conductor pair 322 shown in part E of FIG. 28, the conductor pair may include a power supply wiring including a portion having a meander shape and a portion having a twisted shape.

The direction of current flowing through each conductor of the conductor pair can be arbitrarily determined.

Figure 29:
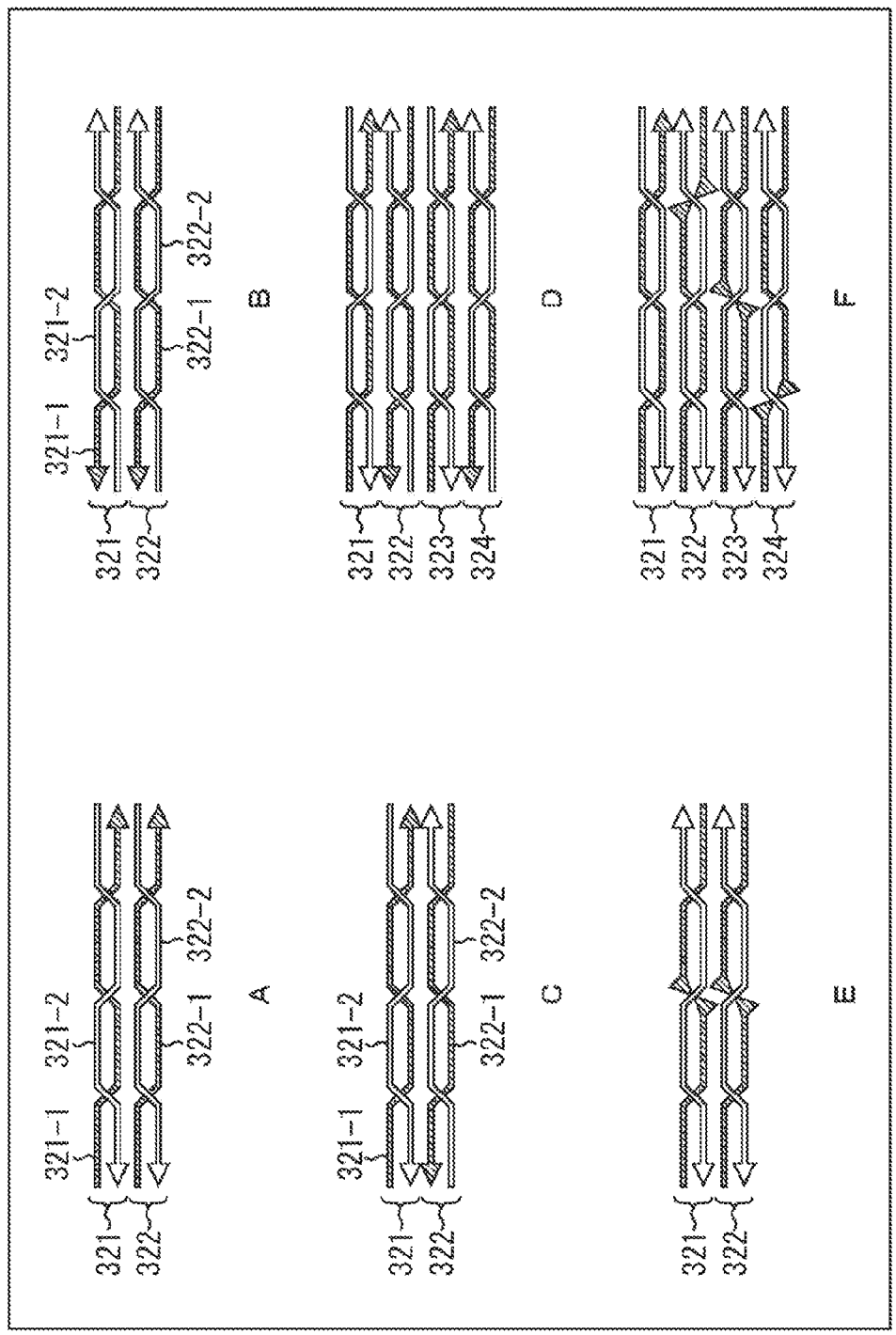
FIG. 29 A diagram describing a configuration example of the conductor pair.

For example, as shown in the conductor pair 321 or the conductor pair 322 shown in part A of FIG. 29 or part 13 of FIG. 29, the orientation of current flowing through each conductor may be the same in a plurality of conductor pairs. In this case, the orientation of current flowing through each conductor can be arbitrarily determined, and may be, for example, up/down/left/right or any combination thereof.

Further, as shown in the conductor pair 321 or the conductor pair 322 shown in part C of FIG. 29, for example, the orientation of current flowing through each conductor may differ (be substantially opposite to each other) in the adjacent conductor pairs. In the case of the example of part C of FIG. 29, the orientation of current flowing through the power supply wiring (VDD) 321-1 of the conductor pair 321 and the orientation of current flowing through the power supply wiring (VDD) 322-1 of the conductor pair 322 are substantially opposite to each other. Similarly, the orientation of current flowing through the power supply wiring (VSS) 321-2 of the conductor pair 321 and the orientation of current flowing through the power supply wiring (VSS) 322-2 of the conductor pair 322 are substantially opposite to each other.

Further, as shown in the conductor pair 321 to the conductor pair 324 shown in part D of FIG. 29, the orientation of current flowing through each conductor may be inverted for each adjacent conductor pair.

Further, as shown in the conductor pair 321 or the conductor pair 322 shown in part E of FIG. 29, the orientation of current may be changed in the conductor pair. That is, the orientation of current flowing through a part of each conductor of the conductor pair may be different from the orientation of current flowing through the other part of the conductor. Note that the position where the orientation of current is changed (position in the longitudinal direction of the conductor pair) can be arbitrarily determined. For example, as shown in the conductor pair 321 or the conductor pair 322 shown in part E of FIG. 29, the orientation of current may be changed at the same position in a plurality of conductor pairs. Alternatively, as shown in the conductor pair 321 to the conductor pair 324 shown in part F of FIG. 29, the position where the orientation of current is changed may be different for each conductor pair.

Figure 30:
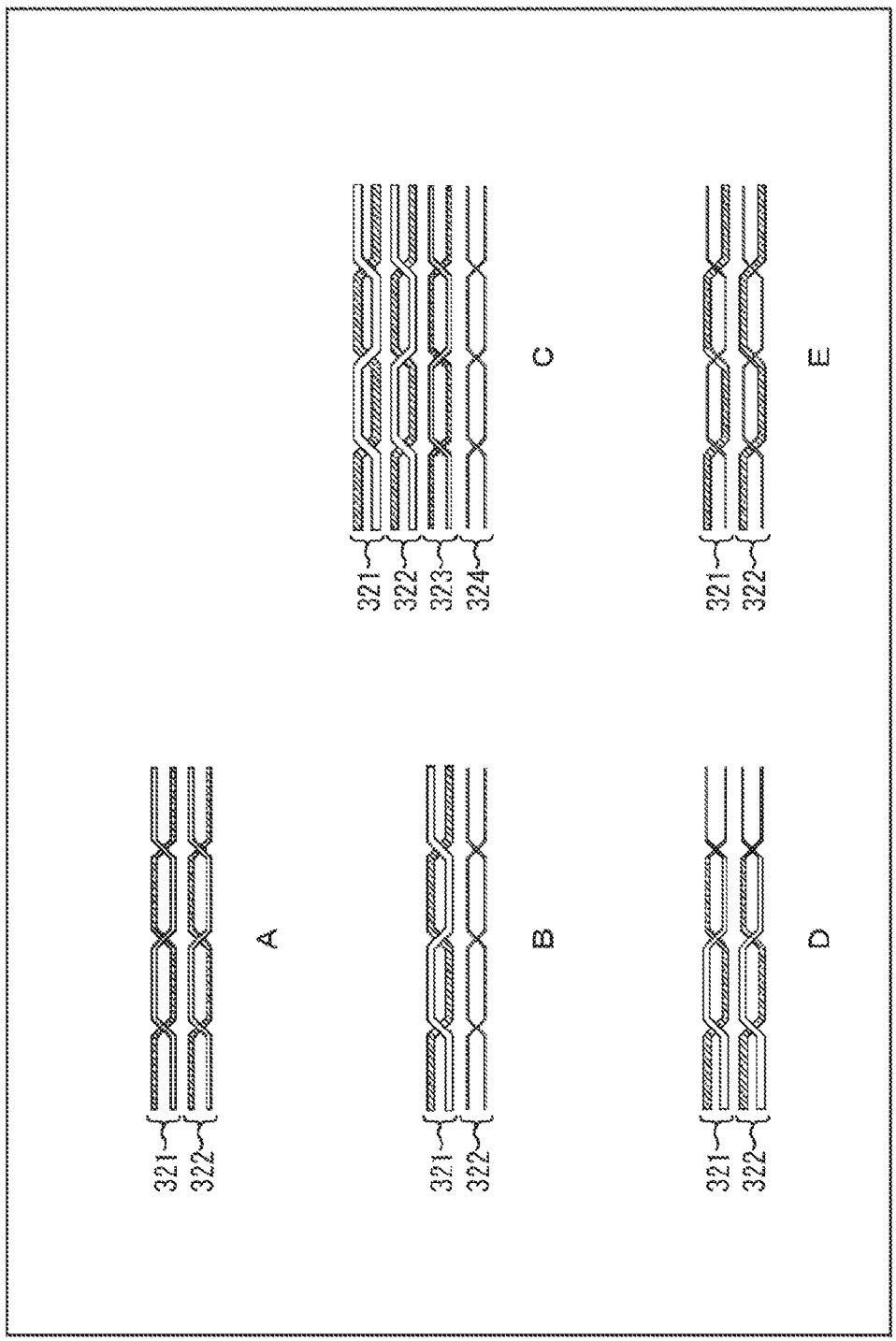
FIG. 30 A diagram describing a configuration example of the conductor pair.

Further, the amount of current flowing through each conductor (power supply wiring) of the conductor pair can be arbitrarily determined in FIG. 30, the amount of current flowing through each conductor is represented by the thickness of the conductor.

For example, as shown in the conductor pair 321 or the conductor pair 322 shown in part A of FIG. 30, the amount of current flowing through the conductors of the conductor pair may be constant. Further, in a plurality of conductor pairs, the amount of current flowing through each conductor may be constant. Further, in adjacent conductor pairs, the amount of current flowing through each conductor may be constant.

Further, as shown in the conductor pair 321 and the conductor pair 322 shown in part B of FIG. 30, the amount of current may be different for each conductor pair. For example, the amount of current may be different in adjacent conductor pairs. A part or whole of the plurality of conductor pairs may be a conductor pair in which the amount of current is different from that in another conductor pair. For example, as shown in the conductor pair 321 to the conductor pair 324 shown in part C of FIG. 30, the amount of current may differ. That is, the number of kinds of the amount of current may be three or more.

Further, as shown in the conductor pair 321 or the conductor pair 322 shown in part D of FIG. 30, the amount of current may be changed depending on the position in the conductor (position in the longitudinal direction of the conductor). Further, as shown in the conductor pair 321 or the conductor pair 322 shown in part E of FIG. 30, the amount of current flowing through the conductors constituting the conductor pair may differ.

(Light Blocking Wiring)

The conductor pair may include a light blocking wiring that suppresses light transmission in addition to the above-mentioned two conductors.

Figure 31:
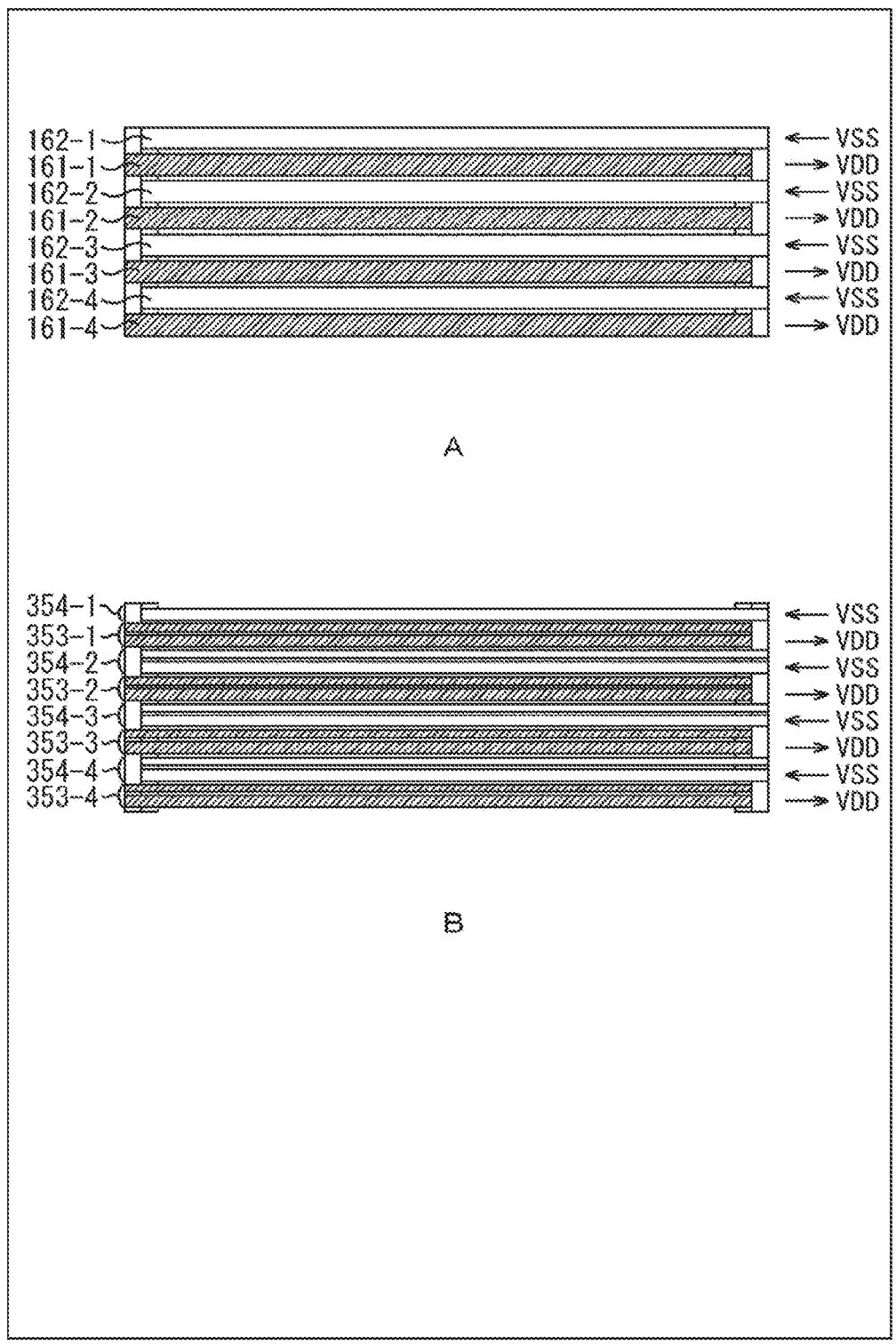
FIG. 31 A diagram showing an example of power supply wirings of the digital processing unit.

FIG. 31 is a diagram showing a layout example in the case where the power supply wiring includes a light blocking wiring in the layout example of FIG. 7

As shown in part A of FIG. 31, the layout in the upper layer (layer of the digital processing unit 112) is similar to part A of FIG. 7. The layout in the lower layer (layer of the digital processing unit 113) is shown in part B of FIG. 31. As shown in part B of FIG. 31, a power supply wiring (VDD) 353-1 to a power supply wiring 353-4 are formed by a plurality of conductors arranged to block light entering from the space of the power supply wiring in the upper layer. Similarly, a power supply wiring (VSS) 354-2 to a power supply wiring 354-4 are formed by a plurality of conductors arranged to block light entering from the space of the power supply wiring in the upper layer.

Also in the case of such a layout, it is possible to obtain effects similar to those in FIG. 7. It goes without saying that also in the case of the layout shown in FIG. 8, it may be possible to form light blocking wirings as shown in FIG. 31.

Figure 32:
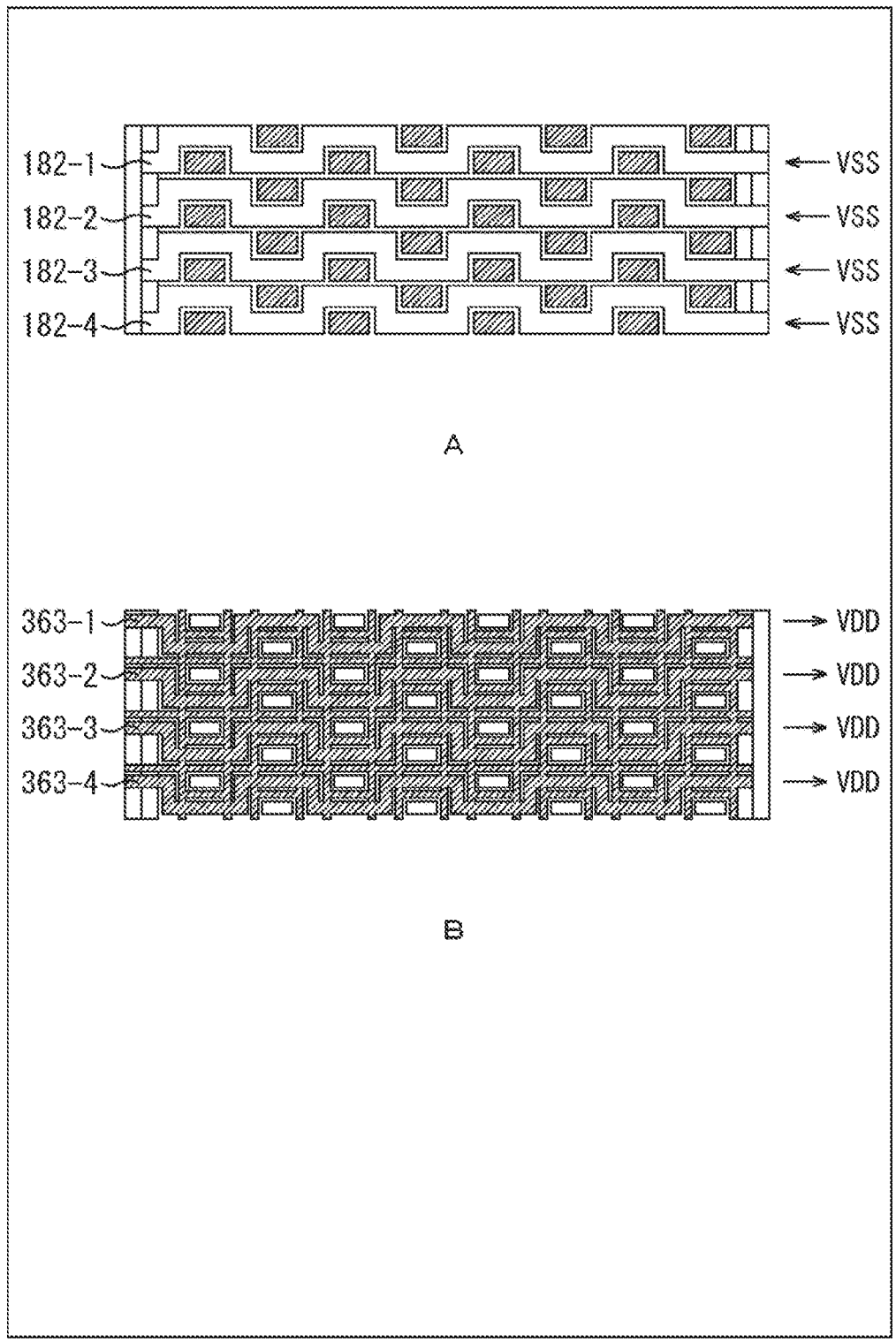
FIG. 32 A diagram showing an example of power supply wirings of the digital processing unit.

FIG. 32 is a diagram showing a layout example in the case where the power supply wiring includes a light blocking wiring in the layout example of FIG. 9. As shown in part A of FIG. 32, the layout in the layer (layer of the digital processing unit 112) is similar to part A of FIG. 9. The layout in the lower layer (layer of the digital processing unit 113) is shown in part B of FIG. 32. As shown in part B of FIG. 32, a power supply wiring (VDD) 363-1 has a structure that blocks light entering from the space of each power supply wiring (VSS) 182 in the upper layer. Also in the case of such a layout, it is possible to obtain effects similar to those in FIG. 9.

Figure 33:
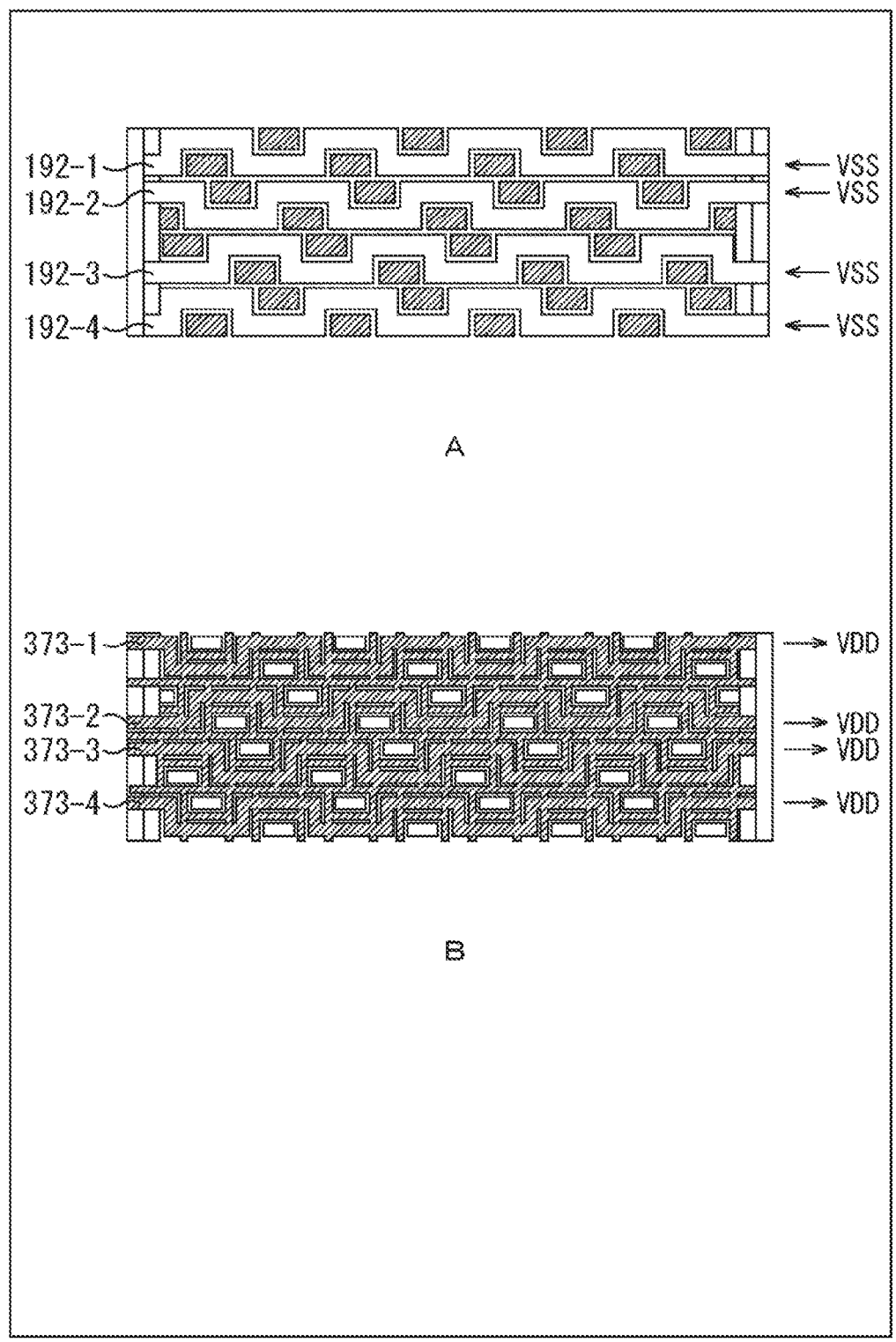
FIG. 33 A diagram showing an example of power supply wirings of the digital processing unit.

FIG. 33 is a diagram showing a layout example in the case where the power supply wiring includes a light blocking wiring in the layout example of FIG. 10. As shown in part A of FIG. 33, the layout in the upper layer (layer of the digital processing unit 112) is similar to part A of FIG. 10. The layout in the lower layer (layer of the digital processing unit 113) is shown in part B of FIG. 33. As shown in part B of FIG. 33, a power supply wiring (VDD) 373-1 has a structure that blocks light entering from the space of each power supply wiring (VSS) 192 in the upper layer. Also in the case of such a layout, it is possible to obtain effects similar to those in FIG. 10.

(Other Layout Examples)

In the layout example of FIG. 9 or FIG. 10, a power supply wiring (VDD) having a meander shape and a power supply wiring (VSS) having a meander shape that form each conductor pair are described to be formed in a different layer. However, this is not limited thereto. For example, as shown in the example shown in FIG. 34, a power supply wiring (VDD) and a power supply wiring (VSS) may be formed in the same layer.

Figure 34:
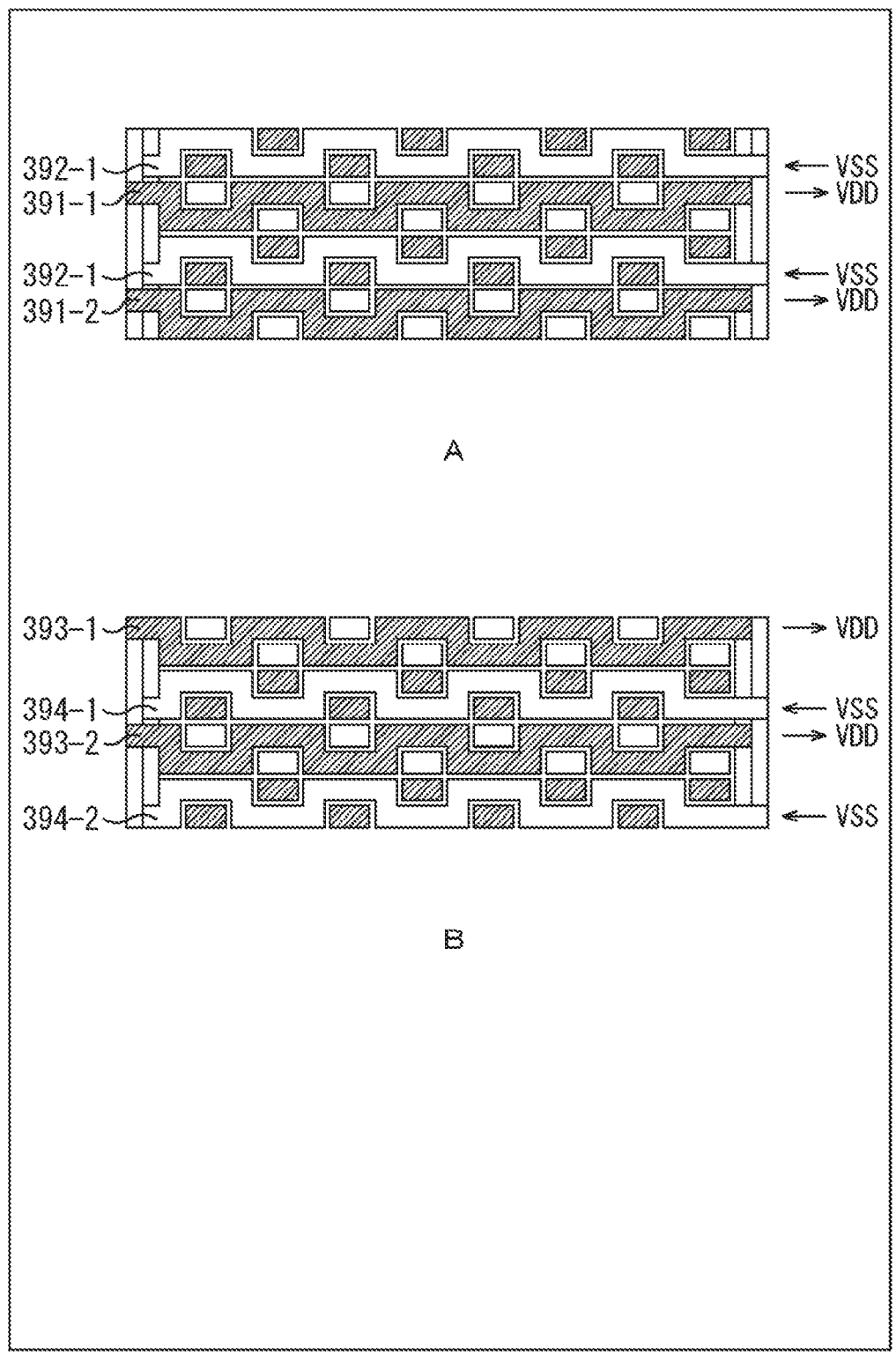
FIG. 34 A diagram showing an example of power supply wirings of the digital processing unit.

Part A of FIG. 34 shows an arrangement example of the power supply wirings formed in the digital processing unit 112. In the example of part A of FIG. 34, a power supply wiring (VDD) 391-1 and a power supply wiring (VDD) 391-2 and a power supply wiring (VSS) 392-1 and a power supply wiring (VSS) 392-2 are arranged substantially in parallel with each other. In the case where the power supply wiring (VDD) 391-1 and the power supply wiring (VDD) 391-2 do not need to be distinguished from each other, they are referred to as the power supply wiring (VDD) 391. Further, in the case where the power supply wiring (VSS)

392-1 and the power supply wiring (VSS) 392-2 do not need to be distinguished from each other, they are referred to as the power supply wiring 392.

Similarly to the case of part A of FIG. 9, at least a part of each power supply wiring (VDD) 391 and each power supply wiring (VSS) 392 snakes, and forms a meander shape. That is, each power supply wiring (VDD) 391 and each power supply wiring (VSS) 392 have a periodic structure in which the shape thereof is periodically changed in the longitudinal direction.

Part B of FIG. 34 shows an arrangement example of the power supply wirings formed in the digital processing unit 113. In the example of B of FIG. 34, a power supply wiring (VDD) 393-1 and a power supply wiring (VDD) 393-2 and a power supply wiring (VSS) 394-1 and a power supply wiring (VSS) 394-2 are arranged substantially in parallel with each other. The power supply wiring (VDD) 393-1 and the power supply wiring (VDD) 393-2 are arranged at positions where they are superimposed on the power supply wiring (VSS) 392-1 and the power supply wiring (VSS) 392-2 via a predetermined insulation layer. Similarly, the power supply wiring (VSS) 394-1 and the power supply wiring/(VSS) 394-2 are arranged at positions where they are superimposed on the power supply wiring (VDD) 391-1 and the power supply wiring (VDD) 391-2 via a predetermined insulation layer. In the case where the power supply wiring (VDD) 393-1 and the power supply wiring (VDD) 393-2 do not need to be distinguished from each other for description, they are referred to as the power supply wiring (VDD) 393. Further, in the case where the power supply wiring (VSS) 394-1 and the power supply wiring (VSS) 394-2 do not need to be distinguished from each other for description, they are referred to as the power supply wiring (VSS) 394.

Similarly to the case of part B of FIG. 9, at least a part of each power supply wiring (VDD) 393 and each power supply wiring (VSS) 394 snakes, and forms a meander shape. That is, each power supply wiring (VDD) 393 and each power supply wiring (VSS) 394 have a periodic structure in which the shape thereof is periodically changed in the longitudinal direction.

That is, each power supply wiring (VDD) 391 and each power supply wiring (VSS) 394 form a conductor pair, and each power supply wiring (VSS) 392 and each power supply wiring (VDD) 393 form a conductor pair. As described above, in the case where the type of the conductor (power supply wiring) formed in the upper layer (the digital processing unit 112) for each conductor pair and the type of the conductor (the power supply wiring) formed in the lower layer (the digital processing unit 113) are replaced with each other, the power supply wiring (VDD) and the power supply wiring (VSS) are formed in the same layer as shown in the example of FIG. 34.

Also in the case of such a layout, it is possible to obtain effects similar to those in FIG. 9 or FIG. 10.

(Comparison of Change in Magnetic Flux Caused Due to Change in Conductor Loop)

Figure 35:
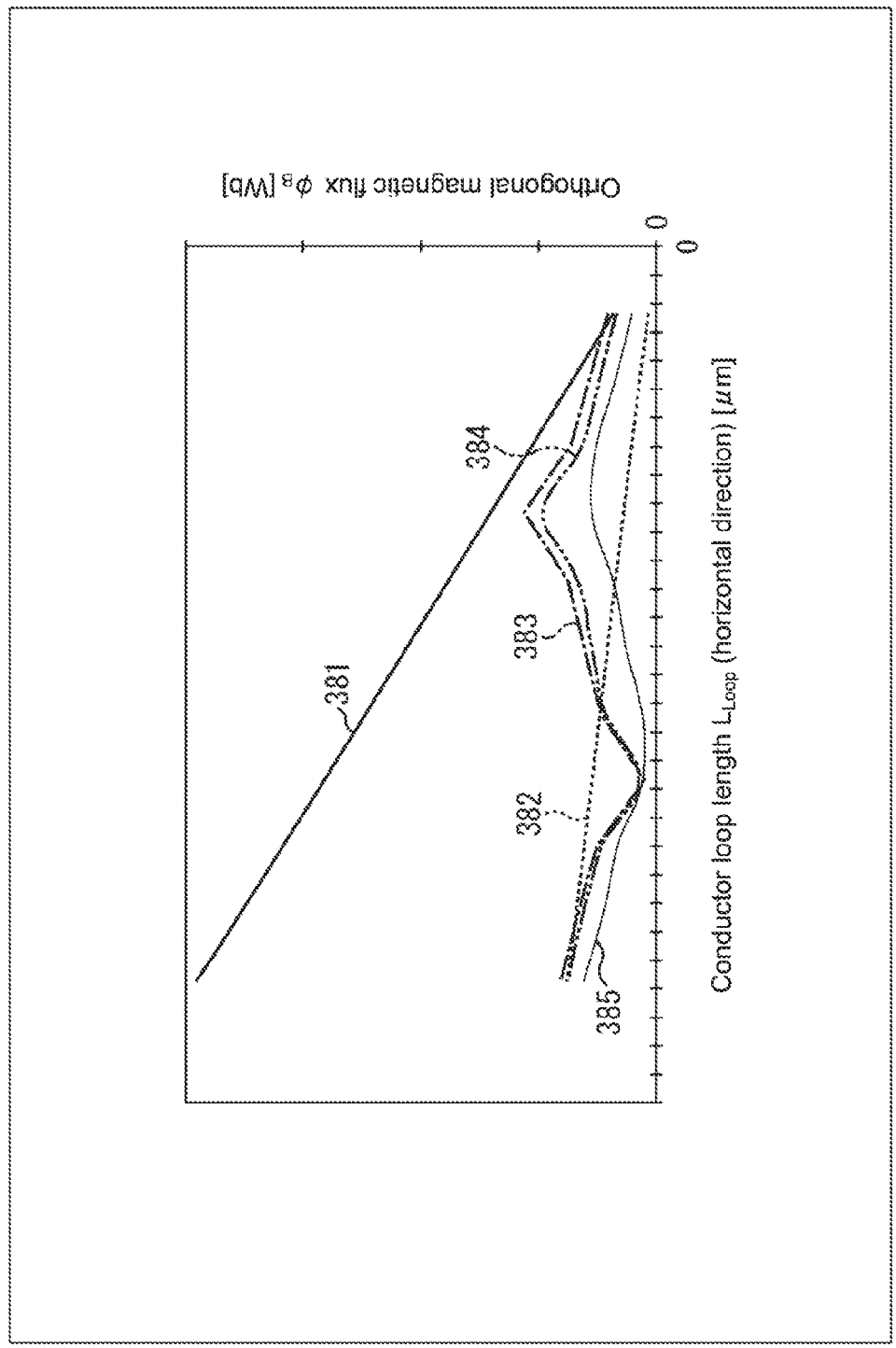
FIG. 35 A diagram showing a comparative example of a change in magnetic fluxes due to a change in the conductor loop length.

FIG. 35 is an example of a graph showing the comparing results obtained by comparing the change in the magnetic flux that passes through the loop surface of the conductor loop caused due to the change in the conductor loop length $L_{LOOP}$ of the conductor loop for each shift amount. In FIG. 35, a thick line 381 represents the change in the magnetic flux in the case of the layout of FIG. 6. Dotted lines 382 represent the change in the magnetic flux in the case of the layout of FIG. 31. An alternate long and short dash line 383 represents the change in the magnetic flux in the case of the layout of FIG. 34. An alternate long and two short dashes line 384 represents the change in the magnetic flux in the case of the layout of FIG. 32. A fine line 385 represents the change in the magnetic flux in the case of the layout of FIG. 33.

As described above, also in the case of any of the layouts other than that in FIG. 6, it is possible to reduce the peak of the magnetic flux more than that in the layout of FIG. 6. Therefore, it is possible to reduce the induced electromotive force generated in the conductor loop by the change in the conductor loop, and suppress generation of noise in a conductor loop. That is, the image sensor 100 is capable of suppressing the reduction in image quality of a picked-up image by applying the layout other than that shown in FIG. 6 as the layout of the power supply wirings formed in the digital processing unit 112 or the digital processing unit 113 as compared with the case where the layout of FIG. 6 is applied.

(Structure Application Example)

In the above, description has been made with the power supply wiring as a conductor that generates a magnetic flux passing through the loop surface of the conductor loop. However, this conductor can be arbitrarily determined, and any conductor other than the power supply wiring may be used. For example, some kind of signal line can be used.

Further, this conductor does not necessarily need to be superimposed on the conductor loop or not to be superimposed on the conductor loop. Further, this conductor may be formed in three or more layers or a single layer. It may be formed in the same layer as that of the conductor loop. For example, it may be formed in the pixel/analog processing unit 111.

Figure 36:
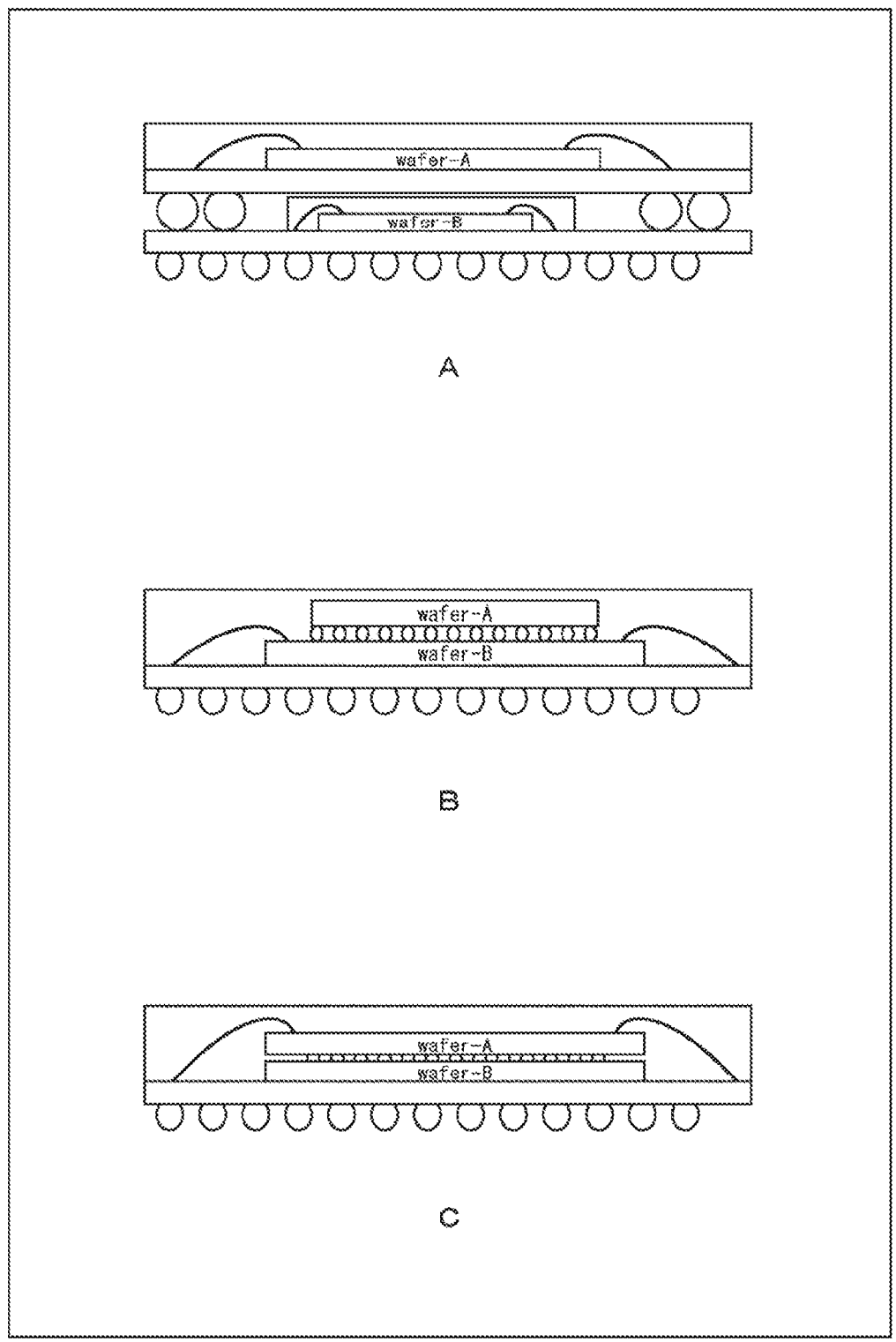
FIG. 36 A diagram describing an example of a laminated structure of a chip.

A plurality of chips of the image sensor 100 described with reference to FIG. 2 may be superimposed one another in any way. For example, as shown in part A of FIG. 36, sealed packages may be superimposed one another for each chip. Alternatively, as shown in the examples of part B of FIG. 36 or part C of FIG. 36, the plurality of chips may be superimposed one another and packaged by sealing. In this case, a bonding wire to an external electrode may be connected to the chip in the lower layer as shown in part B of FIG. 36, for example. Alternatively, a bonding wire to an external electrode may be connected to the chip in the upper layer as shown in the example of part C of FIG. 36.

Further, in the above, description has been made with the image sensor (the image sensor 100) as an example of the circuit substrate to which the present technology is applied. However, the present technology is not limited thereto, and can be applied to a circuit substrate of an arbitrary device other than the image sensor.

Further, in the above, description has been made with the semiconductor substrate as an example of the circuit substrate to which the present technology is applied. However, the present technology is not limited thereto, and can be applied to a circuit substrate other than the semiconductor substrate, such as a printed circuit board.

2. Second Embodiment

<Imaging Apparatus>

Figure 37:
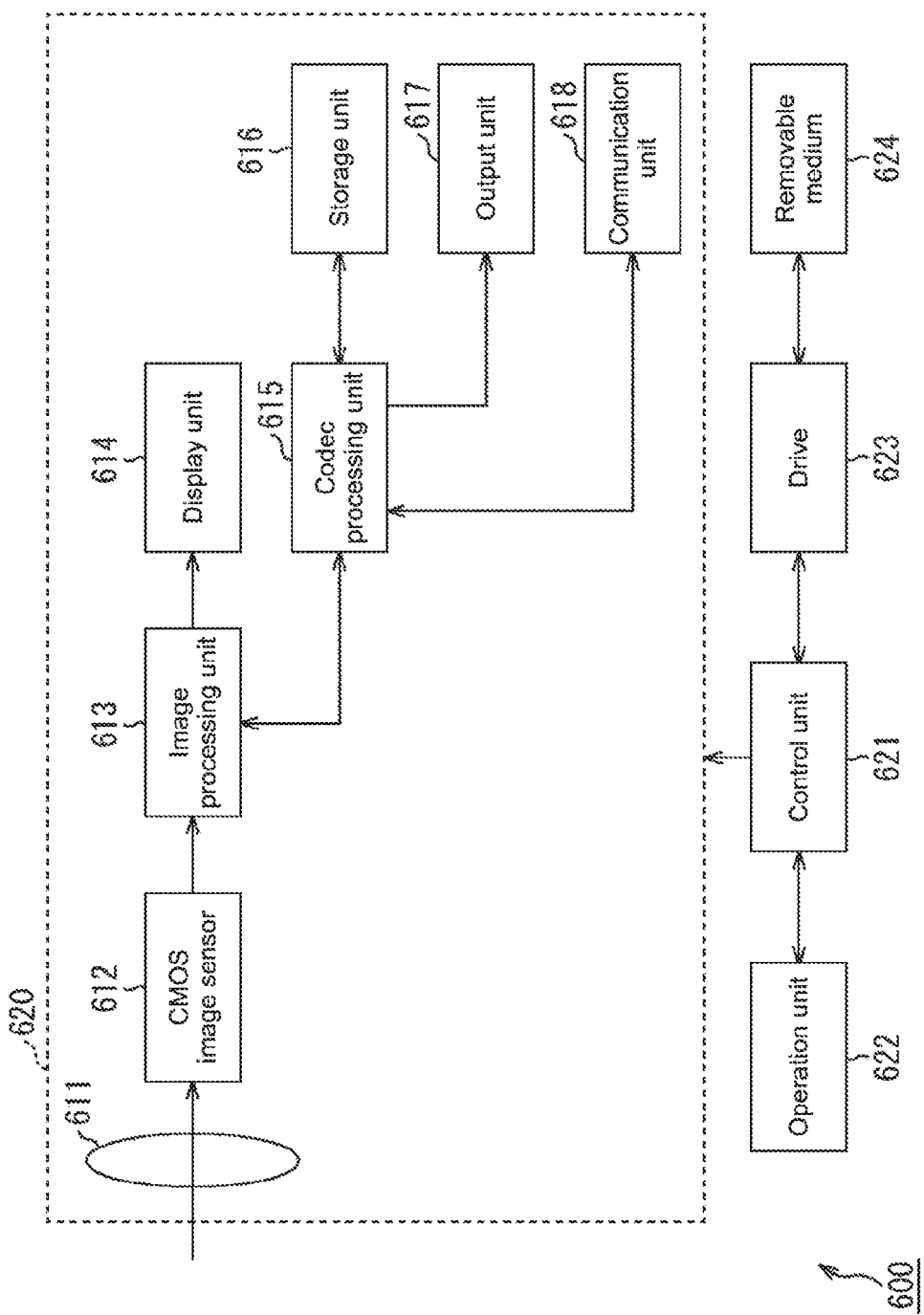
FIG. 37 A diagram showing a main configuration example of an imaging apparatus.

Note that the present technology is applicable also to those other than the image sensor. For example, the present technology may be applied to an apparatus including an image sensor (electronic apparatus, etc.) such as an imaging apparatus. FIG. 37 is a block diagram showing a main configuration example of an imaging apparatus as an example of an electronic apparatus to which the present technology is applied. An imaging apparatus 600 shown in FIG. 37 is an apparatus that picks up an image of an object, and outputs the image of the object as an electric signal.

As shown in FIG. 37, the imaging apparatus 600 includes an optical unit 611, a CMOS image sensor 612, an image processing unit 613, a display unit 614, a codec processing unit 615, a storage unit 616, an output unit 617, a communication unit 618, a control unit 621, an operation unit 622, and a drive 623.

The optical unit 611 includes a lens that adjusts the focal point to an object and collects light from the focused position, a stop that adjusts exposure, a shutter that controls the imaging timing, and the like. The optical unit 611 causes light from the object (incident light) to be transmitted therethrough, and supplies it to the CMOS image sensor 612.

The CMOS image sensor 612 performs photoelectric conversion on the incident light to A/D convert the signal for each pixel (pixel signal), performs signal processing such as CDS, and supplies processed picked-up image data to the image processing unit 613.

The image processing unit 613 performs image processing on the picked-up image data acquired by the CMOS image sensor 612. More specifically, the image processing unit 613 performs various kinds of image processing such as color mixture correction, black level correction, white balance adjustment, demosaic processing, matrix processing, gamma correction, and YC conversion for the picked-up image data supplied from the CMOS image sensor 612. The image processing unit 613 supplies the picked-up image data on which image processing has been performed to the display unit 614.

The display unit 614 includes, for example, a liquid crystal display, and displays the image (e.g., an image of the object) of the picked-up image data supplied from the image processing unit 613.

The image processing unit 613 further supplies, as necessary, the picked-up image data on which image processing has been performed to the codec processing unit 615.

The codec processing unit 615 performs coding processing in a predetermined method for the picked-up image data supplied from the image processing unit 613, and supplies the coded data thus obtained to the storage unit 616. Further, the codec processing unit 615 reads the coded data stored in the storage unit 616, decodes the data to generate decoded image data, and supplies the decoded image data to the image processing unit 613.

The image processing unit 613 performs predetermined image processing on the decoded image data supplied from the codec processing unit 615. The image processing unit 613 supplies the decoded image data on which image processing has been performed to the display unit 614. The display unit 614 includes, for example, a liquid crystal display, and displays the image of the decoded image data supplied from the image processing unit 613.

Further, the codec processing unit 615 may supply coded data obtained by coding the picked-up image data supplied from the image processing unit 613 or coded data of the picked-up image data read from the storage unit 616 to the output unit 617, and output it to the outside of the imaging apparatus 600. Further, the codec processing unit 615 may supply the decoded image data obtained by decoding the picked-up image data before coding or the coded data read from the storage unit 616 to the output unit 617, and output it to the outside of the imaging apparatus 600.

Further, the codec processing unit 615 may transmit the picked-up image data, the coded data of the picked-up image data, or the decoded image data to another apparatus via the communication unit 618. Further, the codec processing unit 615 may acquire the picked-up image data or the coded data of the image data via the communication unit 618. The codec processing unit 615 appropriately performs coding, decoding, or the like for the picked-up image data or the coded data of the image data acquired via the communication unit 618. The codec processing unit 615 may supply the acquired image data or coded data to the image processing unit 613 as described above, or output it to the storage unit 616, the output unit 617, and the communication unit 618.

The storage unit 616 stores the coded data or the like supplied from the codec processing unit 615. The coded data stored in the storage unit 616 is read to the codec processing unit 615 and decoded as necessary. The picked-up image data obtained by the decoding processing is supplied to the display unit 614, and a picked-up image corresponding to the picked-up image data is displayed.

The output unit 617 includes an external output interface such as an external output terminal, and outputs various kinds of data supplied via the codec processing unit 615 to the outside of the imaging apparatus 600 via the external output interface.

The communication unit 618 supplies various kinds of information such as image data and coded data supplied from the codec processing unit 615 to another apparatus serving as a communication partner in predetermined communication (wired communication or wireless communication). Further, the communication unit 618 acquires various kinds of information such as image data and coded data from another apparatus serving as a communication partner in predetermined communication (wired communication or wireless communication), and supplies it to the codec processing unit 615.

The control unit 621 controls the operation of the respective processing units (respective units shown in a dotted line 620, the operation unit 622, and the drive 623) of the imaging apparatus 600.

The operation unit 622 includes an arbitrary input device such as a jog dial (trademark), a key, a button, and a touch panel, receives an operation input performed by a user, for example, and supplies a signal corresponding to the operation input to the control unit 621.

The drive 623 reads information stored in a removable medium 624 such as a magnetic disk, an optical disc, a magnetic optical disk, and a semiconductor memory, which is attached thereto. The drive 623 reads various kinds of information such as a program and data from the removable medium 624, and supplies it to the control unit 621. Further, in the case where the writable removable medium 624 is attached to the drive 623, the drive 623 causes the removable medium 624 to store various kinds of information such as image data and coded data supplied via the control unit 621.

As the above-mentioned CMOS image sensor 612 of the imaging apparatus 600, the present technology described in each embodiment is applied. Specifically, as the CMOS image sensor 612, the above-mentioned image sensor 100 is used. Accordingly, the CMOS image sensor 612 is capable of suppressing the reduction in image quality of a picked-up image. Therefore, the imaging apparatus 600 is capable of acquiring a picked-up image with high image quality by picking up an image of an object.

The above-mentioned series of processing may be executed by hardware or may be executed by software. If the series of processing is executed by software, programs configuring that software are installed from a network or a recording medium.

This recording medium includes, for example, the removable medium 624 provided separately from the apparatus body in order to deliver a program to a user as shown in FIG. 37. The program is stored in the removable medium 624. The removable medium 624 includes a magnetic disk (including a flexible disk), an optical disc (including CD-ROM and DVD), or the like. Further, the removable medium 624 includes a magnetic optical disk (including MD (Mini Disc)), a semiconductor memory, or the like.

In this case, the program can be installed into the storage unit 616 by mounting the removable medium 624 to the drive 623.

Further, this program can also be provided via a wired or wireless transmission medium such as a local area network, the Internet, and digital satellite broadcasting. In this case, the program can be received by the communication unit 618, and installed into the storage unit 616.

Otherwise, this program can be installed into the storage unit 616, a ROM (Read Only Memory) in the control unit 621, or the like, in advance.

Note that the program that is executed by the computer may be a program by which the processing is performed in time series in the order described in this specification, or may be a program by which the processing is performed in parallel or at a necessary timing, such as when a request to execute the processing is made.

Further, in this specification, the step of describing the program to be stored in the recording medium includes not only the processing performed in time series in the described order but also processing that is not necessarily performed in time series but performed in parallel or individually.

The above-mentioned processing of each Step may be performed in each apparatus described above or an arbitrary apparatus other than the apparatus described above. In this case, the apparatus that performs the processing only has to have the above-mentioned function (functional block, etc.) that is necessary to perform the processing. Further, it only has to appropriately transmit information that is necessary for the processing to the apparatus.

Further, in this specification, the "system" refers to a collection of a plurality of components (such as apparatuses and modules (parts)), and all the components need not necessarily be provided in the same casing. Thus, both a plurality of apparatuses that are contained in their casings and connected to each other via a network, and a single apparatus that has a single casing containing a plurality of modules are encompassed in the definition of the "system."

Further, the configuration described as a single apparatus (or processing unit) hereinabove may be divided into a plurality of apparatuses (or processing units). In contrast, the configurations described as a plurality of apparatus (or processing units) hereinabove may be integrated into a single apparatus (or processing unit). Further, as a matter of course, configurations other than those described hereinabove may be added to the configurations of the apparatus (or processing units). Further, as long as the configurations and operations of the entire system are substantially unchanged, a part of a configuration of a certain apparatus (or processing unit) may be incorporated in a configuration of another apparatus (or another processing unit).

The technical scope of the present disclosure, which is described in detail hereinabove in the preferred embodiments of the present disclosure with reference to the accompanying drawings, is not limited to those examples. It is obvious that various changes and modifications could have been made by those who have common knowledge in the technical field of the present disclosure within the technical scope described in the claims. It should be understood that those changes and modifications obviously belong to the technical scope of the present disclosure.

For example, the present technology may include a system of cloud computing in which a single function is shared with and cooperatively exerted in a plurality of apparatus via a network.

Further, the steps described above with reference to the flowcharts may be executed in a single apparatus, or may be shared with and executed in a plurality of apparatus.

Further, in a case where a plurality of processes are contained in a single step, the plurality of processes contained in the single step may be executed in a single apparatus, or may be shared with and executed in a plurality of apparatus.

Further, the present technology is not limited thereto, and may be carried out by any type of configuration to be mounted to such apparatus or to apparatus having such systems, specifically, a processor as, for example, system LSI (Large Scale Integration), a module using a plurality of the processors and the like, a unit using a plurality of the modules, and a set obtained by adding other functions to the unit (that is, a part of a configuration of an apparatus).

It should be noted that the present technology may take the following configurations.

(1) A circuit substrate, including:
a circuit that is formed of a conductor and is capable of forming a conductor loop with the conductor, at least a part of dimensions of the conductor loop being variable; and
a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the circuit.

(2) The circuit substrate according to (1), in which
the plurality of conductors include one or more conductors formed between a plurality of other conductors, and
orientations of current flowing through at least a part of the one or more conductors are different from orientations of current flowing through the other conductors.

(3) The circuit substrate according to (2), in which
a direction of a line of magnetic force that is generated by the one or more conductors and passes through a loop surface of the conductor loop is opposite to a direction of a line of magnetic force that is generated by the other conductors and passes through the loop surface of the conductor loop.

(4) The circuit substrate according to (2) or (3), in which
a direction of a magnetic flux generated by the one or more conductors in a loop surface of the conductor loop is opposite to a direction of a magnetic flux generated by the other conductors in the loop surface of the conductor loop.

(5) The circuit substrate according to any one of (1) to (4), in which
the plurality of conductors are formed in a plurality of layers.

(6) The circuit substrate according to (5), in which
the plurality of conductors include a conductor pair including two conductors adjacent in a layered direction, orientations of current flowing through the two conductors being the same.

(7) The circuit substrate according to any one of (1) to (6), in which
the plurality of conductors include a conductor pair including two conductors adjacent in a layered direction, orientations of current flowing through the two conductors being at least partially different from each other.

(8) The circuit substrate according to (6) or (7), in which an orientation of current flowing through each conductor of the conductor pair and an orientation of current flowing through another conductor adjacent to each conductor of the conductor pair in the layered direction are at least partially different from each other.

(9) The circuit substrate according to (7) or (8), in which an orientation of current flowing through a part of each conductor of the conductor pair is different from an orientation of current flowing through the other part of the conductor.

(10) The circuit substrate according to any one of (7) to (9), in which
the conductor pair has a periodic structure in which the shape of the conductor pair is periodically changed in a longitudinal direction, and
a direction of a line of magnetic force generated by the conductor pair is changed for every half period of the periodic structure.

(11) The circuit substrate according to (10), in which
the plurality of conductors include a plurality of conductor pairs, and
an origin position of the periodic structure of one conductor pair differs from an origin position of the periodic structure of the adjacent conductor pair.

(12) The circuit substrate according to (11), in which
a shift amount between the origin position of the periodic structure of the one conductor pair and the origin position of the periodic structure of the adjacent conductor pair is equal to or less than one-second of a period of the periodic structure of the conductor pair.

(13) The circuit substrate according to (11) or (12), in which
a shift amount between the origin position of the periodic structure of the one conductor pair and the origin position of the periodic structure of the adjacent conductor pair is the same as a conductor width of at least one conductor constituting the conductor pair.

(14) The circuit substrate according to any one of (11) to (13), in which
a period length of the periodic structure of at least one conductor pair is different from a period length of the periodic structure of another conductor pair.

(15) The circuit substrate according to any one of (10) to (14), in which
a part of the periodic structure of the conductor pair has a period length different from that of another part of the periodic structure of the conductor pair.

(16) The circuit substrate according to any one of (10) to (15), in which
the periodic structure has a meander shape or a twisted shape formed by the two conductors, or a shape of a combination of the meander shape and the twisted shape.

(17) The circuit substrate according to (7) to (16), in which
the conductor pair further includes a light blocking wiring that suppresses light transmission in addition to the two conductors.

(18) The circuit substrate according to any one of (1) to (17), in which
the plurality of conductors are each formed at a position where the conductor is superimposed on the circuit in a layer different from that of the circuit.

(19) An image sensor, including:
a pixel unit that includes a plurality of pixels, the plurality of pixels each performing photoelectric conversion on light from an object, a conductor loop being substantially formed in the pixel unit in selecting a pixel, the conductor loop being formed of a conductor, the conductor loop having a size and a shape depending on the selected pixel; and
a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the pixel unit.

(20) An electronic apparatus, including:
an imaging unit that picks up an image of an object; and
an image processing unit that performs image processing on image data acquired by imaging performed by the imaging unit, the imaging unit including
a pixel unit that includes a plurality of pixels, the plurality of pixels each performing photoelectric conversion on light from an object, a conductor loop being substantially formed in the pixel unit in selecting a pixel, the conductor loop including a conductor, the conductor loop having a size and a shape depending on the selected pixel, and
a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the pixel unit.

DESCRIPTION OF REFERENCE NUMERALS

100 image sensor, 101 pixel chip, 102 logic chip, 103 logic chip, 111 pixel/analog processing unit, 112 digital processing unit, 113 digital processing unit, 121 pixel array, 122 A/D conversion unit, 123 vertical scanning unit, 131 unit pixel, 132 vertical signal line, 133 control line, 141 photodiode, 142 transfer transistor, 143 reset transistor, 144 amplification transistor, 145 selector transistor, 151 power supply wiring (VDD), 152 power supply wiring (VSS), 153 power supply wiring (VDD), 154 power supply wiring (VSS) 161 power supply wiring (VDD), 162 power supply wiring (VSS) 163 power supply wiring (VDD), 164 power supply wiring (VSS) 171 power supply wiring (VDD), 172 power supply wiring (VSS), 173 power supply wiring (VDD), 174 power supply wiring (VSS), 182 power supply wiring (VSS), 183 power supply wiring (VDD), 192 power supply wiring (VSS), 193 power supply wiring (VDD), 260 conductor loop, 281 power supply wiring (VDD), 282 power supply wiring (VSS), 321 conductor pair, 321-1 power supply wiring (VDD), 321-2 power supply wiring (VSS), 322 conductor pair, 322-1 power supply wiring (VDD), 322-2 power supply wiring (VSS), 323 conductor pair, 324 conductor pair, 353 power supply wiring (VDD), 354 power supply wiring (VSS), 363 power supply wiring (VDD), 373 power supply wiring (VDD), 391 power supply wiring (VDD), 392 power supply wiring (VSS), 393 power supply wiring (VDD), 394 power supply wiring (VSS), 600 imaging apparatus, 612 CMOS image sensor.

What is claimed is:

1. A circuit substrate, comprising:
a circuit that is formed of a conductor and is capable of forming a conductor loop with the conductor, at least a part of dimensions of the conductor loop being variable; and
a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the circuit.

2. The circuit substrate according to claim 1, wherein
the plurality of conductors include one or more conductors formed between a plurality of other conductors, and
orientations of current flowing through at least a part of the one or more conductors are different from orientations of current flowing through the other conductors.

3. The circuit substrate according to claim 2, wherein
a direction of a line of magnetic force that is generated by the one or more conductors and passes through a loop surface of the conductor loop is opposite to a direction of a line of magnetic force that is generated by the other conductors and passes through the loop surface of the conductor loop.

4. The circuit substrate according to claim 2, wherein
a direction of a magnetic flux generated by the one or more conductors in a loop surface of the conductor loop is opposite to a direction of a magnetic flux generated by the other conductors in the loop surface of the conductor loop.

5. The circuit substrate according to claim 1, wherein
the plurality of conductors are formed in a plurality of layers.

6. The circuit substrate according to claim 5, wherein
the plurality of conductors include a conductor pair including two conductors adjacent in a layered direction, orientations of current flowing through the two conductors being the same.

7. The circuit substrate according to claim 1, wherein
the plurality of conductors include a conductor pair including two conductors adjacent in a layered direction, orientations of current flowing through the two conductors being at least partially different from each other.

8. The circuit substrate according to claim 7, wherein
an orientation of current flowing through each conductor of the conductor pair and an orientation of current flowing through another conductor adjacent to each conductor of the conductor pair in the layered direction are at least partially different from each other.

9. The circuit substrate according to claim 7, wherein
an orientation of current flowing through a part of each conductor of the conductor pair is different from an orientation of current flowing through the other part of the conductor.

10. The circuit substrate according to claim 7, wherein
the conductor pair has a periodic structure in which the shape of the conductor pair is periodically changed in a longitudinal direction, and
a direction of a line of magnetic force generated by the conductor pair is changed for every half period of the periodic structure.

11. The circuit substrate according to claim 10, wherein
the plurality of conductors include a plurality of conductor pairs, and
an origin position of the periodic structure of one conductor pair differs from an origin position of the periodic structure of the adjacent conductor pair.

12. The circuit substrate according to claim 11, wherein
a shift amount between the origin position of the periodic structure of the one conductor pair and the origin position of the periodic structure of the adjacent conductor pair is equal to or less than one-second of a period of the periodic structure of the conductor pair.

13. The circuit substrate according to claim 11, wherein
a shift amount between the origin position of the periodic structure of the one conductor pair and the origin position of the periodic structure of the adjacent conductor pair is the same as a conductor width of at least one conductor constituting the conductor pair.

14. The circuit substrate according to claim 11, wherein
a period length of the periodic structure of at least one conductor pair is different from a period length of the periodic structure of another conductor pair.

15. The circuit substrate according to claim 10, wherein
a part of the periodic structure of the conductor pair has a period length different from that of another part of the periodic structure of the conductor pair.

16. The circuit substrate according to claim 10, wherein
the periodic structure has a meander shape or a twisted shape formed by the two conductors, or a shape of a combination of the meander shape and the twisted shape.

17. The circuit substrate according to claim 7, wherein
the conductor pair further includes a light blocking wiring that suppresses light transmission in addition to the two conductors.

18. The circuit substrate according to claim 1, wherein
the plurality of conductors are each formed at a position where the conductor is superimposed on the circuit in a layer different from that of the circuit.

19. An image sensor, comprising:
a pixel unit that includes a plurality of pixels, the plurality of pixels each performing photoelectric conversion on light from an object, a conductor loop being substantially formed in the pixel unit in selecting a pixel, the conductor loop being formed of a conductor, the conductor loop having a size and a shape depending on the selected pixel; and
a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the pixel unit.

20. An electronic apparatus, comprising:
an imaging unit that picks up an image of an object; and
an image processing unit that performs image processing on image data acquired by imaging performed by the imaging unit, the imaging unit including
a pixel unit that includes a plurality of pixels, the plurality of pixels each performing photoelectric conversion on light from an object, a conductor loop being substantially formed in the pixel unit in selecting a pixel, the conductor loop including a conductor, the conductor loop having a size and a shape depending on the selected pixel, and a plurality of conductors that are each formed at a position where an induced electromotive force is generated in the conductor loop by a magnetic field and each have a structure that suppresses a change in the induced electromotive force generated by a change in dimensions of the conductor loop, the magnetic field being generated by the plurality of conductors, the conductor loop being formed by the pixel unit.

\* \* \* \* \*